United States Patent
Inoue et al.

(10) Patent No.: US 7,279,408 B2
(45) Date of Patent: Oct. 9, 2007

(54) SEMICONDUCTOR DEVICE, METHOD FOR MANUFACTURING THE SAME, AND PLATING SOLUTION

(75) Inventors: Hiroaki Inoue, Tokyo (JP); Norio Kimura, Fujisawa (JP); Xinming Wang, Fujisawa (JP); Moriji Matsumoto, Fujisawa (JP); Makoto Kanayama, Fujisawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 11/254,790

(22) Filed: Oct. 21, 2005

(65) Prior Publication Data
US 2006/0040487 A1 Feb. 23, 2006

Related U.S. Application Data

(62) Division of application No. 10/216,902, filed on Aug. 13, 2002, now Pat. No. 7,060,618.

(30) Foreign Application Priority Data

| Aug. 13, 2001 | (JP) | 2001-245655 |
| Oct. 17, 2001 | (JP) | 2001-319839 |
| Nov. 2, 2001 | (JP) | 2001-337851 |
| Nov. 5, 2001 | (JP) | 2001-338953 |
| Nov. 6, 2001 | (JP) | 2001-341051 |

(51) Int. Cl.
*H01L 21/44* (2006.01)

(52) U.S. Cl. ............ 438/597; 438/138; 438/156; 438/643; 257/E21.584

(58) Field of Classification Search ........ 438/138, 438/156
See application file for complete search history.

(56) References Cited

U.S. PATENT DOCUMENTS

| 5,656,542 A | 8/1997 | Miyata et al. |
| 5,744,394 A | 4/1998 | Iguchi et al. |
| 6,090,701 A | 7/2000 | Hasunuma et al. |
| 6,121,141 A | 9/2000 | Woo et al. |
| 6,147,408 A | 11/2000 | Ogure et al. |

(Continued)

OTHER PUBLICATIONS

Co-pending U.S. Appl. No. 09/994,834, filed Nov. 28, 2001, entitled *Electroless Ni-B Plating Liquid, Electronic Device and Method for Manufacturing the Same*.
"Ni-B Electroless Plating as Cap Material for AG Multi-Level Metallization", Manabu Tsujimura et al., Journal of Japan Institute of Electronics Packaging, vol. 5, No. 1 (2002), p. 58-63.
"*ULSI AG Interconnects Using Electroplating Deposition*", Hirokazu Ezawa et al., Journal of Japan Institute of Electronics Packaging, vol. 5, No. 3 (2002), p. 241-245.

*Primary Examiner*—Michael Lebentritt
*Assistant Examiner*—Kyoung Lee
(74) *Attorney, Agent, or Firm*—Wenderoth, Lind & Ponack, L.L.P.

(57) ABSTRACT

The present invention relates to a semiconductor device and a method for manufacturing the same. The semiconductor device has an embedded interconnect structure in which an electric conductor, such as copper or silver, is embedded in fine recesses formed in a surface of a semiconductor substrate, and also has a protective film formed on surfaces of exposed interconnects that define the interconnect structure, to protect the interconnects. The protective film has a flattened surface.

10 Claims, 43 Drawing Sheets

U.S. PATENT DOCUMENTS

| | | |
|---|---|---|
| 6,160,315 A | 12/2000 | Chiang et al. |
| 6,181,012 B1 | 1/2001 | Edelstein et al. |
| 6,261,953 B1* | 7/2001 | Uozumi ................ 438/687 |
| 6,291,082 B1 | 9/2001 | Lopatin |
| 6,350,687 B1* | 2/2002 | Avanzino et al. ......... 438/687 |
| 6,387,806 B1 | 5/2002 | Wang et al. |
| 6,528,409 B1* | 3/2003 | Lopatin et al. ............ 438/618 |
| 6,680,540 B2 | 1/2004 | Nakano et al. |
| 6,709,874 B2* | 3/2004 | Ning ........................ 438/3 |
| 2003/0001275 A1 | 1/2003 | Sambucetti et al. |

\* cited by examiner

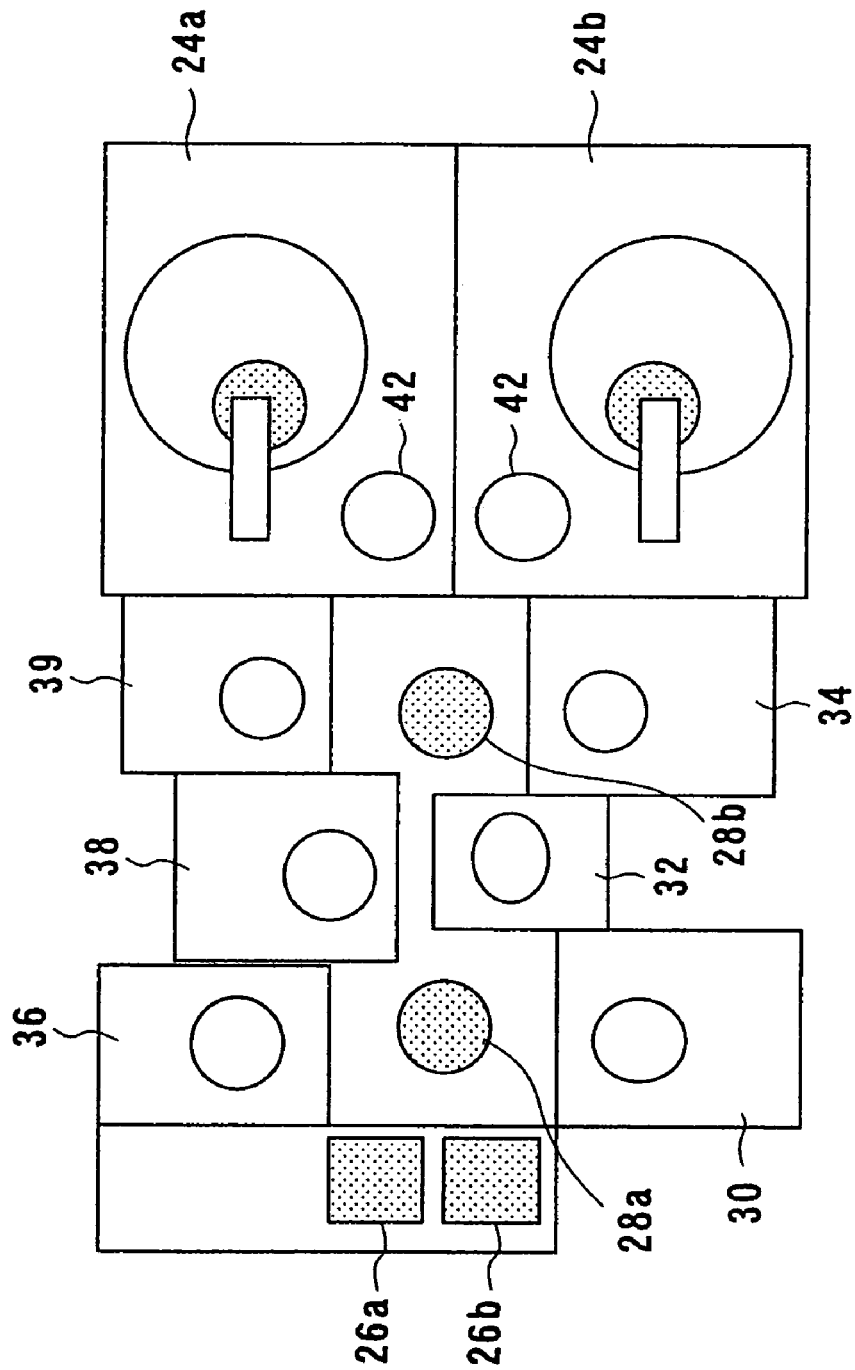

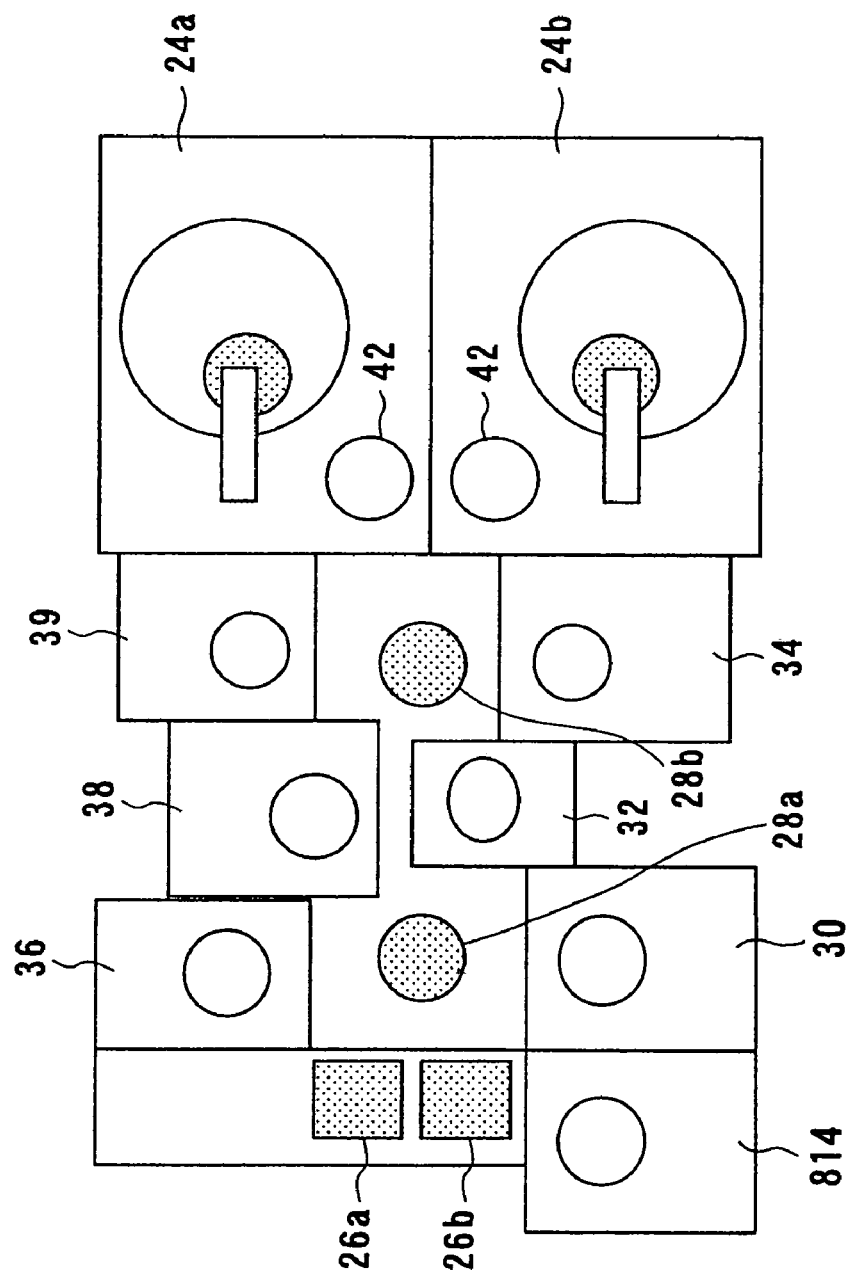

F I G. 1 1
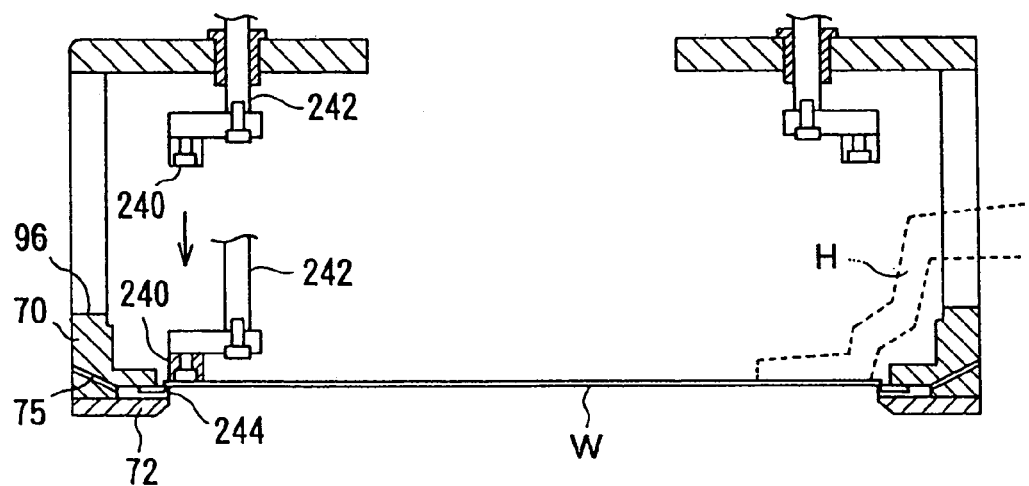
F I G. 1 2
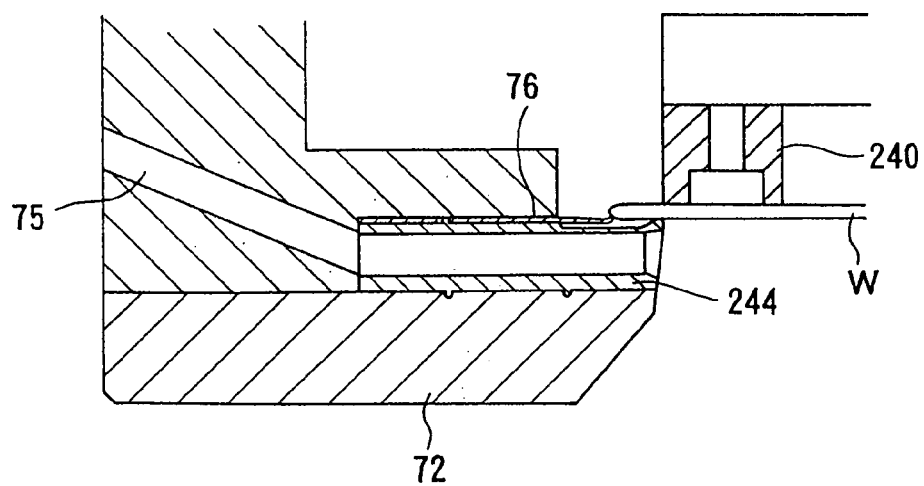

F I G. 17
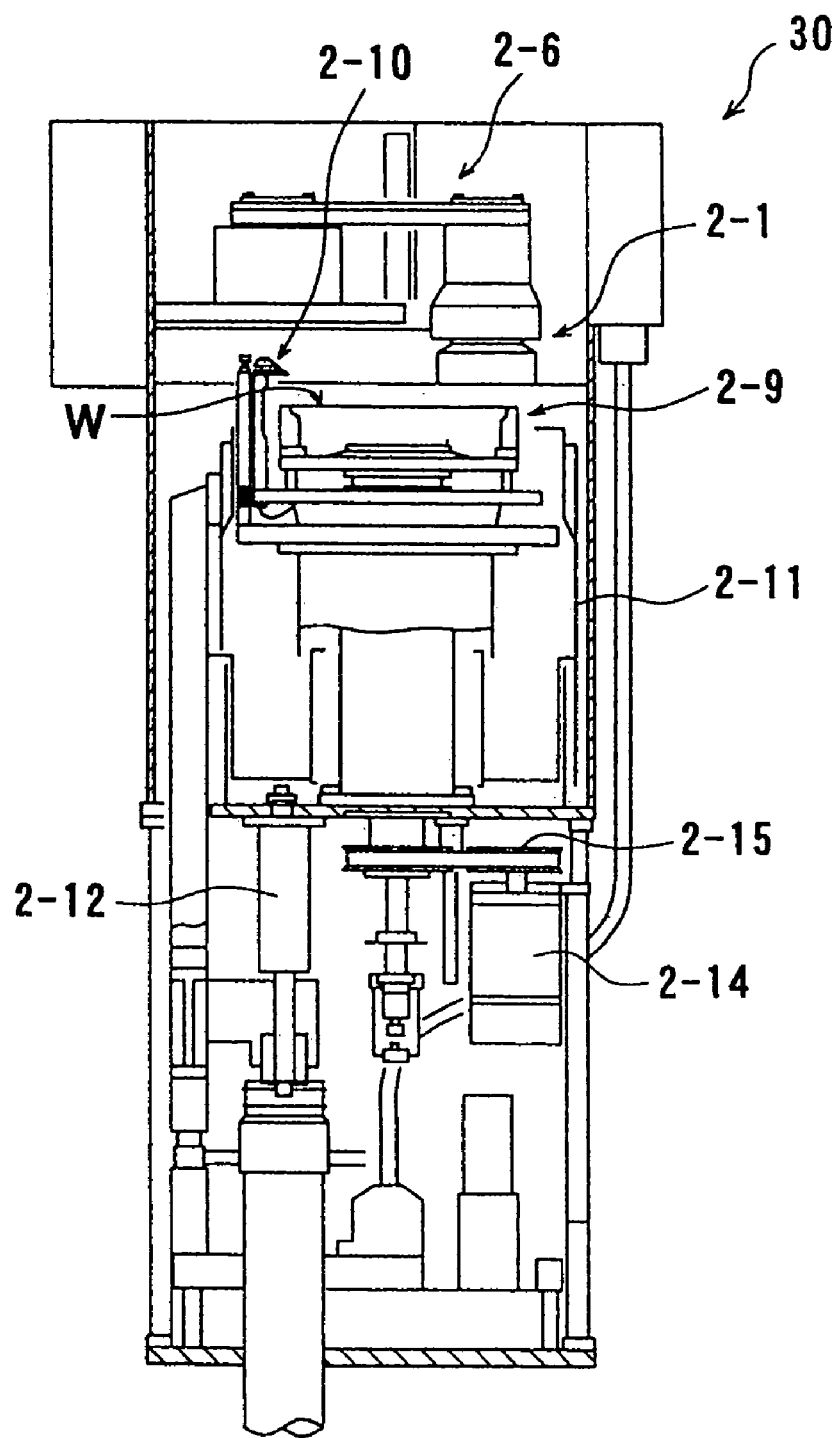

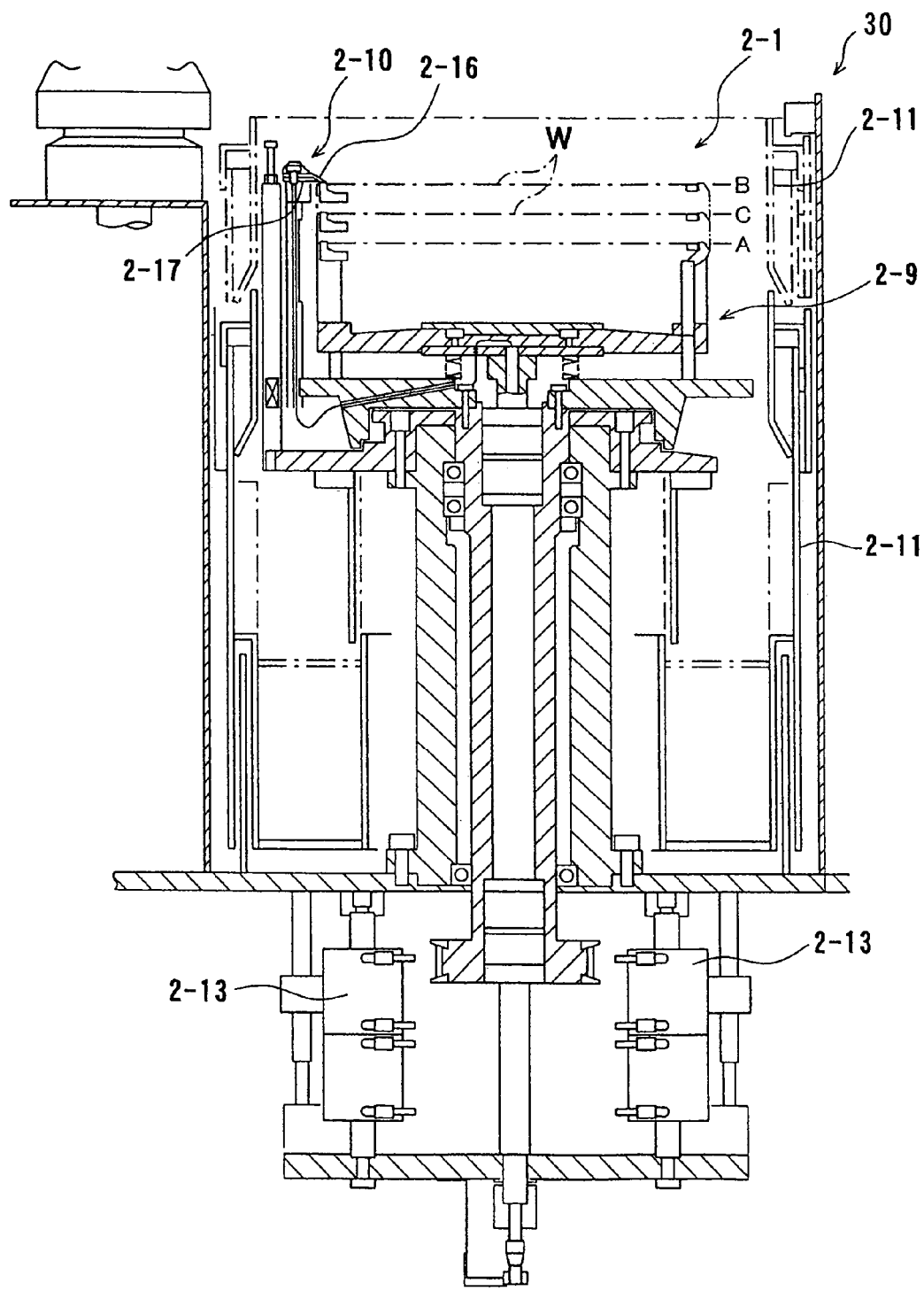
F I G. 1 8

F I G. 2 1
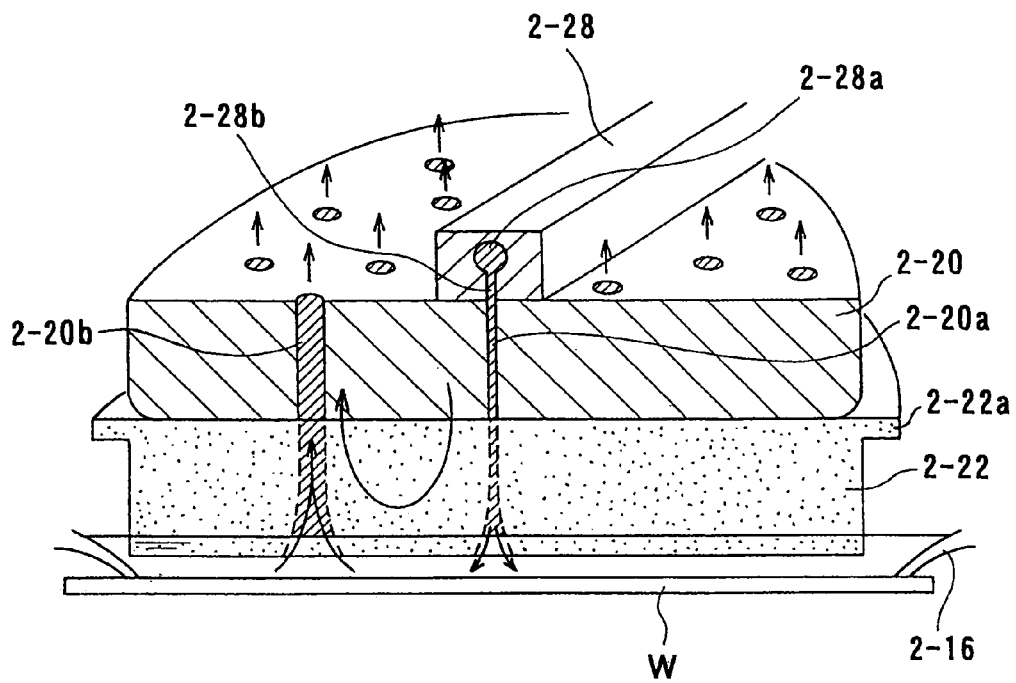
F I G. 2 2
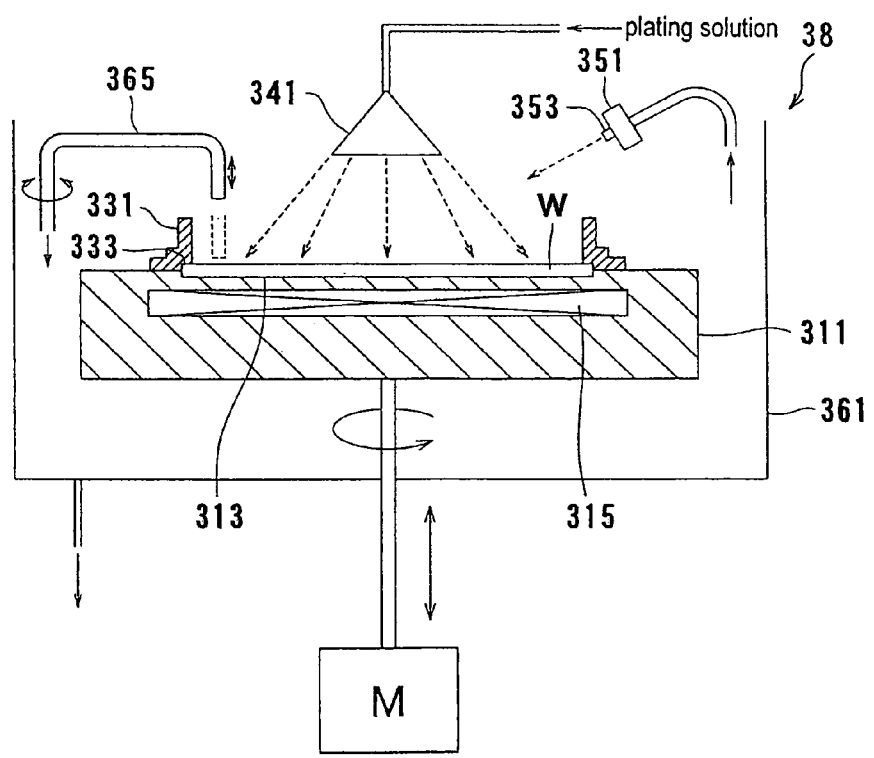

F I G. 2 6
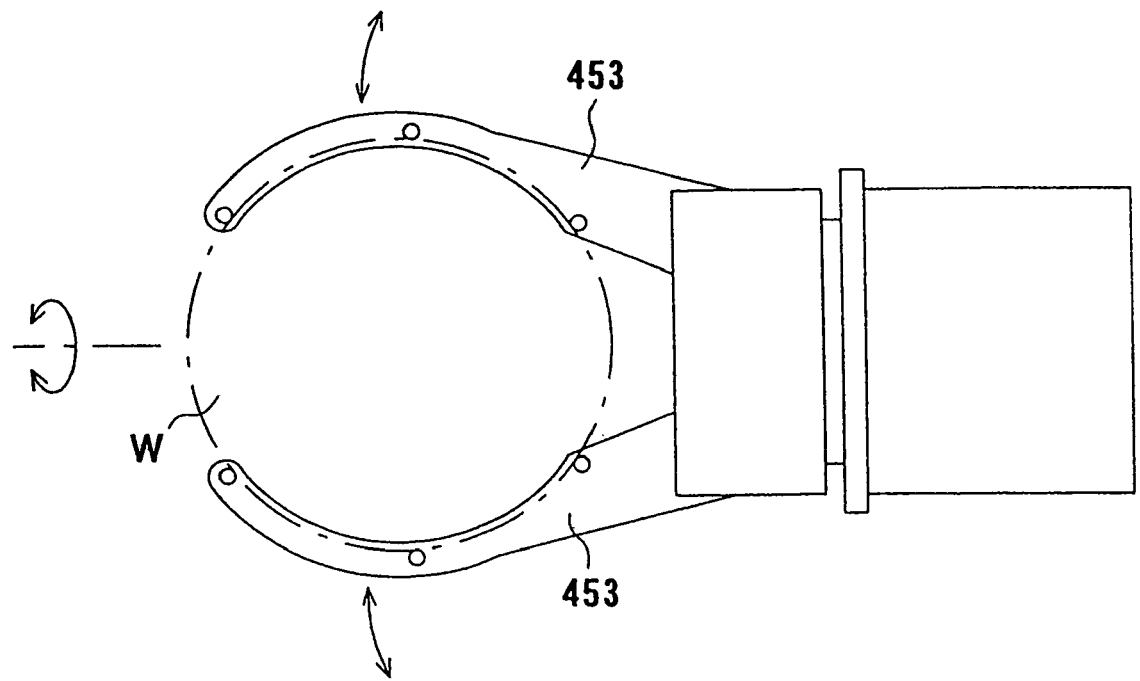
F I G. 2 7
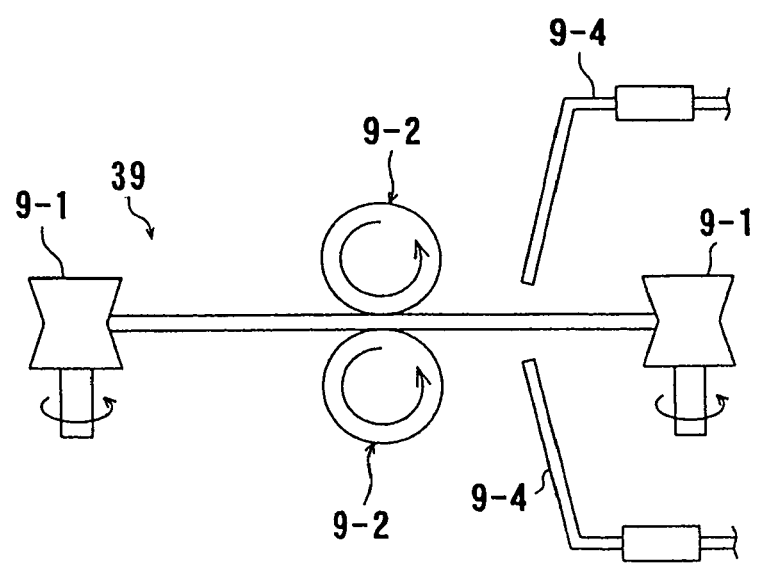

F I G. 3 2
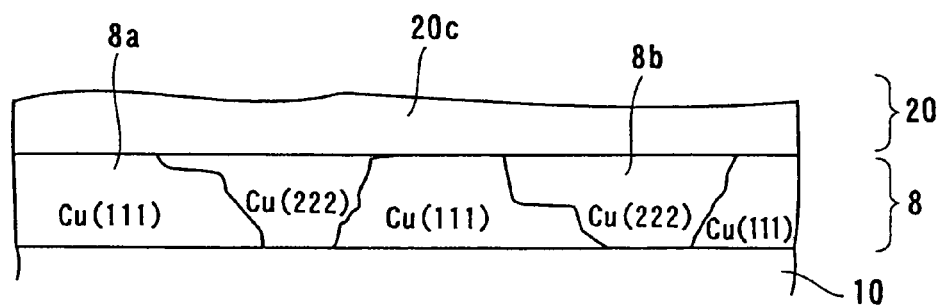
F I G. 3 3
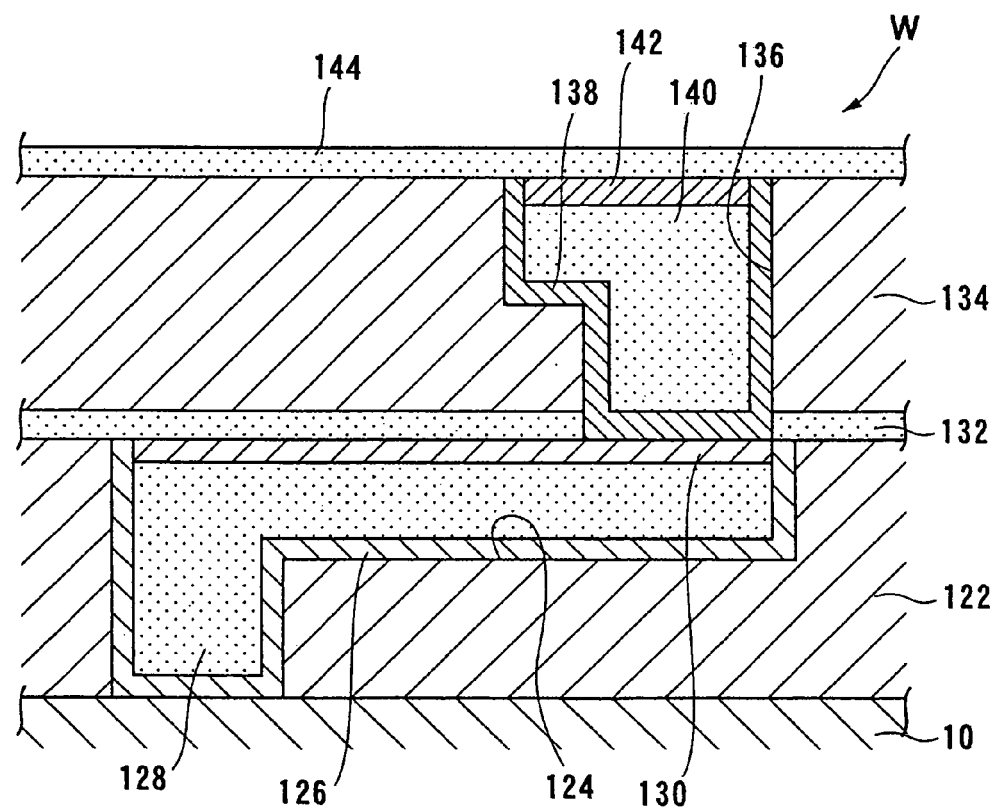

F I G. 5 0
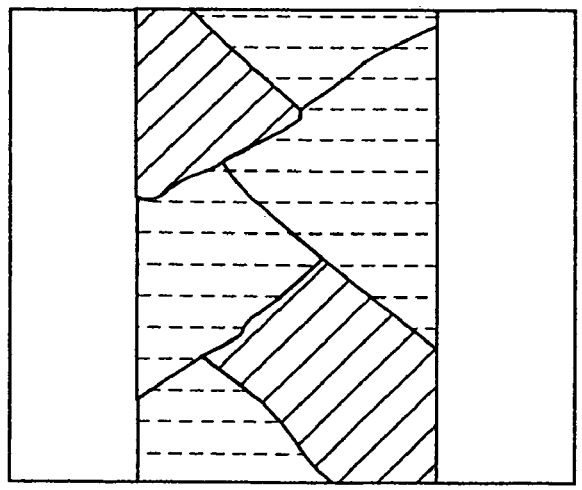
F I G. 5 1
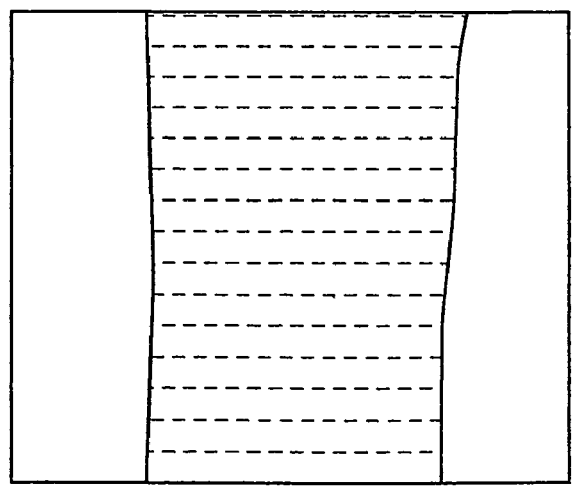

SEMICONDUCTOR DEVICE, METHOD FOR MANUFACTURING THE SAME, AND PLATING SOLUTION

This is a divisional of U.S. application Ser. No. 10/216,902, filed Aug. 13, 2002, now U.S. Pat. No. 7,060,618.

BACKGROUND OF THE INVENTION

1. Field of the Invention

This invention relates to a semiconductor device and a method for manufacturing the same, and more particularly to a semiconductor device and a method for manufacturing the same having an embedded interconnect structure in which an electrical conductor, such as copper or silver, is embedded in fine recesses formed in a surface of a semiconductor substrate, and having a protective film formed on surfaces of the interconnects to protect the interconnects.

The invention also relates to a plating solution useful for forming embedded interconnects by embedding an electrical conductor in fine recesses provided in a surface of a substrate, such as a semiconductor substrate, or for forming a protective film for protecting surfaces of embedded interconnects.

2. Description of the Related Art

As a process for forming interconnects in a semiconductor device, the so-called "damascene process", which comprises embedding a metal (electrical conductor) into trenches and contact holes, is coming into practical use. According to this process, aluminum or, more recently a metal such as copper or silver, is embedded into trenches and contact holes previously formed in an interlayer dielectric film of a semiconductor substrate. Thereafter, extra metal is removed by chemical mechanical polishing (CMP) so as to flatten a surface of the substrate.

In recent years, instead of aluminum or aluminum alloys generally used as a material for forming interconnection circuits on a semiconductor substrate, there is an eminent movement towards using copper. This is because electric resistivity of copper, which is 1.72 $\mu\Omega$cm, is about 40% lower than electric resistivity of aluminum, and therefore copper interconnects suffer less from a signal delay phenomenon. Further, copper has a much higher electromigration resistance than aluminum, and is easier for use in dual-damascene processes. Thus, use of copper offers a higher possibility of providing a complicated, fine multi-layer interconnection structure at a relatively low production cost.

In a case of interconnects formed by such a process, embedded interconnects have exposed surfaces after performing a flattening processing. When an additional embedded interconnect structure is formed on such an interconnects-exposed surface of a semiconductor substrate, the following problems may be encountered. For example, during formation of a new $SiO_2$ insulating interlayer in a subsequent process for forming an interlayer dielectric film, exposed surfaces of pre-formed interconnects is likely to be oxidized. Further, upon etching of the $SiO_2$ layer for formation of via holes, the pre-formed interconnects exposed on bottoms of the via holes can be contaminated with an etchant, a peeled resist, and the like.

In order to avoid such problems, it has been conventional to form a protective film of SiN or the like, not only on a circuit-formed region of a semiconductor substrate where surfaces of interconnects are exposed, but also on an entire surface of the substrate, thereby preventing contamination of these exposed interconnects with an etchant, and the like.

However, provision of a protective film of SiN or the like on an entire surface of a semiconductor substrate, in a semiconductor device having an embedded interconnect structure, increases a dielectric constant of an interlayer dielectric film, thus inducing delayed interconnection even when a low-resistivity material such as copper or silver is employed for interconnects, whereby performance of the semiconductor device may be impaired.

In view of this, it has been proposed to selectively cover surfaces of exposed interconnects with a protective film of Co (Cobalt), a Co alloy, Ni (Nickel) or a Ni alloy, exhibiting good adhesion to an interconnect material such as copper or silver and having a low resistivity ($\rho$), for example an alloy film which is obtained by electroless plating. In particular, by selectively covering surfaces of interconnects with a protective film composed of a Co—W alloy, such as a Co—W—B- or Co—W—P alloy, obtained by electroless plating, surface contamination and also thermal diffusion of the interconnects can be prevented.

However, as shown in FIG. 31, for example, when copper is embedded in trenches 4 formed in an insulating film 2 of $SiO_2$, followed by performing a CMP processing to form copper interconnects 8, and a protective film 20 composed of a Ni—B is formed by selectively electroless plating on exposed surfaces of the copper interconnects 8 to protect the exposed surfaces of copper interconnects 8, it is difficult to equalize a film thickness of the protective film 20, and the film thickness of the protective film 20 is likely to vary widely. This wide variation of film thickness of the protective film 20 leads to a problem in that when an interlayer dielectric film is laminated onto a protective film 20 during production of multi-layer interconnects, the interlayer dielectric film cannot have a sufficiently flat surface. Further, depending upon a pattern density of interconnects, there is undesirably a case in which the protective film overhangs the insulating film 2 in a high-pattern density region.

Furthermore, depending upon pattern density and width of interconnects, there is a case in which a plating material for forming the protective film is deposited also on the insulating film, besides on the interconnects. For example, in a case of copper interconnects which have been formed by embedding copper in recesses formed in an insulating film, an elemental level of copper is generally high. Especially in a high-pattern density region, due to copper contamination of a surface of the insulating film, a plating material of electroless plating can react with copper on the insulating film, resulting in deposition thereon of the plating material.

An interconnects-protective film (cap material) is required to have a high electromigration resistance. Electromigration is considered to be caused by Joulean heat generated due to concentration of electric current, and occurs from a thin portion or a pinhole in an interconnects-protective film. In order to meet this requirement, therefore, it is desired to uniformly cover surfaces of exposed interconnects with an interconnects-protective film which is a thin, continuous film having a uniform film thickness of generally not more than 50 nm, preferably 10 to 30 nm, and which is free from a locally thin portion and a pinhole.

However, as shown in FIG. 44, when an interconnects-protective film (thin film) 20 composed of a Co—W—B alloy with a crystalline phase, having a film thickness of not more than 50 nm, is formed by electroless plating on surfaces of copper interconnects 8 which have been formed by embedding copper in insulating film 10 of $SiO_2$, the interconnects-protective film 20 has the following problems:

The copper interconnects 8 are a poly-crystal film having a plurality of crystal orientations. Under influence of crystal orientation, a Co—W—B alloy crystal 20*a* with plane direction (111) grows (epitaxially) on a copper crystal 8*a* with plane direction (111), and a Co—W—B alloy crystal 20*b* with plane direction (222) grows (epitaxially) on a copper crystal 8*b* with plane direction (222). The Co—W—B alloy crystals 20*a* and 20*b*, with different plane directions, are different in growth rate, thereby making it difficult to obtain a continuous interconnects-protective film (thin film) having a uniform film thickness.

Thus, when an interconnects-protective film (cap material) having a crystalline phase is grown on a surface of copper, the protective film must be consistent with crystal planes of underlying copper; meaning difficulty in obtaining a uniform and continuous film, that is, difficulty in obtaining a sufficient electromigration resistance.

Further, when surfaces of interconnects are selectively covered with an interconnects-protective film composed of a Co alloy or an Ni alloy, obtained by electroless plating, to protect the interconnects, since a Co alloy or an Ni alloy is generally a magnetic material, magnetism of the interconnects-protective film can deteriorate semiconductor properties.

Moreover, when surfaces of embedded interconnects are selectively covered with a protective film (cap material) composed of a W (tungsten)-containing alloy such as a Co—W—B- or Co—W—P alloy, obtained by electroless plating, to protect the interconnects, the protective film can effectively prevent thermal diffusion of the interconnects (i.e. has an excellent thermal diffusion preventing effect). However, as shown in FIG. 55, a plating rate decreases with an increase in W concentration (W content by percentage) of the plating solution, and is thus generally lowered. In addition, a film thickness of such a plated film is sensitively influenced by a quality or state of underlying interconnects. For example, a variation in crystal orientation of the underlying interconnects can produce a remarkable variation in film thickness of the plated film and, in some cases, a uniform plated film cannot be formed on sub-micron interconnects.

On the other hand, when surfaces of embedded interconnects are selectively covered with a plated protective film (cap material) composed of a Co alloy not containing W, such as an amorphous Co—B alloy, to protect the interconnects, the plated film can be formed at a high plating rate without being influenced by a quality or state of underlying interconnects. Accordingly, a plated film having a uniform film thickness can be formed even on sub-micron interconnects. The plated film (protective film), however, cannot effectively prevent thermal diffusion of the interconnects (i.e. has a poor thermal diffusion preventing effect).

It has thus been difficult to successfully combine a requirement of using a protective film having an excellent effect of preventing thermal diffusion of interconnects, with a requirement of equalizing a film thickness of a protective film. The protective film herein refers to a film having a function of preventing thermal diffusion of underlying interconnect material, and a function of preventing oxidation of the underlying interconnect material in an oxidizing atmosphere upon formation of laminated interconnects, and also having an adequate resistance to etchants.

Copper interconnects, formed by solely using copper as an interconnect material, have enhanced electromigration resistance and stress migration resistance as compared to aluminum interconnects. With a trend toward high-speed, highly-integrated semiconductor devices, however, there is a demand for interconnects having further enhanced electromigration resistance and stress migration resistance, but not having an increased electric resistivity. With regard to a protective film of Co or a Co alloy, which is obtained by electroless plating, for selective covering and protection of interconnects, Co or a Co alloy has a higher resistivity ($\rho$) than copper. A demand therefore exists for decreasing a resistivity ($\rho$) of a protective film.

SUMMARY OF THE INVENTION

The present invention has been made in view of the above situation in the related art. It is therefore a first object of the present invention to provide a semiconductor device, and a method for manufacturing the same which eliminate unevenness in film thickness of a protective film that covers and protects exposed surfaces of embedded interconnects, thereby ensuring a sufficient surface flatness of an interlayer dielectric film to be formed on the protective film during formation of a multi-layer interconnect structure.

It is a second object of the present invention to provide a semiconductor device, and a method for manufacturing the same which can prevent a plating material, for forming a protective film, from being deposited on an insulating film, and selectively form a protective film only on exposed surfaces of interconnects.

It is a third object of the present invention to provide a semiconductor device, and a method for manufacturing the same which can selectively cover exposed surfaces of embedded interconnects with a continuous interconnects-protective film (thin film) having a uniform film thickness to protect the interconnects, and can prevent the protective film, which protects the interconnects, from deteriorating semiconductor properties of the semiconductor device.

It is a fourth object of the present invention to provide a semiconductor device, and a method for manufacturing the same which can selectively cover only surfaces of embedded interconnects with a protective film having a uniform film thickness and having an excellent effect of preventing thermal diffusion of the interconnects, thereby effectively preventing thermal diffusion of the interconnects.

It is a fifth object of the present invention to provide a plating solution which is useful for forming interconnects having enhanced electromigration resistance and stress migration resistance, but not having increased electric resistivity, or for forming a protective film having a low resistivity which can selectively cover and protect surfaces of interconnects. A semiconductor device formed by using this plating solution, and a method for manufacturing the semiconductor device, also are part of the fifth object.

In order to achieve the above objects, the present invention provides a semiconductor device having an embedded interconnect structure, comprising a protective film formed selectively on surfaces of exposed interconnects, wherein the protective film has a flattened surface. By flattening the surface of the protective film, of which it is generally difficult to equalize film thickness, unevenness of film thickness can be eliminated and an overhanging portion of the film can be removed.

The protective film may be composed of at least one of Co, a Co alloy, Ni or a Ni alloy. Examples of the Co alloy may include Co—W—P, Co—W—B, Co—P and Co—B alloys; and examples of the Ni alloy may include Ni—B, Ni—P, Ni—W—P and Ni—W—B alloys.

The present invention also provides another semiconductor device having an embedded interconnect structure, comprising an interconnects-protective film formed selectively on surfaces of exposed interconnects, wherein the protective film has an amorphous phase. The surfaces of the exposed interconnects can be selectively covered and protected with a uniform and continuous interconnects-protective film (cap material) having an amorphous phase. In this regard, as shown in FIG. 32, when an interconnects-protective film (thin film) 20 composed of a Co—W—B alloy with a film thickness of not more than 50 nm, having an amorphous phase, is formed by electroless plating on surfaces of interconnects (copper interconnects) 8 which have been formed by embedding copper in an insulating film 10 of $SiO_2$, Co—W—B alloy 20c grows uniformly over copper crystal 8a with plane direction (111) and copper crystal 8b with plane direction (222) without being influenced by crystal orientation of the copper interconnects 8 which are comprised of a poly-crystal film having a plurality of crystal orientations. A continuous interconnects-protective film (thin film) 20 having a uniform film thickness can thus be obtained.

The interconnects-protective film may be composed of a Ni alloy, a Co alloy or a Cu alloy. The Cu alloy may be a Cu—B alloy or the like. As an interconnect material, a low-resistivity material, such as copper, a copper alloy, silver or a silver alloy, may be used for speed-up and densification of the semiconductor device.

The present invention also provides still another semiconductor device having an embedded interconnect structure, comprising an interconnects-protective film formed selectively on surfaces of exposed interconnects, wherein the interconnects-protective film is a non-magnetic film. The above-described interconnects-protective film having an amorphous phase, unlike a crystal, has an amorphous structure with no three-dimensional regularity. An alloy of an amorphous structure is generally non-magnetic (non-ferromagnetic). Thus, an interconnects-protective film can be made non-magnetic for various alloy compositions by making the protective film an amorphous film.

The present invention also provides still another semiconductor device having an embedded interconnect structure, comprising a protective film formed selectively on surfaces of exposed interconnects, wherein the protective film is obtained by a process comprising performing a pre-treatment on surfaces of exposed interconnects, and then forming the protective film selectively on such pre-treated surfaces of the exposed interconnects. By thus performing a pre-treatment of surfaces of exposed interconnects, to uniformize in advance quality of the interconnects which will underlie a protective film, it becomes possible to form a protective film (cap material) of a W-containing alloy, such as a Co—W—B alloy, having an excellent thermal diffusion preventing effect, with a uniform film thickness, thereby effectively preventing thermal diffusion of the embedded interconnects.

For example, a seed layer, which acts as a catalyst during electroless plating in a subsequent step, can be formed by the pre-treatment selectively on surfaces of exposed interconnects, and a protective film (cap material) with a uniform film thickness, having an excellent thermal diffusion preventing effect, can be formed selectively on a surface of the seed layer acting as a catalyst.

The seed layer may be composed of an amorphous Co—B alloy, and the protective film may be composed of an amorphous Co—W—B alloy or an amorphous Co—W—P alloy. This makes it possible to first form a seed layer of a uniform film equality, composed of an amorphous Co—B alloy, with a uniform film thickness without being influenced by crystal orientation of underlying interconnects, and then form a protective film composed of an amorphous Co—W—B or Co—W—P alloy, having an excellent thermal diffusion preventing effect, with a uniform thickness on a surface of the seed layer.

The present invention provides a semiconductor device comprising interconnects composed of a copper alloy, with the interconnects having been formed by embedding the copper alloy in fine recesses provided in a surface of a substrate, wherein the copper alloy is an alloy of copper and a metal that does not form a solid solution with the copper. Owing to use of such a specific copper alloy as an interconnect material, the semiconductor device can have interconnects with enhanced electromigration resistance and stress migration resistance, but without an increase in electric resistivity as compared to use of only copper as an interconnect material. The "copper alloy of copper and a metal that does not form a solid solution with the copper" herein refers to a copper alloy, such as a copper-silver alloy, in which alloy components (e.g. copper and silver) do not form a single or mutual crystal lattice (i.e. the alloy components, e.g. copper and silver, do not form a mixed crystal), but respective crystals of the alloy components (e.g. copper crystals and silver crystals) are co-present.

The protective film may have a thickness in a range of 0.1 to 500 nm. The copper alloy may be a copper-silver alloy, a copper-cobalt alloy or a copper-tin alloy. It is preferred that copper content of the copper alloy is in a range of 90 to 99.99 at %.

The present invention further provides a semiconductor device having an embedded interconnect structure, comprising a protective film composed of a copper alloy formed selectively on surfaces of exposed interconnects, wherein the copper alloy is an alloy of copper and a metal that does not form a solid solution with the copper. The semiconductor device is thus provided with a protective film composed of a specific copper alloy, i.e. a copper alloy of copper and a metal that does not form a solid solution with the copper, having a strong adhesion to silver or copper and having a low resistivity ($\rho$). The interconnects of the semiconductor device can be selectively covered and protected with the protective film without an increase of interconnect resistivity.

The present invention also provides a method for manufacturing a semiconductor device, comprising: forming a protective film by electroless plating a material selectively onto surfaces of exposed interconnects in a semiconductor device having an embedded interconnect structure; and flattening a surface of the semiconductor device having the protective film thus formed. When a protective film is formed by electroless plating, it is generally difficult to equalize a film thickness. By thus flattening the surface of the protective film after electroless plating, unevenness in film thickness of the protective film can be eliminated and an overhanging portion of the protective film can be removed.

In one embodiment, the method comprises: embedding an electrical conductor by plating material into recesses provided in a surface of a semiconductor device that is to have an embedded interconnect structure; heat-treating the electrical conductor; flattening a surface of the semiconductor device by polishing the surface; forming a protective film by electroless plating a material selectively onto surfaces of exposed interconnects of the interconnect structure; and then flattening a surface of the semiconductor device by polishing the surface. Polishing after formation of the protective film may be performed, for example, by using a polishing pad of a non-woven fabric, a sponge or a resin material such as foamed polyurethane, while supplying a slurry containing an oxidizing agent and abrasive grains. The protective film can be polished by the abrasive grains contained in the slurry, which have been oxidized by the oxidizing agent. Polishing may also be carried out by using a grinding stone containing abrasive grains.

Before performing the electroless plating to selectively form the protective film, if necessary, a pre-plating treatment may be performed. The pre-plating treatment may be a catalyst-imparting treatment for imparting a Pd catalyst, or an oxide film removal treatment for removing an oxide film adhering to surfaces of exposed interconnects.

In another embodiment, the method comprises: embedding an electrical conductor by plating material into recesses provided in a surface of a substrate; heat-treating the electric conductor; flattening a surface of such heat-treated substrate by polishing the surface; cleaning a flattened surface of the substrate; and forming a protective film by electroless plating material selectively onto surfaces of exposed interconnects, defining the electrical conductor, in such cleaned substrate. Upon this cleaning, it is preferred that an upper surface of an insulating film on a surface of the substrate be cleaned so that an electrical conductor contamination on the insulating film is reduced to at most $5 \times 10^5$ atoms/cm$^2$. This can prevent a plating material from reacting with copper on the insulating film upon a subsequent electroless plating for selectively forming the protective film, and thereby depositing on the insulating film. After cleaning of the substrate surface, plating may preferably be initiated while an upper surface of the insulating film is still clean, e.g. within 5 minutes.

The present invention also provides another method for manufacturing a semiconductor device, comprising performing electroless plating of a material onto a surface of a semiconductor device having an embedded interconnect structure so as to form an interconnects-protective film selectively on surfaces of exposed interconnects defining the interconnect structure, wherein the protective film has an amorphous phase.

In one embodiment, the method comprises: embedding an electrical conductor by plating material into recesses provided in a surface of a semiconductor device that is to have an embedded interconnect structure; heat-treating the electrical conductor; flattening a surface of the semiconductor device by chemical mechanical polishing the surface; and forming an interconnects-protective film, having an amorphous phase by electroless plating material selectively onto surfaces of exposed interconnects that define the interconnect structure of the semiconductor device.

The present invention also provides still another method for manufacturing a semiconductor device, comprising performing electroless plating of a material onto a surface of a semiconductor device having an embedded interconnect structure so as to form an interconnects-protective film selectively on surfaces of exposed interconnects that define the interconnect structure, wherein the protective film is a non-magnetic film.

In one embodiment, this method comprises: embedding an electrical conductor by plating material into recesses provided in a surface of a semiconductor device that is to have an embedded interconnect structure; heat-treating the electrical conductor; flattening a surface of the semiconductor device by chemical mechanical polishing the surface; and forming an interconnects-protective film, which is a non-magnetic film, by electroless plating material selectively on surfaces of exposed interconnects that define the interconnect structure of the semiconductor device.

The present invention also provides still another method for manufacturing a semiconductor device, comprising performing a selective pre-treatment of surfaces of exposed interconnects, in a semiconductor device, defining an embedded interconnect structure, and forming a protective film by electroless plating material selectively onto such pre-treated surfaces of the interconnects.

By such pre-treatment, a seed layer composed of an amorphous Co—B alloy, which acts as a catalyst during a Co alloy plating, e.g. a Co—W—B or Co—W—P alloy plating, may be formed selectively on surfaces of the exposed interconnects. A protective film composed of a Co—W—B or Co—W—P alloy may be formed selectively on the seed layer.

In one embodiment, this method comprises: embedding an electrical conductor by plating material into recesses provided in a surface of a semiconductor device that is to have an embedded interconnect structure; heat-treating the electrical conductor; flattening a surface of the semiconductor device by chemical mechanical polishing the surface; performing a pre-treatment of surfaces of exposed interconnects that define the interconnect structure of the semiconductor device; and forming a protective film by electroless plating material selectively onto such pre-treated exposed surfaces of the interconnects.

The present invention also provides still another method for manufacturing a semiconductor device, comprising plating a surface of a substrate so as to embed a copper alloy in fine recesses provided in the surface of the substrate, thereby forming interconnects, wherein the copper alloy is an alloy of copper and a metal that does not form a solid solution with the copper.

The present invention also provides still another method for manufacturing a semiconductor device, comprising plating a surface of a semiconductor device having an embedded interconnect structure, thereby forming a protective film composed of a copper alloy selectively on at least part of exposed interconnects that define the interconnect structure, wherein the copper alloy is an alloy of copper and a metal that does not form a solid solution with the copper.

The present invention also provides an apparatus for manufacturing a semiconductor device, comprising: a first plating unit for embedding an electrical conductor into recesses provided in a surface of a substrate; a first polishing unit for polishing the electrical conductor from the surface of the substrate in which the electric conductor is embedded; a second plating unit for forming a protective film selectively on surfaces of exposed interconnects that define the electrical conductor, after this polishing; and a second polishing unit for polishing the protective film.

The apparatus may also comprise a heat treatment unit for heat-treating the electrical conductor embedded in the substrate. The apparatus may further comprise a third plating unit for forming a seed layer, which acts as a catalyst during plating performed in the second plating unit, selectively on the surfaces of the exposed interconnects prior to forming the protective film selectively on the exposed surfaces of the interconnects in the second plating unit.

Further, the apparatus may be provided with a cleaning unit for cleaning a surface of the substrate which has been flattened by polishing in the first polishing unit. It is preferred that this substrate surface be cleaned so that an electrical conductor contamination on an insulating film on the surface of the substrate is reduced to at most $5 \times 10^5$ atoms/cm$^2$.

The present invention also provides a plating solution for use in plating of a copper alloy of copper and a metal that does not form a solid solution with the copper. The plating solution comprises copper ions and metal ions of a metal.

The metal is capable of forming with copper a copper alloy in which the metal does not form a solid solution with the copper. The plating solution further comprises a complexing agent, and a reducing agent containing no alkali metal. Plating with use of the plating solution can produce a plated film, composed of a copper alloy including copper and a metal that does not form a solid solution with the copper, having almost the same electric resistivity as copper and having enhanced electromigration resistance and stress migration resistance as compared to copper.

The metal ions may be silver ions, cobalt ions or tin ions. The reducing agent may be an alkylamine borane. Use of an alkylamine borane as a reducing agent, which does not contain sodium, can prevent alkali metal contamination of semiconductor devices. Specific examples of the alkylamine borane may include dimethylamine borane, diethylamine borane, and trimethylamine borane.

The plating solution may further include at least one of a stabilizer selected from one or more kinds of sulfur compounds, nitrogen compounds and heavy metal compounds, and a surfactant.

It is preferred that a pH of the plating solution is adjusted to be in a range of 5 to 14 using a pH adjusting agent free from alkali metal. By thus adjusting the pH of the plating solution with an alkali metal-free pH adjusting agent, inclusion of an alkali metal, such as sodium, in the plating solution can be prevented. Examples of such pH adjusting agents include ammonia water and tetramethylammonium hydroxide (TMAH). The pH of the plating solution is preferably adjusted to 7-13.

BRIEF DESCRIPTION OF THE DRAWINGS

FIG. 4 is a plan layout view showing an embodiment of an apparatus for manufacturing a semiconductor device according to the present invention;

FIG. 5 is a plan layout view showing another embodiment of an apparatus for manufacturing a semiconductor device according to the present invention;

FIG. 11 is a cross-sectional view explanatory of a relationship between a housing and a pressing ring of the electroplating apparatus shown in FIG. 7, and a substrate at a time of transfer of the substrate;

FIG. 12 is an enlarged view showing a part of FIG. 11;

FIG. 17 is a sectional view taken along line A-A of FIG. 16;

FIG. 18 is a cross-sectional view of a substrate holding portion and a cathode portion of the electroplating apparatus shown in FIG. 16;

FIG. 21 is a schematic view of an anode and a plating solution impregnated material of the electroplating apparatus shown in FIG. 16;

FIG. 22 is a view showing a schematic constitution of an example of an electroless plating apparatus used as a first plating unit and/or a second plating unit;

FIG. 26 is a plan view of a reversing arm portion of the copper film thickness inspection unit;

FIG. 27 is a view showing a schematic constitution of an example of a cleaning unit;

FIG. 32 is a diagram showing a state in which a thin film composed of an alloy, having an amorphous phase, is formed (epitaxially) on surfaces of copper interconnects;

FIG. 33 is a cross-sectional view of another embodiment of a semiconductor device according to the present invention;

FIG. 50 is a diagram illustrating an SEM photograph of the sample obtained in Comparative Example 2;

FIG. 51 is a diagram illustrating an SEM photograph of the sample obtained in Comparative Example 3;

DETAILED DESCRIPTION OF THE PREFERRED EMBODIMENTS

Preferred embodiments of the present invention will now be described.

Figure 1A:
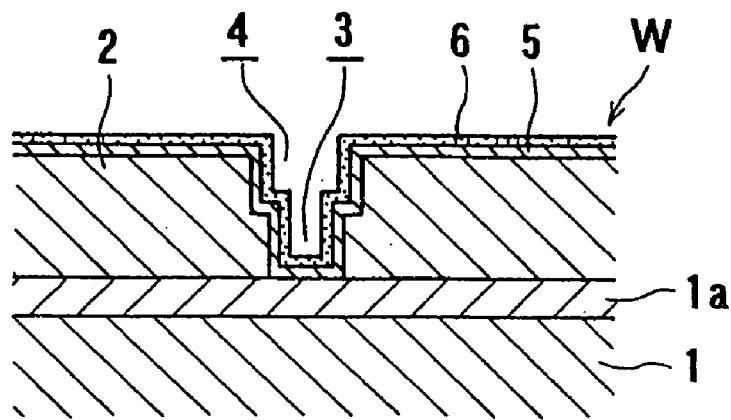
FIGS. 1A through 1C illustrate, in a sequence of process steps, an example of forming copper interconnects in a semiconductor device until CMP processing is performed.
Figure 1B:
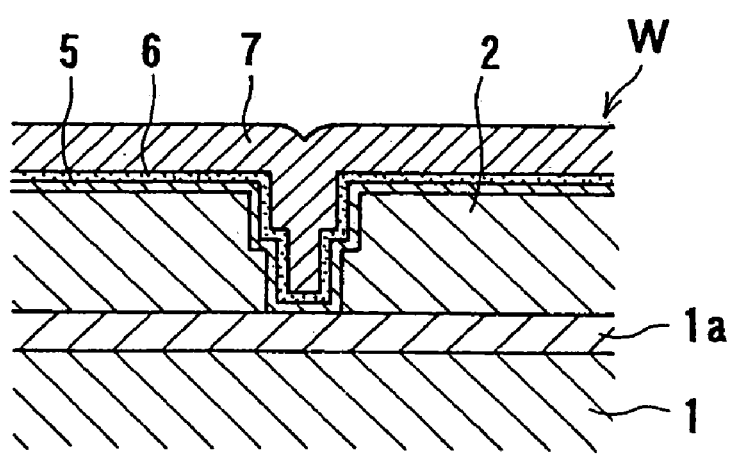
Figure 1C:
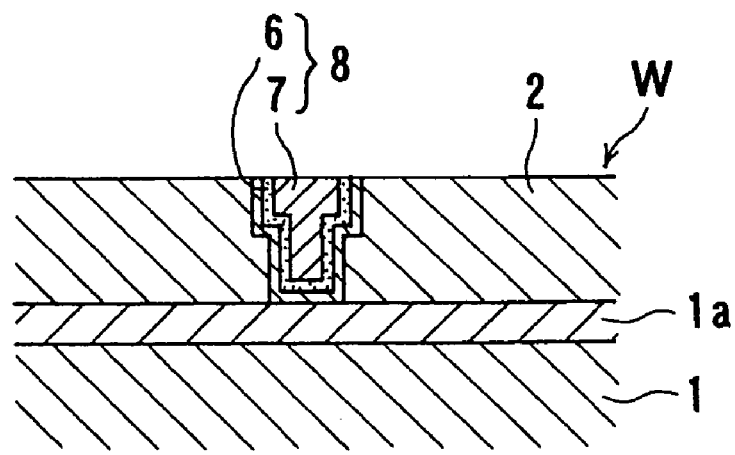

FIGS. 1A through 1C illustrate, in a sequence of process steps, an example of producing copper interconnects in a semiconductor device. As shown in FIG. 1A, an insulating film 2 of $SiO_2$ is deposited on a conductive layer 1a on a semiconductor substrate 1 having formed semiconductor devices. A contact hole 3 and a trench 4 are formed in the insulating film 2 by performing a lithography/etching technique. Thereafter, a barrier layer 5 of Ta, TaN or the like is formed on an entire surface of the insulating film, and a copper seed layer 6 as an electric supply layer for electroplating is formed on the barrier layer 5 by sputtering or the like.

Then, as shown in FIG. 1B, copper plating is conducted on a surface of the copper seed layer 5 to fill the contact hole 3 and the trench 4 with copper and, at the same time, deposit a copper film 7 on the insulating film 2. Thereafter, the copper film 7 and the barrier layer 5 on the insulating layer 2 are removed by chemical mechanical polishing (CMP) so as to leave copper filled in the contact hole 3 and the trench 4, and have a surface of the insulating film 2 lie substantially on the same plane as this copper. Interconnects 8 composed of the copper seed layer 6 and the copper 7, as shown in FIG. 1C, are thus formed in the insulating layer 2.

Figure 2A:
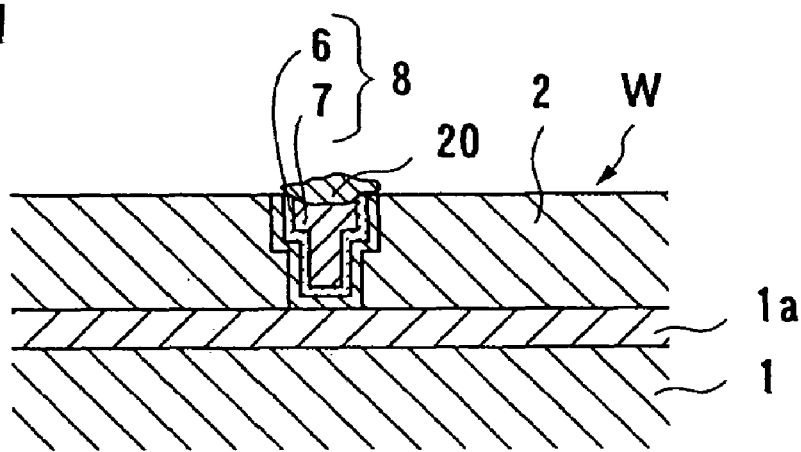
FIGS. 2A through 2C illustrate, in a sequence of process steps, an embodiment of forming copper interconnects in a semiconductor device after CMP processing has been performed, according to the present invention.
Figure 2B:
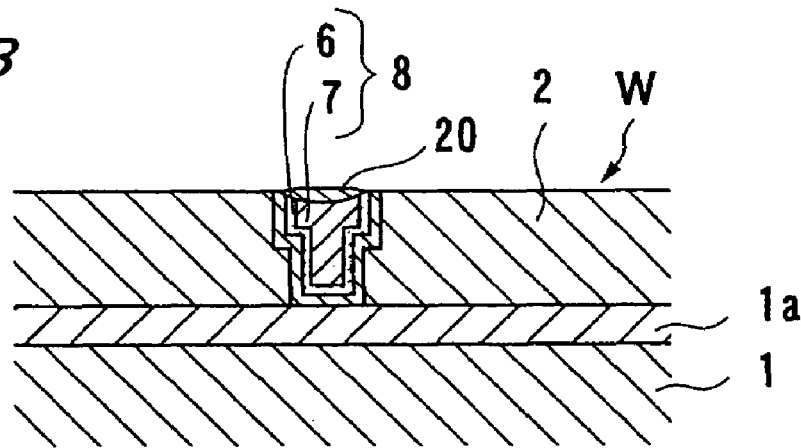
Figure 2C:
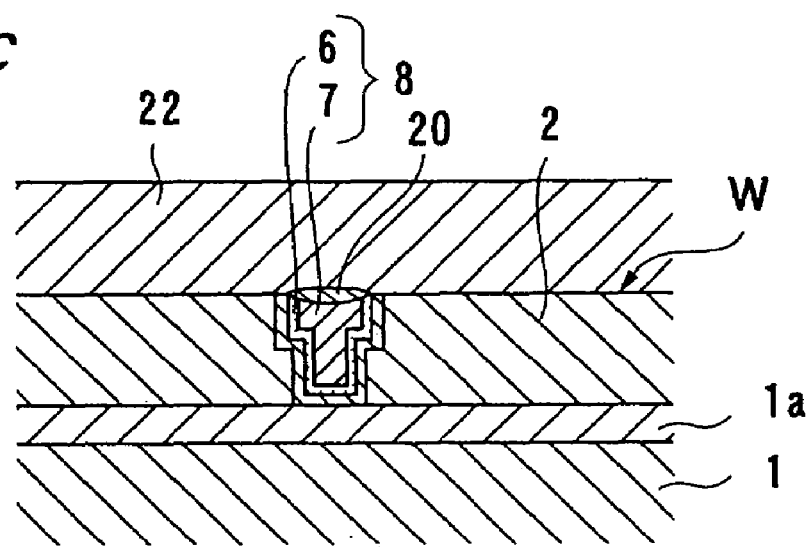
Figure 3:
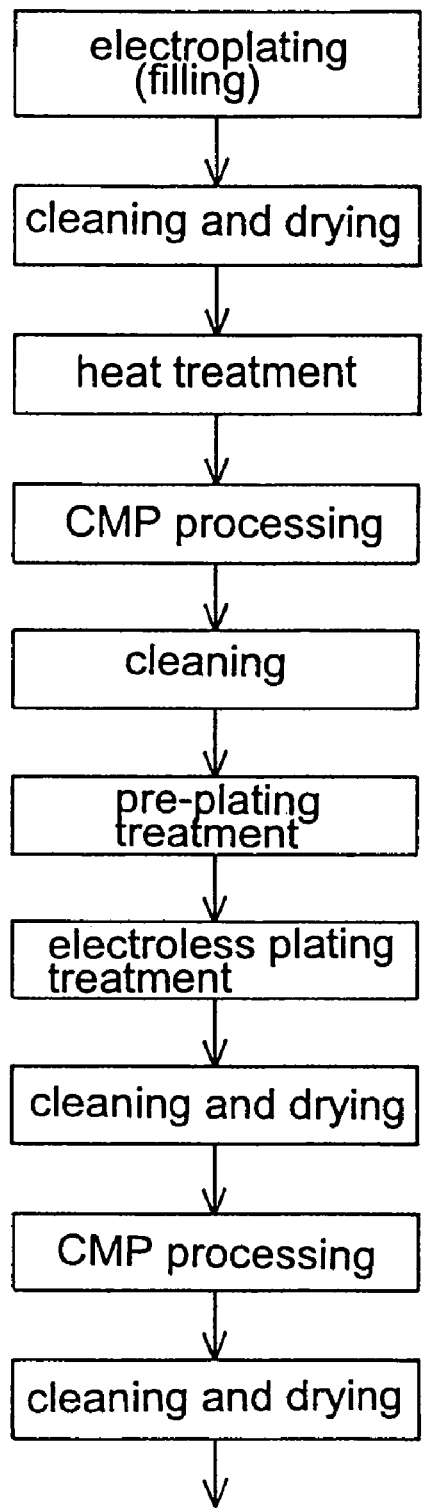
FIG. 3 is a block diagram showing, in a sequence of process steps, an embodiment of a plating method according to the present invention.

According to the semiconductor device of the present invention, as shown in FIGS. 2A through 2C, exposed surfaces of the interconnects 8, which have been formed in the insulating layer 2 in the above-described manner, is selectively covered with a protective film 20 to protect the interconnects 8, and then a CMP processing is carried out to flatten a surface of the protective film 20. Thereafter, an insulating film 22 of $SiO_2$ or SiOF is superimposed on the surface of the insulating layer 2 to form a multi-layer interconnect structure. FIG. 3 illustrates an example of process steps in the above process. According to this example, filling with copper is first performed by electroplating and, after cleaning and drying, a heat treatment (annealing) is performed according to necessity. A CMP processing is then performed, and substrate W, after the CMP processing, is cleaned. After performing a pre-plating treatment, such as a catalyst-imparting treatment for imparting a Pd catalyst, electroless plating of a surface of substrate W is performed to form a protective film 20, composed of a Co alloy, selectively on the exposed surfaces of interconnects 8, as shown in FIG. 2A. After cleaning and drying the substrate, a CMP processing of the substrate W is performed to flatten a surface of the protective film 20, as shown in FIG. 2B. Next, after cleaning and drying the substrate, an insulating film 22 is deposited on the substrate, as shown in FIG. 2C.

The interconnects 8 can thus be protected by selectively covering the exposed surface of the interconnects 8 with the protective film 20. When forming the protective film 20 by electroless plating, it is generally difficult to equalize a film thickness. By thus flattening the surface of protective film 20 by CMP processing, unevenness in film thickness of the protective film 20 can be eliminated, which ensures a sufficient flatness of the surface of the insulating film 22 deposited on the protective film 20.

In the cleaning after the CMP processing, it is preferred to clean the surface of substrate W so that copper contamination on the insulating film 2 shown in FIG. 1C is reduced to at most $5 \times 10^5$ atoms/cm². This can prevent a plating material of a later electroless plating from reacting with copper on the insulating film 2 during the later electroless plating, for forming the protective film 20 selectively by copper contamination on the insulating film 2, thereby depositing on the insulating film. In this regard, when electroless plating is performed on a copper surface, deposition of a plating material proceeds through reaction of the plating material with copper, regardless of whether the deposition is performed by a catalytic process or not. Thus, by removing copper from an upper surface of insulating film 2, reaction of a plating material with copper on the insulating film, and thus deposition thereon of the plating material, can be prevented. After such a cleaning of the surface of substrate W, electroless plating is desirably initiated while the upper surface of insulating film 2 is still clean, for example, within 5 minutes after the cleaning.

In selective formation of the protective film 20, there is a case where film formation is influenced by integration density of interconnect patterns. Thus, the film is harder to deposit on a portion of a sparse interconnect pattern than on a portion of a dense interconnect pattern. Accordingly, when the protective film 20 with a sufficient thickness is formed on a portion of a sparse interconnect pattern, the protective film 20 is formed thick on a portion of a dense interconnect pattern. In such a dense pattern portion, there is a case where the protective film 20 is formed not only on the surface of exposed interconnects 8, but also on the surface of insulating film 2. Even in such a case, not only the protective film 20 formed on the exposed interconnects 8, but the protective film 20 formed on the insulating film 2 as well can be flattened simultaneously by a CMP processing, whereby unevenness of the protective film 20 can be eliminated. Though this flattening processing may be terminated when a surface of protective film 20 reaches a level slightly above the surface of insulating film 2, it is preferred to perform flattening until the surface of protective film 20 reaches a level of the surface of insulating film 2 in order to secure a sufficient flatness of the surface of insulating film 22 to be deposited onto the protective film 20.

In this example, a Co—W—P alloy is used for the protective film 20. The protective film (Co—W—P alloy layer) 20 is formed by first performing a pre-treatment of the substrate W, e.g. by immersing the substrate in a solution of $PdCl_2$ and HCl for one minute, thereby imparting a palladium catalyst to a surface of the substrate, and then immersing the surface of the substrate W in a plating solution containing cobalt ions, a complexing agent, a pH buffer, a pH adjusting agent, a reducing agent, and a tungsten-containing compound.

If necessary, the plating solution may further contain as an additive at least one of a stabilizer selected from one or more kinds of heavy metal compounds and sulfur compounds, and a surfactant. The plating solution has been adjusted to a pH of 10 with the pH adjusting agent, such as sodium hydroxide. A temperature of the plating solution is 90° C.

The cobalt ions in the plating solution may be supplied from a cobalt salt, such as cobalt sulfate, cobalt chloride or cobalt acetate. Specific examples of the complexing agent may include carboxylic acids, such as acetic acid, and their salts; oxycarboxylic acids, such as tartaric acid and citric acid, and their salts; and aminocarboxylic acids, such as glycine, and their salts. These compounds may be used singly or as a mixture of two or more.

Examples of the pH buffer include ammonium sulfate, ammonium chloride, and boric acid. Sodium hypophosphite, for example, may be used as the reducing agent. Examples of the tungsten-containing compound include tungstic acid or its salt, and heteropoly acids, such as tungstophosphoric acids (e.g. $H_3 (PW_{12}P_4O).nH_2O$), and their salts.

Though this example uses a Co—W—P alloy for the protective film 20, it is also possible to use Co as a single substance, a Co—W—B alloy, a Co—P alloy, a Co—B alloy, and the like for the protective film 20.

Further, it is possible to use an Ni—B alloy for the protective film 20. The protective film (Ni—B alloy layer) 20 may be formed by using an electroless plating solution containing nickel ions, a complexing agent for nickel ions, an alkylamine borane or a borohydride compound as a reducing agent for nickel ions, and ammonia ions, with the pH of the plating solution being adjusted to 8-12, and immersing the surface of the substrate W in the plating solution. The temperature of the plating solution is generally 50 to 90° C., preferably 55 to 75° C.

Examples of the complexing agent for the nickel ions may include malic acid and glycine. $NaBH_4$, for example, may be used as the horohydride compound. For the protective film 20, it is also possible to use Ni as a single substance, an Ni—P alloy, a Ni—W—B or an Ni—W—P alloy, and the like.

Further, though this example uses copper as an interconnect material, it is possible to use instead a copper alloy, silver or a silver alloy.

FIG. 4 is a plan view showing a general construction of an apparatus for manufacturing a semiconductor device according to one embodiment of the present invention. The apparatus includes, at one end of a space on a rectangular floor, a first polishing unit 24a and a second polishing unit 24b disposed opposite to each other on both sides of the space, and, at another end of the space, a pair of loading/unloading sections for placing thereon substrate cassettes 26a, 26b for housing substrates W such as semiconductor wafers. Two transfer robots 28a, 28b are disposed on a transfer line connecting the polishing units 24a, 24b and the loading/unloading sections. On one side of the transfer line, there are disposed a first plating unit 30 for embedding of copper, a copper film thickness inspection unit 32 provided with a reversing machine and a pre-plating treatment unit 34 provided with a reversing machine, and on another side of the transfer line, there are disposed a rinsing/drying device 36, a second plating unit 38 for formation of a protective film and a cleaning unit 39 provided with a roll sponge. Vertically-movable pushers 42 are provided on both sides of the transfer line, respectively, for transferring a substrate W between them and the polishing units 24a, 24b, respectively.

Further, as shown in FIG. 5, an annealing unit (heat treatment unit) 814 may be provided in a place adjacent to the first plating unit 30, so that embedding of an electrical conductor (copper) in the first plating unit 30, heat treatment (annealing) of the electrical conductor (copper) in the annealing unit 814 and polishing in the polishing unit 24a or 24b can be performed successively.

Figure 7:
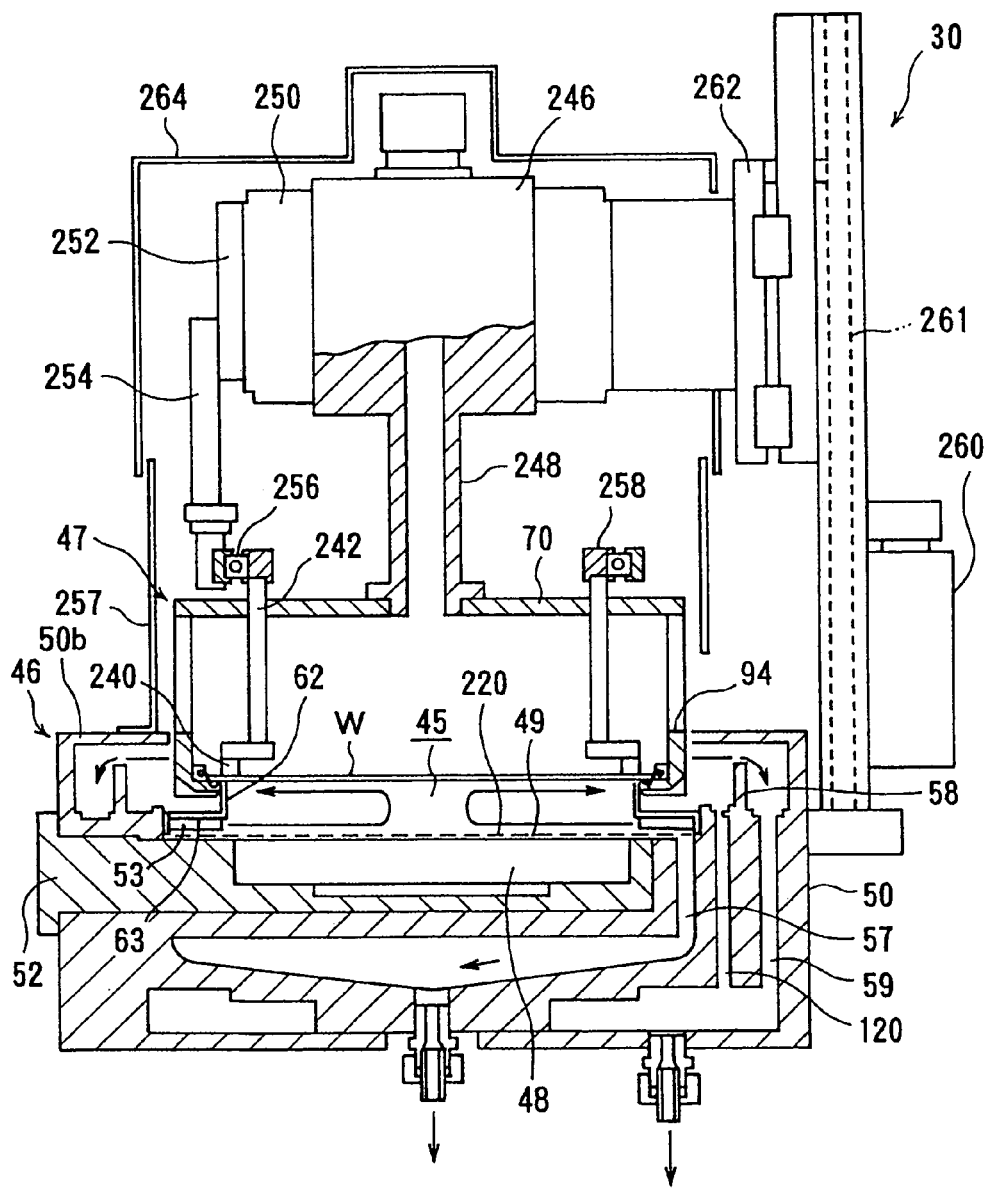
FIG. 7 is a cross-sectional view showing an entire structure of an electroplating apparatus as a first plating unit, at a time of performing a plating process.

FIGS. 7 through 15 show an electroplating apparatus making-up the first plating unit 30 provided in the apparatus shown in FIGS. 4 and 5. As shown in FIG. 7, the plating unit (electroplating apparatus) 30 is composed mainly of a plating process container 46 which is substantially cylindrical and contains a plating solution 45 therein, and a head 47 disposed above the plating process container 46 for holding the substrate W. In FIG. 7, the plating unit 30 is in such a state that the substrate W is held by the head 47 such that a surface of the substrate is on a liquid level of the plating solution 45 for being plated.

The plating process container 46 has a plating chamber 49 which is open upwardly and has an anode 48 at a bottom thereof. A plating bath 50 containing the plating solution 45 is provided within the plating chamber 49. Plating liquid supply nozzles 53, which project horizontally toward a center of the plating chamber 49, are disposed at circumferentially equal intervals on an inner circumferential wall of the plating bath 50. The plating solution supply nozzles 53 communicate with plating solution supply passages extending vertically within the plating bath 50.

Further, according to this embodiment, a punch plate 220 having a large number of holes with a size of, for example, about 3 mm is disposed at a position above the anode 48 within the plating chamber 49. The punch plate 220 prevents a black film formed on a surface of the anode 48 from curling up by the plating solution 45 and consequently being flowed out.

Figure 13C:
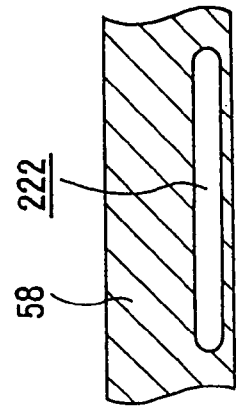
FIGS. 13A through 13D are schematic views explanatory of flow of a plating solution of the electroplating apparatus shown in FIG. 7, at a time of performing a plating process and at a time of not performing a plating process.

The plating bath 50 has first plating solution discharge ports 57 for withdrawing the plating solution 45 contained in the plating chamber 49 from a peripheral portion of a bottom of the plating chamber 49, and second plating solution discharge ports 59 for discharging the plating solution 45 which has overflowed a weir member 58 provided at an upper end of the plating bath 50. Further, the plating bath 50 has third plating solution discharge ports 120 for discharging the plating solution before overflowing the weir member 58. As shown in FIGS. 13A through 13C, the weir member 58 has, in its lower part, openings 222 having a predetermined width, at predetermined intervals.

With this arrangement, when an amount of plating solution supplied is large during plating, the plating solution is discharged to an exterior through the third plating solution discharge ports 120 and, in addition, as shown in FIG. 13A, the plating solution overflowing the weir member 58 and passing through the openings 222 is discharged to the exterior through the second plating solution discharge ports 59. On the other hand, during plating, when an amount of plating solution supplied is small, the plating solution is discharged to the exterior through the third plating solution discharge ports 120, and as shown in FIG. 13B, the plating solution is passed through the openings 222 and discharged to the exterior through the second plating solution discharge ports 59. In this manner, this construction can easily cope with a case where an amount of plating solution supplied is large or small.

Figure 13D:
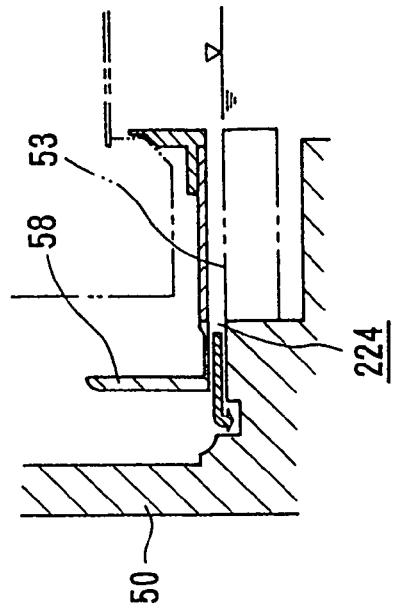
Figure 13A:
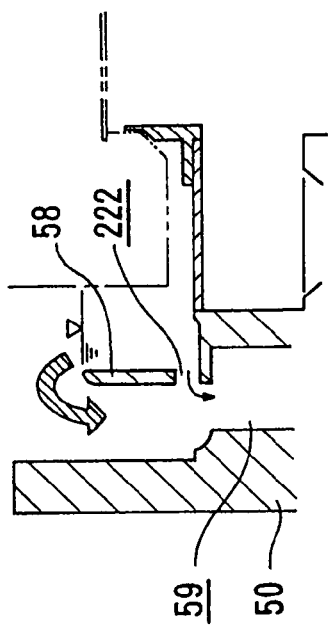
Figure 13B:
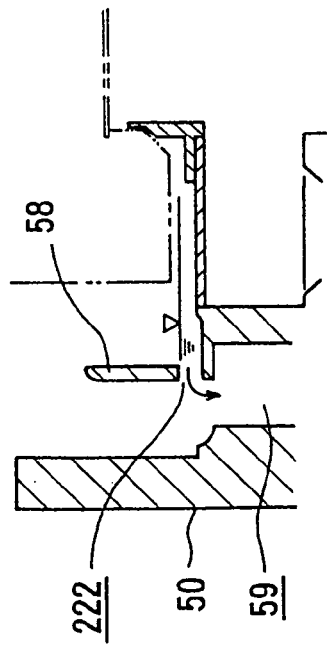

Further, as shown in FIG. 13D, through holes 224 for controlling a liquid level, which are located above the plating solution supply nozzles 53 and communicate with the plating chamber 49 and the second plating solution discharge ports 59, are provided at circumferentially predetermined pitches. Thus, when plating is not performed, plating solution is passed through the through holes 224, and is discharged to the exterior through the second plating solution discharge ports 59, thereby controlling a liquid level of the plating solution. During plating, the through holes 224 serve as an orifice for restricting an amount of plating solution flowing therethrough.

Figure 8:
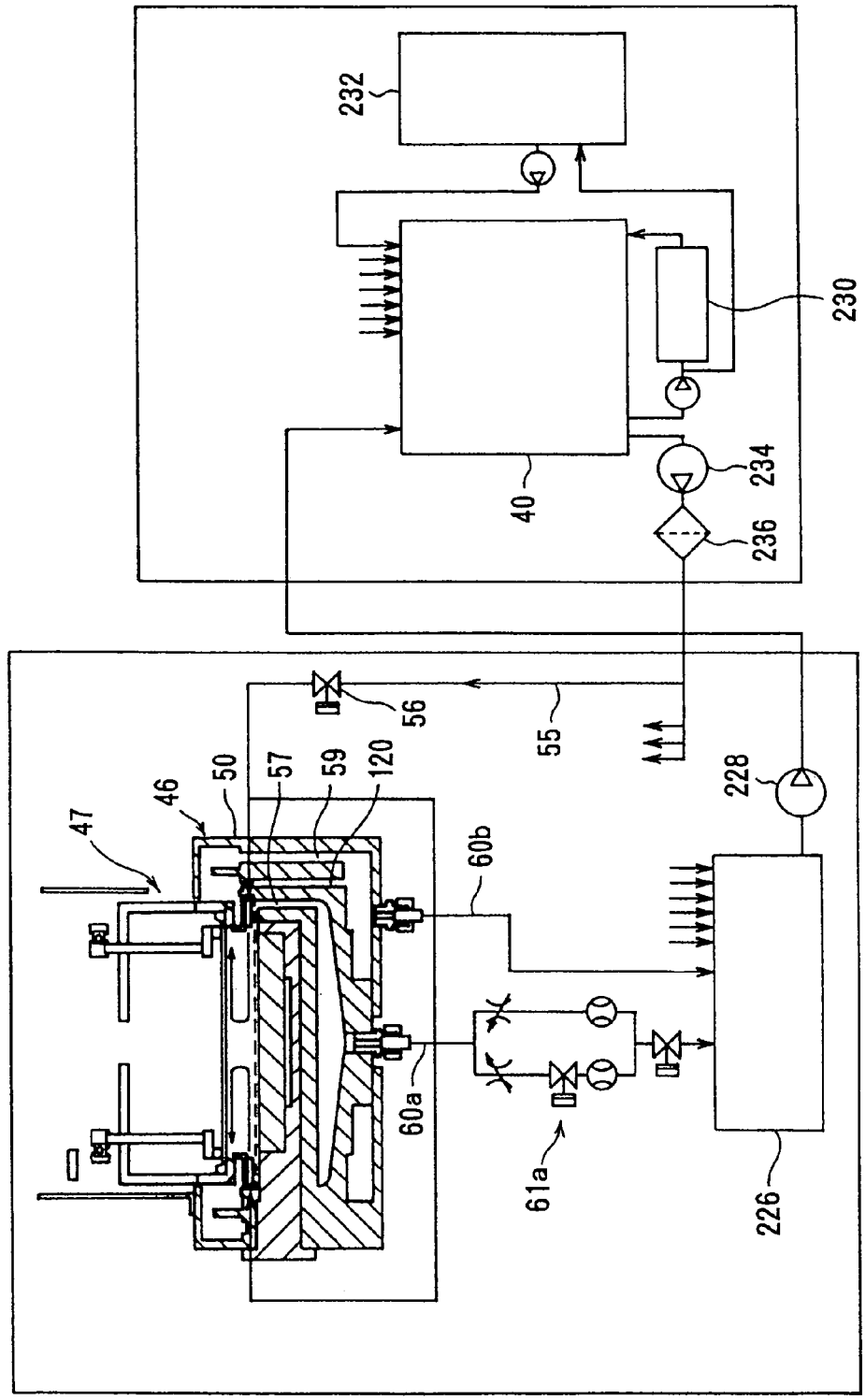
FIG. 8 is a diagram showing flow of a plating solution in the electroplating apparatus shown in FIG. 7

As shown in FIG. 8, the first plating solution discharge ports 57 are connected to reservoir 226 through plating solution discharge pipe 60*a*, and a flow controller 61*a* is provided in the plating solution discharge pipe 60*a*. The second plating solution discharge ports 59 and the third plating solution discharge ports 120 join with each other within the plating container 50, and this joined passage is then connected directly to the reservoir 226 through plating solution discharge pipe 60*b*.

The plating solution 45 which has flowed into the reservoir 226 is introduced by a pump 228 into plating solution regulating tank 40. This plating solution regulating tank 40 is provided with a temperature controller 230, and a plating solution analyzing unit 232 for sampling the plating solution and analyzing this sample. When a single pump 234 is operated, the plating solution is supplied from the plating solution regulating tank 40 through filter 236 to the plating solution supply nozzles 53 of the plating unit 30. A control valve 56 for fixing secondary pressure is provided in a plating solution supply pipe 55 extending from the plating solution regulating tank 40 to the plating unit 30.

Returning to FIG. 7, a vertical stream regulating ring 62 and a horizontal stream regulating ring 63 are disposed within the plating chamber 49 at a position near an internal circumference of the plating chamber 49, and a central portion of a liquid surface is pushed upwardly by an upward stream out of two divided upward and downward streams of the plating solution 45 within the plating chamber 49, whereby downward flow is smoothened and distribution of current density is further uniformized. The horizontal stream regulating ring 63 has a peripheral portion which is fixed to the plating bath 50, and the vertical stream regulating ring 62 is connected to the horizontal stream regulating ring 63.

On the other hand, head 47 comprises a housing 70 which is a rotatable and cylindrical receptacle having a downwardly open end and openings 94 on a circumferential wall thereof, and vertically movable pressing rods 242 having, at their lower ends, a pressing ring 240. As shown in FIGS. 11 and 12, an inwardly projecting ring-shaped substrate holding member 72 is provided at a lower end of the housing 70. A ring-shaped sealing member 244 is mounted on the substrate holding member 72. The ring-shaped sealing member 244 projects inwardly, and a front end of a top surface of the ring-shaped sealing member 244 projects upwardly in an annular tapered form. Further, contacts 76 for a cathode electrode are disposed above the sealing member 244. Air vent holes 75, which extend outwardly in a horizontal direction and further extend outwardly in an upwardly inclined state, are provided in the substrate holding member 72 at circumferentially equal intervals.

Figure 9:
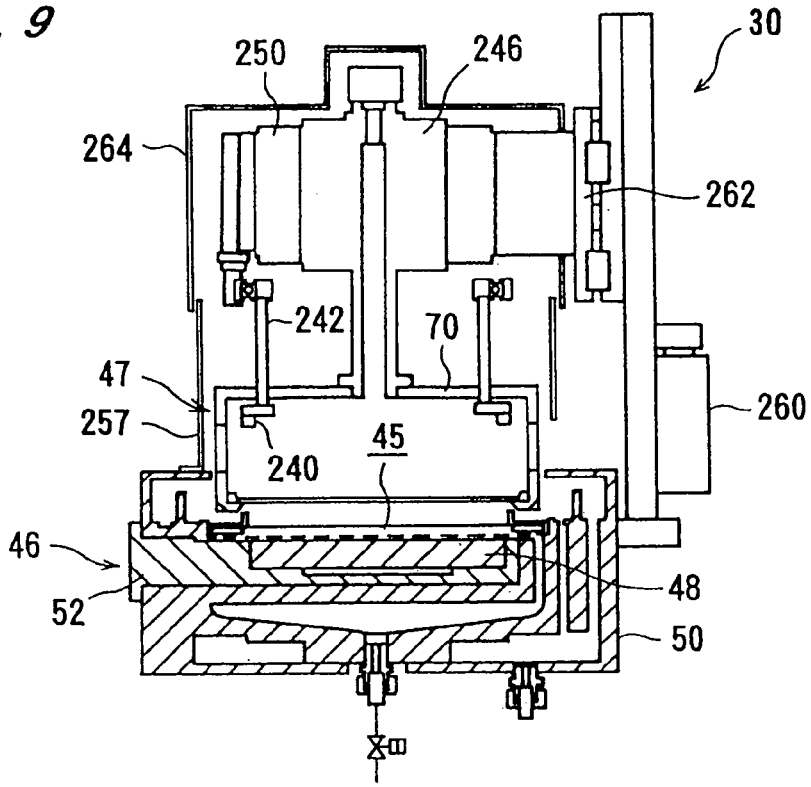
FIG. 9 is a cross-sectional view showing an entire structure of the electroplating apparatus shown in FIG. 7, at a time of not performing a plating process (at a time of transfer of a substrate)

With this arrangement, as shown in FIG. 9, a liquid level of the plating solution is lowered, and as shown in FIGS. 11 and 12, substrate W is held by a robot hand H or the like, and inserted into the housing 70 where the substrate W is placed on an upper surface of the sealing member 244 of the substrate holding member 72. Thereafter, the robot hand H is withdrawn from the housing 70, and the pressing ring 240 is then lowered to sandwich a peripheral portion of the substrate W between the sealing member 244 and a lower surface of the pressing ring 240, thereby holding the substrate W. In addition, upon holding of the substrate W, a lower surface of the substrate W is brought into pressure contact with the sealing member 244 to seal this contact portion positively. At the same time, current flows between the substrate W and the contacts 76 for the cathode electrode.

Returning to FIG. 7, the housing 70 is connected to an output shaft 248 of a motor 246, and rotated by energization of the motor 246. The pressing rods 242 are vertically provided at predetermined positions along a circumferential direction of a ring-shaped support frame 258 rotatably mounted through a bearing 256 on a lower end of a slider 254. The slider 254 is vertically movable by actuation of a cylinder 252, with a guide, fixed to a support 250 surrounding the motor 246. With this construction, the pressing rods 242 are vertically movable by actuation of the cylinder 252, and, in addition, upon holding of the substrate W, the pressing rods 242 are rotated integrally with the housing 70.

The support 250 is mounted on a slide base 262 which is engaged with a ball screw 261 and vertically movable by the ball screw 261, which is rotated by energization of a motor 260. The support 250 is surrounded by an upper housing 264, and is vertically movable together with the upper housing 264 by energization of the motor 260. Further, a lower housing 257 for surrounding the housing 70 during plating is mounted on an upper surface of the plating container 50.

Figure 10:
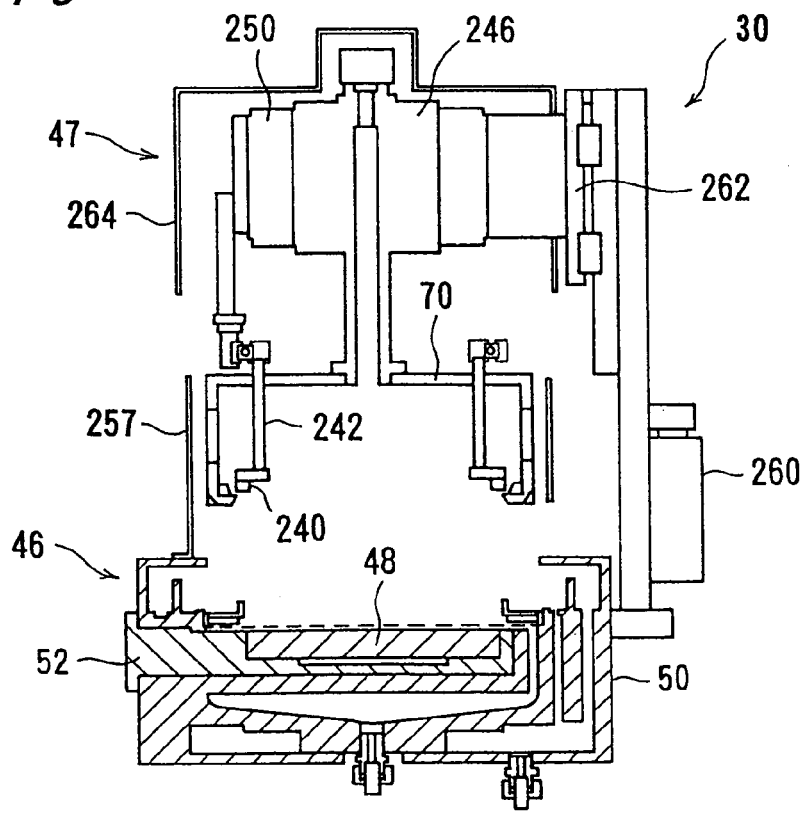
FIG. 10 is a cross-sectional view showing an entire structure of the electroplating apparatus shown in FIG. 7, at a time of maintenance.

With this construction, as shown in FIG. 10, maintenance can be performed in such a state that the support 250 and the upper housing 264 are raised. A crystal of plating solution is likely to be deposited on an inner circumferential surface of the weir member 58. However, when the support 250 and the upper housing 264 are raised, a large amount of the plating solution is flowed and overflows the weir member 58, and hence the crystal of the plating solution is prevented from being deposited on the inner circumferential surface of the weir member 58. A cover 50b for preventing splashing of the plating solution is integrally provided with the plating bath 50 to cover a portion above the plating solution which overflows during a plating process. By coating an ultra-water-repellent material such as HIREC (manufactured by NTT Advance Technology) onto a lower surface of the cover 50b, for preventing splashing of the plating solution, the crystal of the plating solution can be prevented from being deposited onto the lower surface of the cover 50b.

Figure 14:
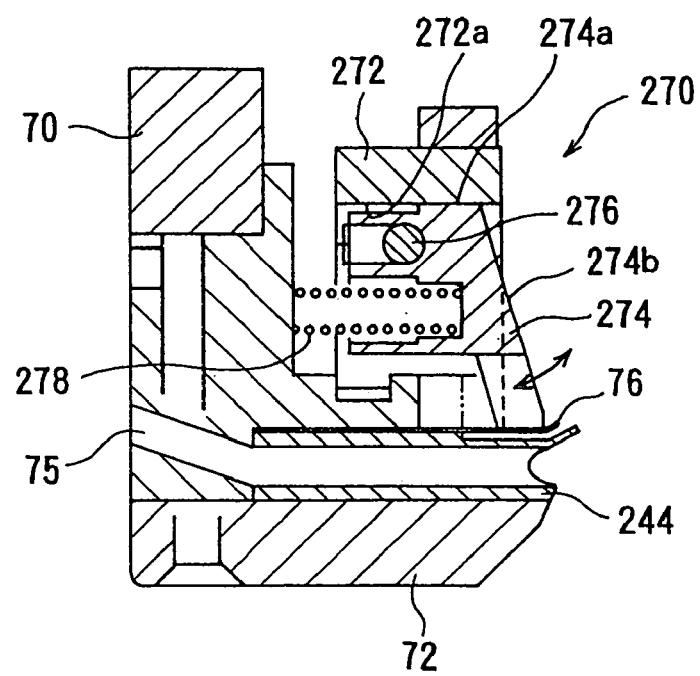
FIG. 14 is an enlarged cross-sectional view showing a centering mechanism of the electroplating apparatus shown in FIG. 7.

Substrate centering mechanisms 270, located above the substrate holding member 72 of the housing 70 for performing centering of substrate W are provided at four places along a circumferential direction in this embodiment. FIG. 14 shows one of the substrate centering mechanism 270 in detail. Each substrate centering mechanism 270 comprises a gate-like bracket 272 fixed to the housing 70, and a positioning block 274 disposed within the bracket 272. This positioning block 274 is swingably mounted through a support shaft 276 that is horizontally fixed to the bracket 272. Further, a compression coil spring 278 is interposed between the housing 70 and the positioning block 274. Thus, the positioning block 274 is urged by the compression coil spring 278 so that the positioning block 274 rotates about the support shaft 276 and a lower portion of the positioning block 274 projects inwardly. An upper surface 274a of the positioning block 274 serves as a stopper, and is brought into connect with a lower surface 272a of the bracket 272 to restrict movement of the positioning block 274. Further, the positioning block 274 has a tapered inner surface 274b which is widened outwardly in an upward direction.

With this construction, a substrate is held by a hand of a transfer robot or the like, is carried into the housing 70, and is placed onto the substrate holding member 72. In this case, when a center of the substrate deviates from a center of the substrate holding member 72, the positioning block 274 is rotated outwardly against an urging force of the compression coil spring 278 and, upon release of holding of the substrate by the hand of the transfer robot or the like, the positioning block 274 is returned to an original position by the urging force of the compression coil spring 278. Thus, centering of the substrate can be carried out.

Figure 15:
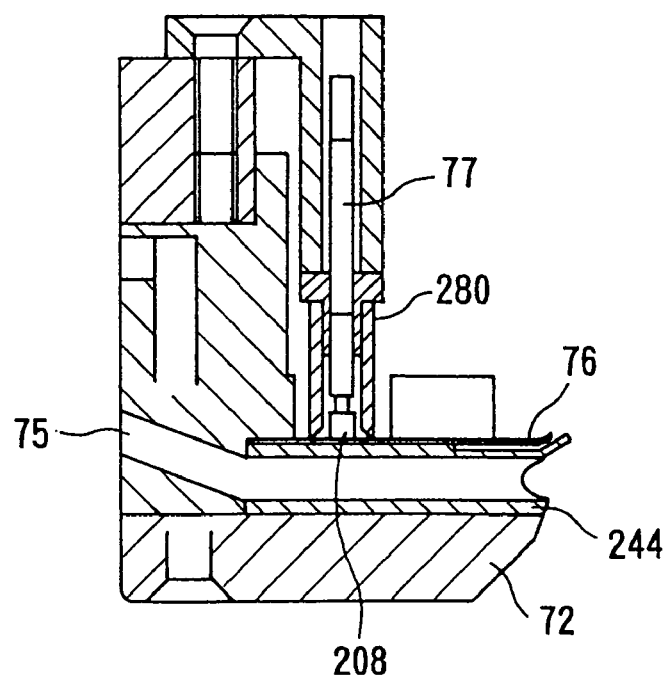
FIG. 15 is a cross-sectional view showing a feeding contact (probe) of the electroplating apparatus shown in FIG. 7.

FIG. 15 shows a feeding contact (a probe) 77 for feeding power to a cathode electrode plate 208 of a contact 76 for a cathode electrode. This feeding contact 77 is composed of a plunger and is surrounded by a cylindrical protective member 280 extending to the cathode electrode plate 208, whereby the feeding contact 77 is protected against a plating solution.

A plating operation of the first plating unit (electroplating device) 30 will now be described.

First, when transferring a substrate W to the plating unit 30, an attracting hand of the transfer robot 28b, shown in FIGS. 4 and 5, and the substrate W attracted and held by the hand with its front surface facing downwardly, are inserted into the housing 70 through an opening 94, and the attracting hand is then moved downwardly. Thereafter, vacuum attraction is released to place the substrate W on the substrate holder 72. The attracting hand is then moved upwardly and withdrawn from the housing 70. Thereafter, the pressure ring 240 is lowered to a peripheral portion of the substrate W so as to hold the substrate W between the substrate holder 72 and the lower surface of the pressure ring 240.

Plating solution 45 is then jetted from the plating solution jet nozzles 53 while, at the same time, the housing 70 and the substrate W held by it are allowed to rotate at a middle speed. When the plating bath is charged with a predetermined amount of plating solution 45, and further after an elapse of several seconds, a rotational speed of the housing 70 is decreased to a slow rotation (e.g. 100 rev/min). Then, electroplating is carried out by passing an electric current between the anode 48 and a plating surface of the substrate as a cathode.

After application of the electric current, as shown in FIG. 13D, feed of the plating solution is decreased so that the plating solution is allowed to flow out only through the through hole 224, for liquid level control, positioned above the plating solution jet nozzles 53, thereby exposing the housing 70, together with the substrate W held by it, above a surface of the plating solution. The housing 70 and the substrate W, positioned above this solution surface, are allowed to rotate at a high speed (e.g. 500-800 rev/min) to drain off the plating solution by action of centrifugal force. After completion of this draining, rotation of the housing 70 is stopped so that the housing 70 stops facing a predetermined direction.

After the housing 70 comes to a complete stop, the pressure ring 240 is moved upwardly. Thereafter, the attracting hand of the transfer robot 28b is inserted, with its attracting face facing downwardly, into the housing 70 through the opening 94 and is then lowered to a position at which the attracting hand can attract the substrate. After attracting the substrate by vacuum attraction, the attracting hand is moved upwardly to a position of the opening 94 of the housing 70, and is withdrawn, together with the substrate held by the hand, through the opening 94.

According to the plating unit 30, the head 47 can be designed to be compact and structurally simple. Further, plating can be carried out when a surface of the plating solution 45 in the plating treatment bath 46 is at a plating level, and draining and transfer of the substrate can be conducted when a surface of the plating solution is at a substrate-transfer level. Moreover, black film formed on the surface of the anode 48 can be prevented from being dried and oxidized.

Figure 16:
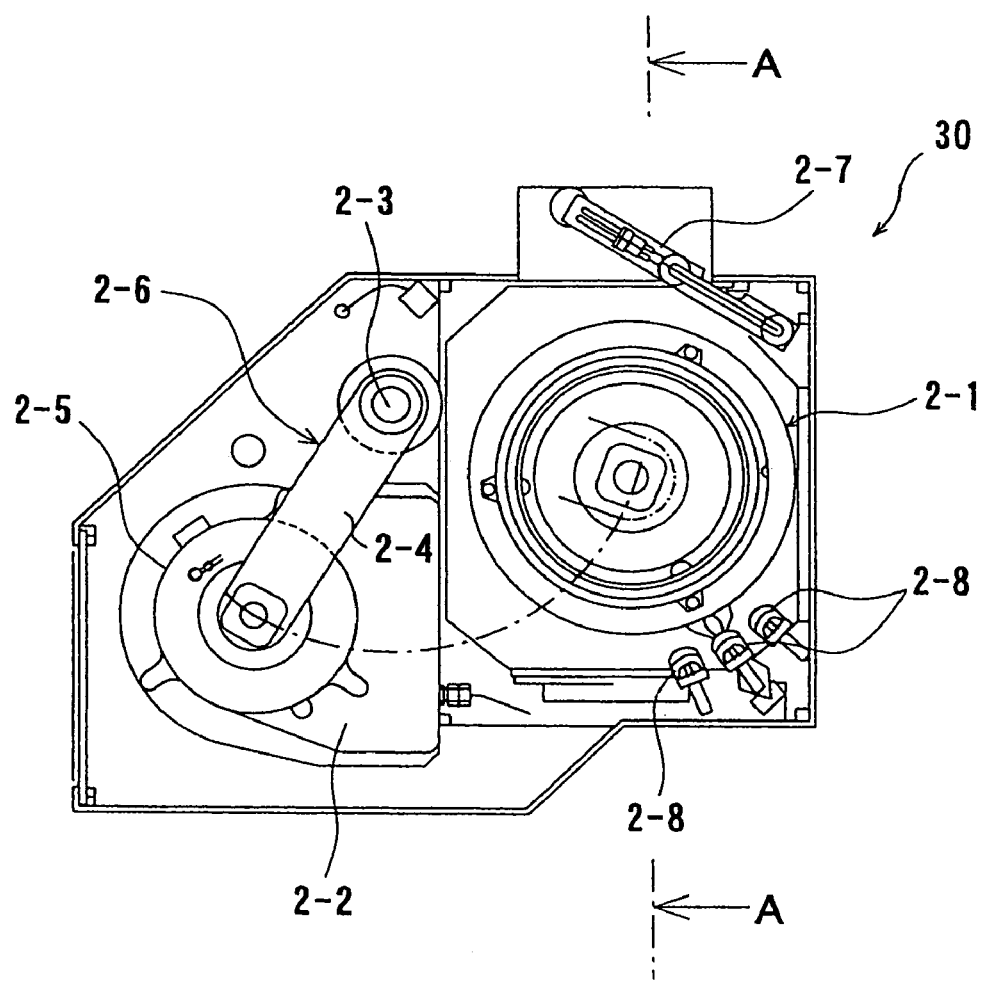
FIG. 16 is a plan view showing another example of an electroplating apparatus as a first plating unit.

FIGS. 16 through 21 show an electroplating apparatus for forming the first plating unit 30. The plating apparatus (electroplating apparatus) 30, as shown in FIG. 16, is provided with a substrate treatment section 2-1 for performing a plating treatment and its attendant treatment, and a plating solution tray 2-2 for storing a plating solution is disposed adjacent to the substrate treatment section 2-1.

There is also provided an electrode arm portion 2-6 having an electrode portion 2-5 which is held at a front end of an arm 2-4 swingable about a rotating shaft 2-3, and which is swung between the substrate treatment section 2-1 and the plating solution tray 2-2.

Furthermore, a pre-coating and recovery arm 2-7, and fixed nozzles 2-8 for ejecting pure water or a chemical liquid such as ion water, and also a gas or the like toward a substrate, are disposed laterally of the substrate treatment section 2-1. In this case, three of the fixed nozzles 2-8 are disposed, and one of them is used for supplying pure water. The substrate treatment section 2-1, as shown in FIGS. 17 and 18, has a substrate holding portion 2-9 for holding a substrate W with its surface to be plated facing upwardly, and a cathode portion 2-10 located above the substrate holding portion 2-9 so as to surround a peripheral portion of the substrate holding portion 2-9. Further, a substantially cylindrical bottomed cup 2-11 surrounding a periphery of the substrate holding portion 2-9, for preventing scatter of various chemical liquids used during treatment, is provided so as to be vertically movable by an air cylinder 2-12.

The substrate holding portion 2-9 is adapted to be raised and lowered by the air cylinder 2-12 to and from a lower substrate transfer position A, an upper plating position B, and a pretreatment and cleaning position C that is intermediate positions A and B. The substrate holding portion 2-9 is also adapted to rotate, at an arbitrary acceleration and an arbitrary velocity, integrally with the cathode portion 2-10 by a rotating motor 2-14 and a belt 2-15. A substrate carry-in and carry-out opening (not shown) is provided in confrontation with substrate transfer position A in a frame side surface of the electroplating apparatus facing the transferring robot 28a (see FIGS. 4 and 5). When the substrate holding portion 2-9 is raised to plating position B, a seal member 2-16 and a cathode electrode 2-17 of the cathode portion 2-10 are brought into contact with a peripheral edge portion of substrate W held by the substrate holding portion 2-9. On the other hand, the cup 2-11 has an upper end located below the substrate carry-in and carry-out opening, and when the cup 2-11 ascends, the upper end of the cup 2-11 reaches a position above the cathode portion 2-10, as shown by imaginary lines in FIG. 18.

When the substrate holding portion 2-9 has ascended to plating position B, the cathode electrode 2-17 is pressed against the peripheral edge portion of the semiconductor substrate W held by the substrate holding portion 2-9 for thereby allowing electric current to pass through the semiconductor substrate W. At the same time, an inner peripheral end portion of the seal member 2-16 is brought into contact with an upper surface of the peripheral edge of the semiconductor substrate W under pressure to seal its contact portion in a water-tight manner. As a result, the plating solution supplied onto the upper surface of the semiconductor substrate W is prevented from seeping from an end portion of the semiconductor substrate W, and the plating solution is prevented from contaminating the cathode electrode 2-17.

Figure 19:
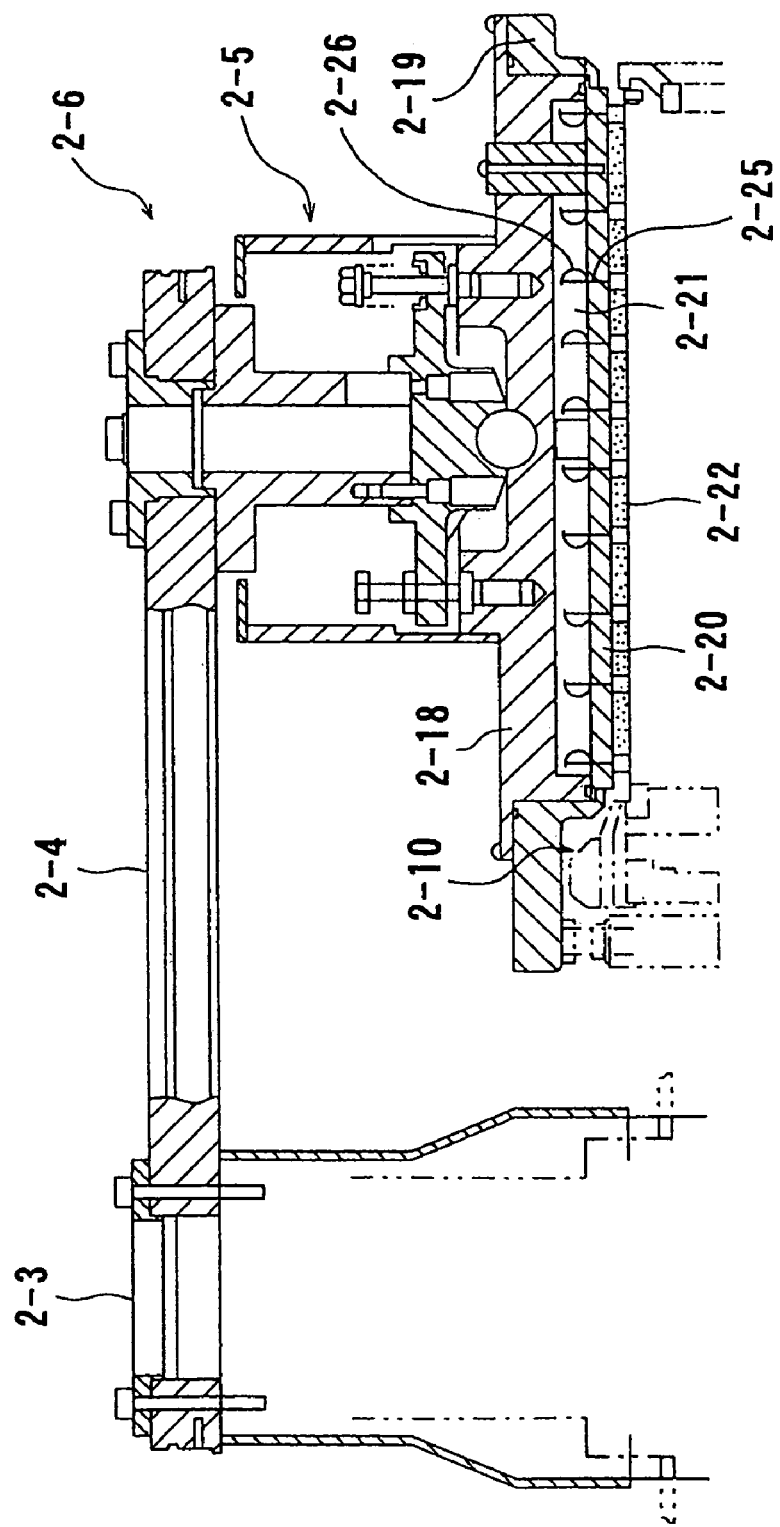
FIG. 19 is a cross-sectional view of an electrode arm portion of the electroplating apparatus shown in FIG. 16.
Figure 20:
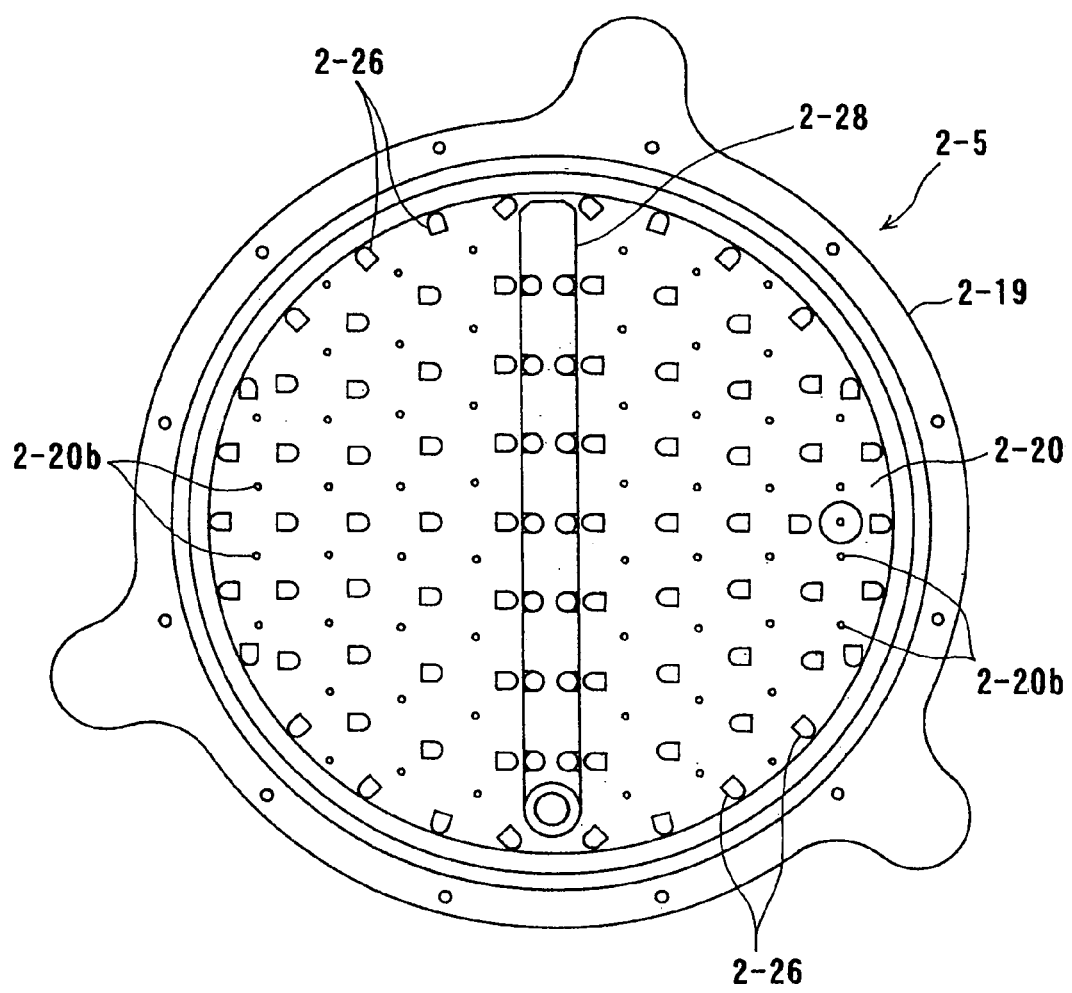
FIG. 20 is a plan view showing the electrode arm portion, from which a housing is removed, of the electroplating apparatus shown in FIG. 16.

As shown in FIG. 19, an electrode portion 2-5 of the electrode arm portion 2-6 has a housing 2-18 at a free end of a swing arm 2-4, a hollow support frame 2-19 surrounding the housing 2-18, and an anode 2-20 fixed by holding a peripheral edge portion of the anode 2-20 between the housing 2-18 and the support frame 2-19. The anode 2-20 covers an opening portion of the housing 2-18, and a suction chamber 2-21 is formed inside the housing 2-18. Further, as shown in FIGS. 20 and 21, a plating solution introduction pipe 2-28, and a plating solution discharge pipe (not shown), for introducing and discharging plating solution are connected to the suction chamber 2-21. Further, many passage holes 2-20b communicating with regions above and below the anode 2-20 are provided over an entire surface of the anode 2-20.

In this embodiment, a plating solution impregnated material 2-22 comprising a water retaining material and covering the entire surface of the anode 2-20 is attached to a lower surface of the anode 2-20. The plating solution impregnated material 2-22 is impregnated with plating solution to wet a surface of the anode 2-20, thereby preventing a black film from falling onto a plated surface of the substrate, and simultaneously facilitating escape of air to an exterior when plating solution is poured between a surface, to be plated, of the substrate and the anode 2-20. The plating solution impregnated material 2-22 comprises, for example, a woven fabric, nonwoven fabric, or sponge-like structure comprising at least one material of polyethylene, polypropylene, polyester, polyvinyl chloride, Teflon, polyvinyl alcohol, polyurethane, and derivatives of these materials, or comprises a porous ceramics.

Attachment of the plating solution impregnated material 2-22 to the anode 2-20 is performed in the following manner: That is, many fixing pins 2-25 each having a head portion at a lower end thereof are arranged such that the head portion is provided in the plating solution impregnated material 2-22 so as not to be releasable upwardly and a shaft portion of the fixing pin 2-25 pierces an interior of the anode 2-20, and the fixing pins 2-25 are urged upwardly by U-shaped leaf springs 2-26, whereby the plating solution impregnated material 2-22 is brought into close contact with the lower surface of the anode 2-20 by a resilient force of the leaf springs 2-26 and is attached to the anode 2-20. With this arrangement, even when a thickness of the anode 2-20 gradually decreases with progress of plating, the plating solution impregnated material 2-22 can be reliably brought into close contact with the lower surface of the anode 2-20. Thus, air can be prevented from entering between the lower surface of the anode 2-20 and the plating solution impregnated material 2-22, which would otherwise cause poor plating.

Incidentally, columnar pins made of PVC (polyvinyl chloride) or PET (polyethylene terephthalate) and having a diameter of, for example, about 2 mm may be arranged from an upper surface side of the anode so as to pierce the anode, and an adhesive may be applied to a front end surface of each of the pins projecting from a lower surface of the anode to fix the anode to the plating solution impregnated material. The anode and the plating solution impregnated material may be used in contact with each other, but it is also possible to provide a gap between the anode and the plating solution impregnated material, and perform a plating treatment while holding plating solution in the gap. This gap is at most 20 mm, but is preferably selected from a range of 0.1 to 10 mm, and more preferably 1 to 7 mm. Particularly, when a soluble anode is used, the anode is dissolved from its lower portion. Thus, as time passes, a gap between the anode and the plating solution impregnated material enlarges and forms a gap in a range of 0 to about 20 mm.

The electrode portion 2-5 descends to such a degree that when the substrate holding portion 2-9 is located at plating position B (see FIG. 18), a gap between a substrate W held by the substrate holding portion 2-9 and the plating solution impregnated material 2-22 reaches about 0.1 to 10 mm, preferably 0.3 to 3 mm, and more preferably about 0.5 to 1 mm. In this state, plating solution is supplied from a plating solution supply pipe to be filled between an upper surface (surface to be plated) of the substrate W and the anode 2-20, while the plating solution impregnated material 2-22 is impregnated with the plating solution. The surface, to be plated, of the substrate W is plated by applying a voltage from a power source to between the upper surface (surface to be plated) of the substrate W and the anode 2-20.

The plating treatment performed in the plating unit (electroplating apparatus) 30 will now be described.

First, a substrate W is transferred by the transfer robot 28b (see FIGS. 4 and 5) to the substrate holder 2-9 in substrate-transfer position A and placed on the substrate holder 2-9. The cup 2-11 is then raised and, at the same time, the substrate holder 2-9 is raised to pretreatment/cleaning position C. The pre-coating/recovering arm 2-7 in a retreat position is moved to a position where the pre-coating/recovering arm 2-7 faces the substrate W, and a pre-coating solution, comprising a surfactant, is intermittently ejected from a pre-coating nozzle, provided at an end of the pre-coating/recovering arm 2-7, onto a plating surface of the substrate W. Pre-coating is performed while rotating the substrate holder 2-9, so that a pre-coating solution can spread over an entire surface of the substrate W. After completion of the pre-coating, the pre-coating/recovering arm 2-7 is returned to the retreat position, and a rotational speed of the substrate holder 2-9 is increased to scatter, by centrifugal force, the pre-coating solution on the plating surface of the substrate W to thereby dry the substrate.

Subsequently, the electrode arm section 2-6 is swung horizontally so that the electrode portion 2-5 moves from above the plating solution tray 2-2 to above a position for plating, and then the electrode portion 2-5 is lowered toward the cathode portion 2-10. After the electrode portion 2-5 has reached the plating position, a plating voltage is applied between the anode 2-20 and the cathode portion 2-10, while a plating solution is fed into the electrode portion 2-5 and supplied to the plating solution impregnated material 2-22 through a plating solution supply slot penetrating the anode 2-20. At this time, the plating solution impregnated material 2-22 is not in contact with, but is close to, the plating surface of the substrate W, i.e. generally spaced therefrom by a distance of about 0.1 to 10 mm, preferably about 0.3 to 3 mm, more preferably about 0.5 to 1 mm.

When supply of the plating solution is continued, the plating solution containing copper ions, oozing out of the plating solution impregnated material 2-22, comes to fill an interstice between the plating solution impregnated material 2-22 and the plating surface of the substrate W, whereupon Cu plating of the plating surface of the substrate W starts. At this time, the substrate holder 2-9 may be rotated at a low speed.

After completion of this plating treatment, the electrode arm section 2-6 is raised and then swung so that the electrode portion 2-5 is returned to above the plating solution tray 2-2, and the electrode portion 2-5 is then lowered to a normal position. Next, the pre-coating/recovering arm 2-7 is moved from a retreat position to a position where the arm faces the substrate W. The arm 2-7 is then lowered, and plating solution remaining on the substrate W is recovered through a plating solution-recovering nozzle (not shown). After completion of this recovery of the remaining plating solution, the pre-coating/recovering arm 2-7 is returned to the retreat position. Thereafter, pure water is ejected toward a center of the substrate W and, at the same time, the substrate holder 2-9 is rotated at a high speed, thereby replacing the plating solution on the surface of the substrate W with pure water.

After this rinsing treatment, the substrate holder 2-9 is lowered from plating position B to pretreatment/cleaning position C, where water-washing of the substrate is performed by supplying pure water from the fixed nozzle 2-8 while rotating the substrate holder 2-9 and the cathode portion 2-10. During this treatment, the sealing member 2-16 and the cathode electrode 2-17 can also be cleaned, simultaneously with the substrate W, by pure water supplied directly to the cathode portion 2-10 or by pure water scattered from the surface of the substrate W.

After completion of this water-washing, supply of pure water from the fixed nozzle 2-8 is stopped, and a rotational speed of the substrate holder 2-9 and the cathode portion 2-10 is increased to scatter, by centrifugal force, the pure water on the surface of the substrate W to thereby dry the substrate. Simultaneously therewith, the sealing member 2-16 and the cathode electrode 2-17 can also be dried. After this drying, rotation of the substrate holder 2-9 and the cathode portion 2-10 is stopped, and the substrate holder 2-9 is lowered to substrate-transfer position A.

FIG. 22 shows an electroless plating apparatus comprising a second plating unit 38 which is shown in FIGS. 4 and 5. In this example, the first plating unit 30 is composed of an electroplating apparatus, but the first plating unit 30 may be composed of this second electoroless plating apparatus. This second plating unit (electroless plating apparatus) 38 comprises a holding device 311 for holding a substrate W on its upper surface, a dam member 331 for contacting a peripheral edge portion of a surface to be plated (upper surface) of the substrate W, held by the holding device 311, to seal the peripheral edge portion, and a shower head 341 for supplying a plating solution (an electroless plating solution) to a plating surface of the substrate W having the peripheral edge portion sealed with the dam member 331. The electroless plating apparatus further comprises a cleaning liquid supply device 351, disposed near an upper outer periphery of the holding device 311, for supplying a cleaning liquid to the plating surface of the semiconductor substrate W, a recovery vessel 361 for recovering a discharged cleaning liquid or the like (plating waste liquid), a plating solution recovery nozzle 365 for sucking in and recovering plating solution held on the substrate W, and a motor (rotational drive device) M for rotationally driving the holding device 311.

The holding device 311 has a substrate placing portion 313 on its upper surface for placing and holding the substrate W. The substrate placing portion 313 is adapted to place and fix the substrate W. Specifically, the substrate placing portion 313 has a vacuum attracting mechanism (not shown) for attracting the substrate W on a backside thereof by vacuum suction. A backside heater (heating device) 315, which is planar and heats the plating surface of the substrate W from an underside thereof to keep it warm, is installed on a backside of the substrate placing portion 313. The backside heater 315 is composed of, for example, a rubber heater. The holding device 311 is adapted to be rotated by the motor M and is movable vertically by a lifting device (not shown).

The dam member 331 is cylindrical, has a seal portion 333 provided at a lower portion thereof for sealing the outer peripheral edge of the substrate W, and is installed so as not to move vertically from its illustrated position.

The shower head 341 is of a structure having many nozzles provided at a front end for scattering supplied plating solution in a shower form and supplying it substantially uniformly to the plating surface of the substrate W. The cleaning liquid supply device 351 has a structure for ejecting a cleaning liquid from a nozzle 353.

The plating solution recovery nozzle 365 is adapted to be movable upwardly and downwardly and is swingable, and a front end of the plating solution recovery nozzle 365 is adapted to be lowered inwardly of the dam member 331, located on the upper surface peripheral edge portion of the substrate W, and to suck in plating solution on the substrate W.

Next, an operation of this electroless plating apparatus will be described. First, the holding device 311 is lowered from its illustrated state to provide a gap of a predetermined dimension between the holding device 311 and the dam member 331, and the substrate W is placed on and fixed to the substrate placing portion 313. A 6-inch wafer, an 8-inch wafer, or a 12-inch wafer, for example, is used as the semiconductor substrate W.

Then, the holding device 311 is raised to bring its upper surface into contact with a lower surface of the dam member 331 as illustrated in FIG. 22, and an outer periphery of the substrate W is sealed with the seal portion 333 of the dam member 331. At this time, a surface of the substrate W is in an open state.

Then, the substrate W itself is directly heated by the backside heater 315, while plating solution is ejected from the shower head 341 to pour the plating solution over substantially an entire surface of the substrate W. At this time, the plating solution may be heated to control its temperature. Since the surface of the substrate W is surrounded by the dam member 331, all poured plating solution is held on the surface of the substrate W. An amount of supplied plating solution may be a small amount, which will become about 1 mm thick (about 30 ml) on the surface of the substrate W. A depth of the plating solution held on the surface to be plated may be 10 mm or less, and may be even 1 mm as in this embodiment. If a small amount of supplied plating solution is sufficient, the heating apparatus for heating the plating solution may be of a small size.

If the substrate W itself is adapted to be heated, a temperature of the plating solution requiring great power consumption for heating need not be raised so high. This is preferred, because power consumption can be decreased, and a change in a property of the plating solution can be prevented. Power consumption for heating of the substrate W itself may be small, and an amount of plating solution stored on the substrate W is also small. Thus, heat retention of the substrate W by the backside heater 315 can be performed easily, and a capacity of the backside heater 315 may be small, and thus the apparatus can be made compact. If a device for directly cooling the substrate W itself is used, switching between heating and cooling may be performed during plating to change plating conditions. When plating solution is held on the substrate in a small amount, temperature control can be performed with good sensitivity. The whole unit may comprise a box-like structure, and an atmosphere of an interior of the unit may be controlled at a predetermined temperature in the range of 70-80° C., for example.

The substrate W is instantaneously rotated by the motor M to perform uniform liquid wetting of the surface to be plated, and then plating of the surface to be plated is performed in such a state that the substrate W is in a stationary state. Specifically, the substrate W is rotated at at most 100 rpm for only 1 second to uniformly wet the surface, to be plated, of the substrate W with plating solution. Then, the substrate W is kept stationary, and electroless plating is performed for 1 minute. An instantaneous rotating time is at most 10 seconds at the longest.

After completion of this plating treatment, the front end of the plating solution recovery nozzle 365 is lowered to an area near an inside of the dam member 331 on the peripheral edge portion of the substrate W to suck in plating solution. At this time, if the substrate W is rotated at a rotational speed of, for example, at most 100 rpm, plating solution remaining on the substrate W can be gathered at the portion of the dam member 331 on the peripheral edge portion of the substrate W under centrifugal force, so that recovery of the plating solution can be performed with a good efficiency and a high recovery rate. The holding device 311 is then lowered to separate the substrate W from the dam member 331. The substrate W is started to be rotated, and a cleaning liquid (ultrapure water) is jetted at a plated surface of the substrate W from the nozzle 353 of the cleaning liquid supply device 351 to cool the plated surface, and simultaneously perform dilution and cleaning, thereby stopping an electroless plating reaction. At this time, the cleaning liquid jetted from the nozzle 353 may be supplied to the dam member 331 to perform cleaning of the dam member 331 at the same time. Plating waste solution at this time is recovered into the recovery vessel 361 and discarded.

Plating solution once used is not re-used, but thrown away. As stated above, an amount of the plating solution used in this apparatus can be very small, compared with that in the prior art. Thus, an amount of plating solution which is discarded is small, even without re-use. In some cases, the plating solution recovery nozzle 365 may not be installed, and plating solution which has been used may be recovered as a plating waste solution into the recovery vessel 361, together with a cleaning liquid.

Then, substrate W is rotated at a high speed by the motor M for spin-drying, and then the substrate W is removed from the holding device 311.

Figure 23:
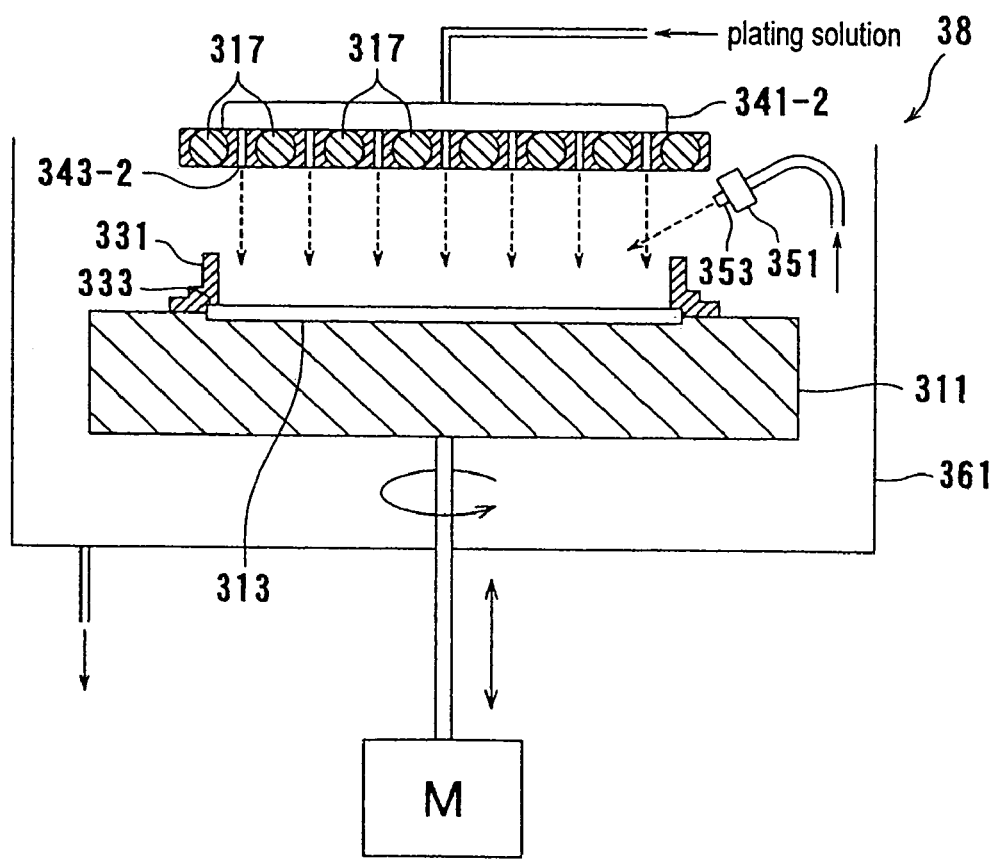
FIG. 23 is a view showing a schematic constitution of another example of an electroless plating apparatus used as a first plating unit and/or a second plating unit.

FIG. 23 is a schematic constitution drawing of another electroless plating apparatus composed of the second plating unit 38 (and the first plating unit 30) shown in FIG. 4. The example of FIG. 23 is different from the aforementioned elecroless plating apparatus shown in FIG. 22 in that instead of providing the backside heater 315 in the holding device 311, lamp heaters 317 are disposed above the holding device 311, and the lamp heaters 317 and a shower head 341-2 are integrated. For example, a plurality of ring-shaped lamp heaters 317 having different radii are provided concentrically, and many nozzles 343-2 of the shower head 341-2 are open in a ring form from gaps between the lamp heaters 317. The lamp heaters 317 may be composed of a single spiral lamp heater, or may be composed of other lamp heaters of various structures and arrangements. A temperature sensor may be installed on a surface of a substrate, thereby a temperature of the substrate may be controlled by turning on and off the lamp heaters.

Even with this constitution, plating solution can be supplied from each nozzle 343-2 to a surface, to be plated, of substrate W substantially uniformly in a shower form. Further, heating and heat retention of the substrate W can be performed by the lamp heaters 317 directly uniformly. The lamp heaters 317 heat not only the substrate W and the plating solution, but also ambient air, thus exhibiting a heat retention effect on the substrate W.

Direct heating of the substrate W by the lamp heaters 317 requires lamp heaters that exhibit relatively large power consumption. In place of such lamp heaters 317, lamp heaters that exhibit relatively small power consumption and the backside heater 315 shown in FIG. 22 may be used in combination to heat the substrate W mainly with the backside heater 315 and to perform heat retention of the plating solution and ambient air mainly by the lamp heaters 317. In the same manner as in the aforementioned embodiment, a device for directly or indirectly cooling the substrate W may be provided to perform temperature control.

Figure 24:
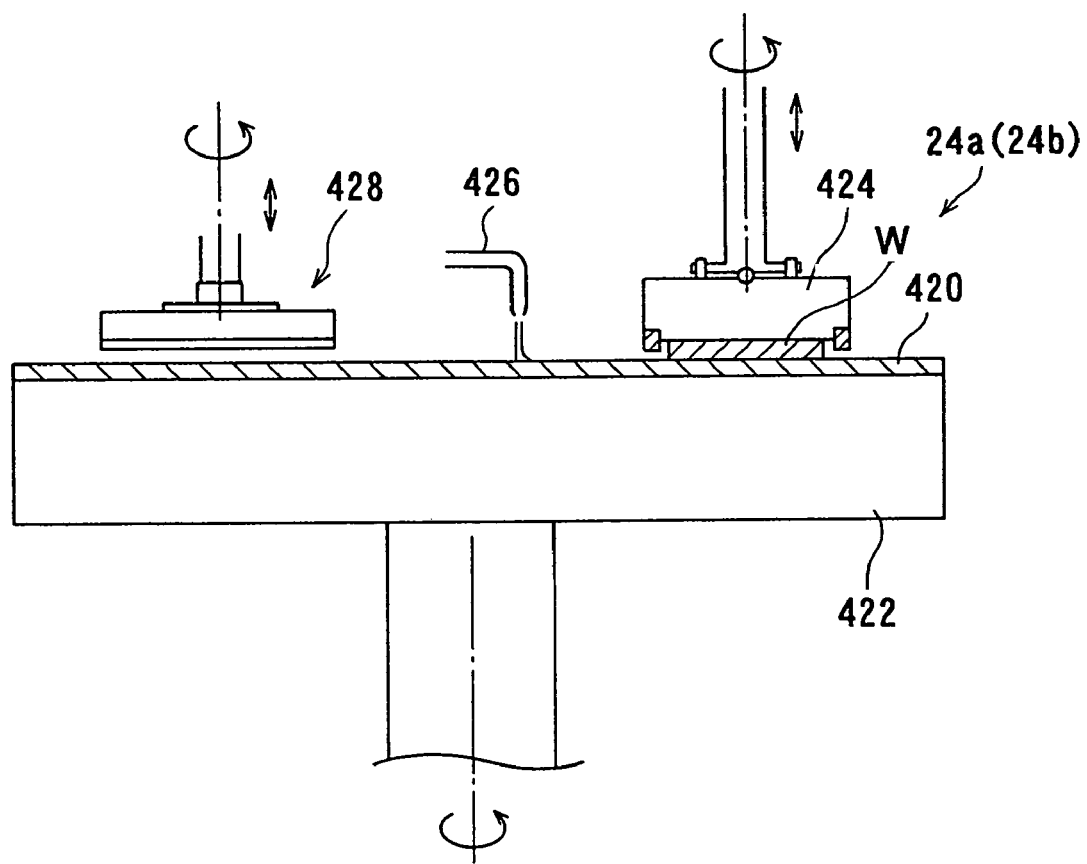
FIG. 24 is a view showing a schematic constitution of an example of a polishing apparatus.

FIG. 24 shows an example of a CMP apparatus for use as the polishing units 24a, 24b shown in FIGS. 4 and 5. The polishing units (CMP devices) 24a, 24b each comprise a polishing table 422 having a polishing surface composed of a polishing cloth (polishing pad) 420 which is attached to an upper surface of the polishing table 422, and a top ring 424 for holding a substrate W with its to-be-polished surface facing the polishing table 422. Polishing of the surface of the substrate W is carried out by rotating the polishing table 422 and the top ring 424 respectively, and supplying an abrasive liquid from an abrasive liquid nozzle 426 provided above the polishing table 422 while pressing the substrate W against the polishing cloth 420 of the polishing table 422 at a given pressure by virtue of the top ring 424. When polishing protective film 20 (see FIG. 2A), CMP processing is carried out by using, as the abrasive liquid supplied from the abrasive liquid supply nozzle 426, a slurry containing an oxidizing agent and abrasive grains, and using as a polishing cloth (polishing pad) 420 a nonwoven fabric, a sponge or a resin material such as foamed polyurethane. The protective film 20 is polished by the abrasive grains in the slurry which have been oxidized by the oxidizing agent. It is possible to use as the polishing pad a fixed-grain type of pad containing fixed abrasive grains.

A polishing power of a polishing surface of the polishing cloth 420 decreases during a continuous polishing operation of the CMP apparatus. In order to restore polishing power, a dresser 428 is provided to conduct dressing of the polishing cloth 420, for example, at a time of changing the substrate W. During dressing, while rotating the dresser 428 and the polishing table 422 respectively, a dressing surface (dressing member) of the dresser 428 is pressed against the polishing cloth 420 of the polishing table 422, thereby removing abrasive liquid and chips adhering to the polishing surface and, at the same time, flattening and dressing the polishing surface, whereby the polishing surface is regenerated. The polishing table 422 may be provided with a monitor for monitoring a surface state of a substrate to detect in situ an end point of polishing, or with a monitor for inspecting in situ a finish state of a substrate.

Figure 25:
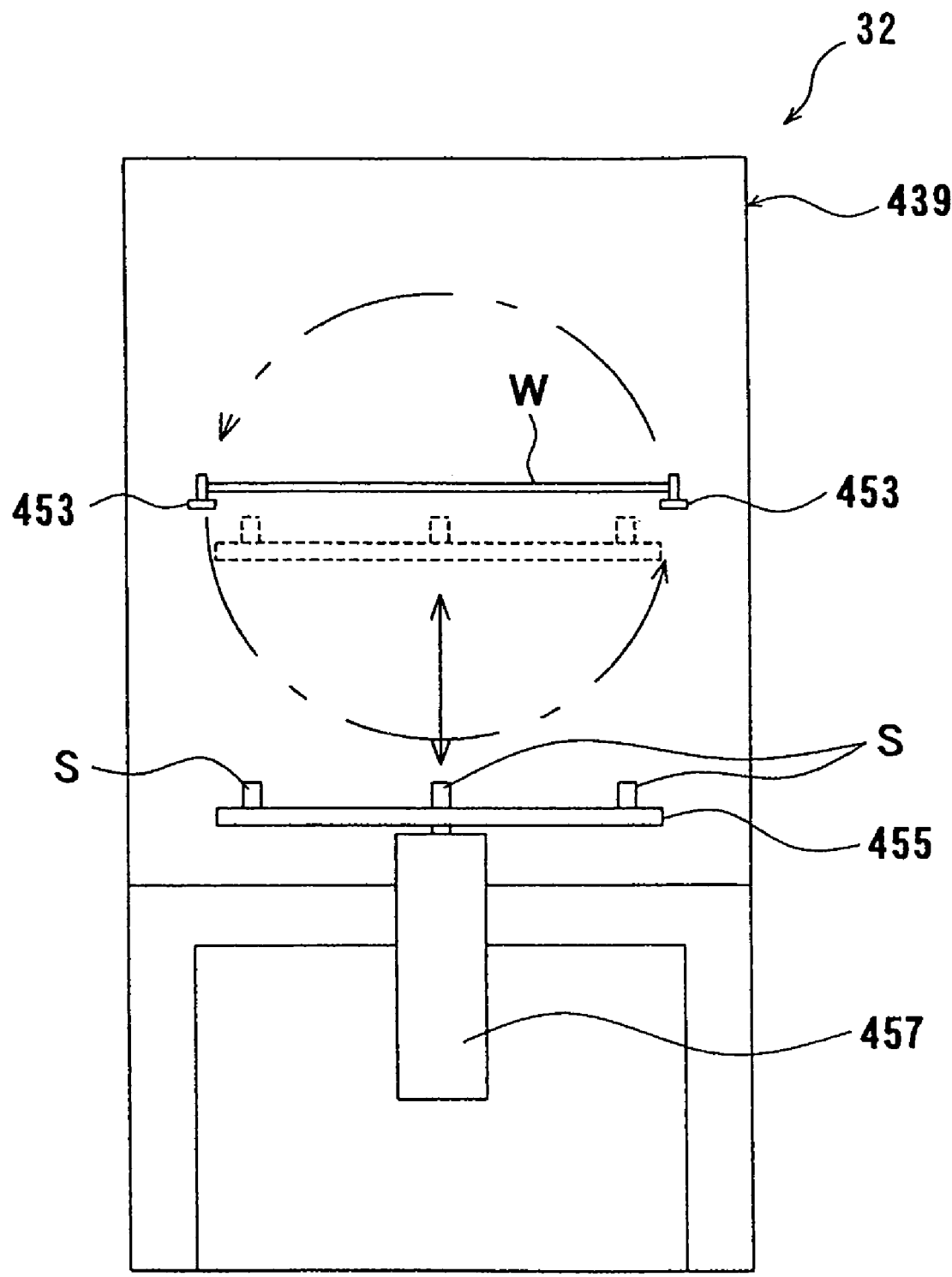
FIG. 25 is a schematic front view of the vicinity of a reversing machine of a copper film thickness inspection unit.

FIGS. 25 and 26 show the copper film thickness inspection unit 32, shown in FIGS. 4 and 5, provided with a reversing machine. As shown in FIG. 25, the copper film thickness inspection unit 32 is provided with a reversing machine 439. The reversing machine 439 includes reversing arms 453, 453. The reversing arms 453, 453 receive a substrate W therebetween and hold its outer periphery from right and left sides, and rotate the substrate W through 180°, thereby turning the substrate over. A circular mounting base 455 is disposed immediately below the reversing arms 453, 453 (reversing stage), and a plurality of film thickness sensors S are provided on the mounting base 455. The mounting base 455 is adapted to be movable upwardly and downwardly by a drive mechanism 457.

During reversing of the substrate W, the mounting base 455 waits at a position, indicated by solid lines, below the substrate W. Before or after reversing, the mounting base 455 is raised to a position indicated by dotted lines to bring the film thickness sensors S close to the substrate W gripped by the reversing arms 453, 453, thereby measuring film thickness.

According to this example, since there is no restriction such as arms of a transfer robot, the film thickness sensors S can be installed at arbitrary positions on the mounting base 455. Further, the mounting base 455 is adapted to be movable upwardly and downwardly, so that a distance between the substrate W and the sensors S can be adjusted at a time of measurement. It is also possible to mount plural types of sensors suitable for a purpose of detection, and change a distance between the substrate W and these sensors each time measurements are made by respective sensors. However, the mounting base 455 moves upwardly and downwardly, thus requiring a certain measuring time.

An eddy current sensor, for example, may be used as film thickness sensor S. The eddy current sensor measures a film thickness by generating an eddy current and detecting a frequency or loss of current that has returned through a substrate W, and is used in a non-contact manner. An optical sensor may also be suitable for film thickness sensor S. The optical sensor irradiates a light onto a sample, and measures a film thickness directly based on information of reflected light. The optical sensor can measure a film thickness not only for a metal film but also for an insulating film such as an oxide film. Places for setting the film thickness sensors S are not limited to those shown in the drawings, but these sensors may be set at any desired places for measurement in any desired numbers.

FIG. 27 is a schematic view of the cleaning unit 39 shown in FIGS. 4 and 5. The cleaning unit 39, which is a scrub cleaning unit, includes a plurality of rollers 9-1 for holding and rotating a substrate W in a horizontal plane, a pair of sponge rolls 9-2, 9-2 made of PVA, and a cleaning liquid nozzle 9-4 for jetting a cleaning liquid. While holding and rotating the substrate W by the rollers 9-1 and jetting a cleaning liquid from the cleaning liquid nozzle 9-4 toward front and back surfaces of the substrate W, the front and back surfaces of the substrate W are scrubbed with the sponge rolls 9-2, 9-2. As the cleaning liquid to be jetted from the cleaning liquid nozzle 9-4 an alkaline surfactant, such as CS-10 (Wako Pure Chemical Industries, Ltd.) and KS-3700 (Kao Corporation) may be used. The use of such a surfactant can facilitate cleaning of the surface of the substrate so that copper contamination on the insulating film 2 shown in FIG. 1C is reduced to at most $10^5$ atoms/cm$^2$.

Figure 28:
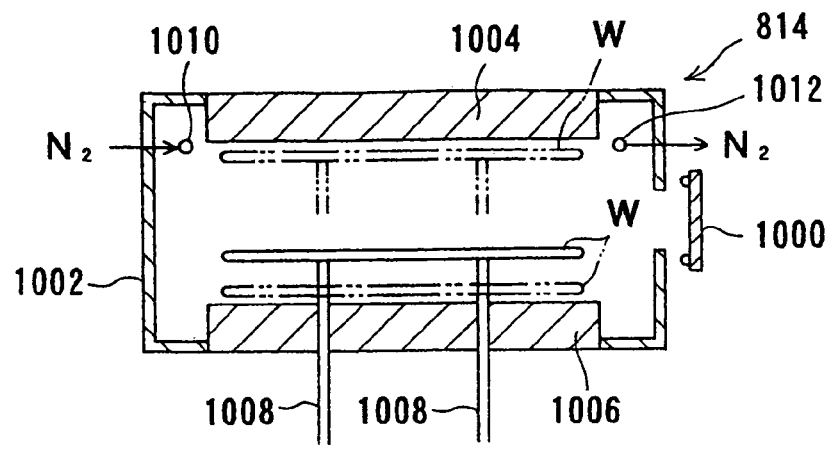
FIG. 28 is a vertical sectional view of an example of an annealing unit.
Figure 29:
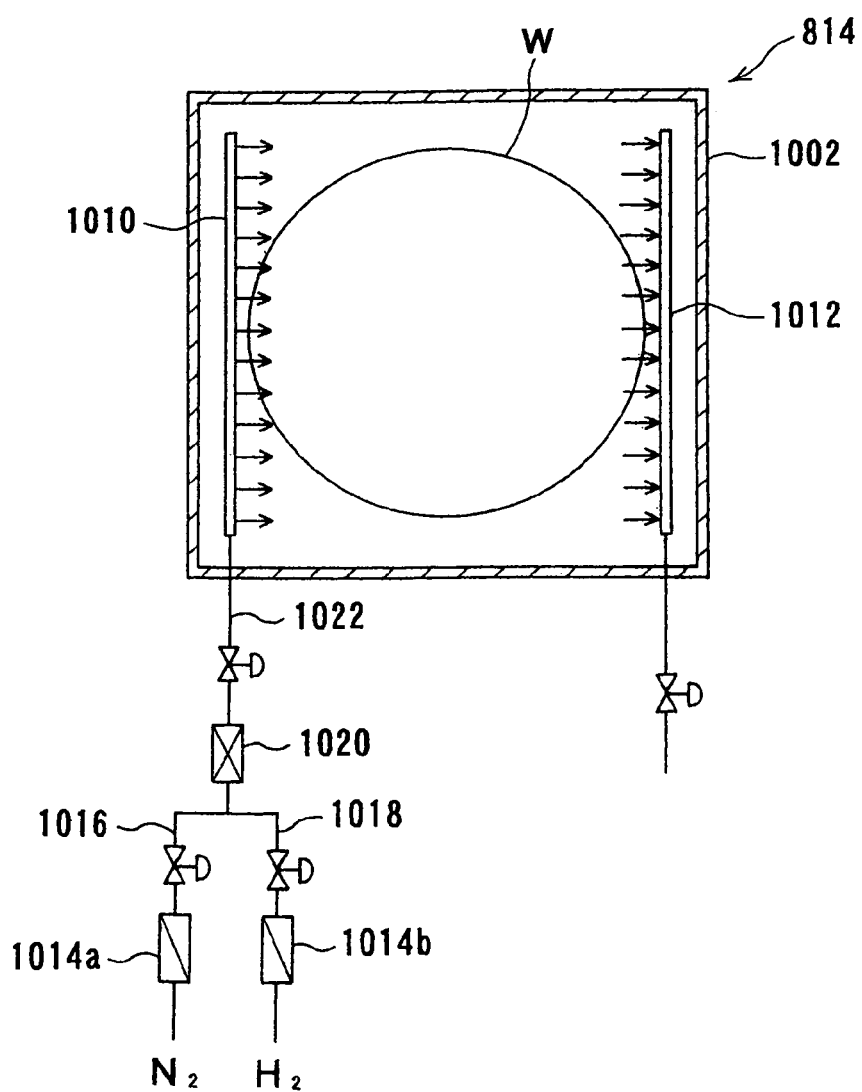
FIG. 29 is a transverse sectional view of FIG. 28.

FIGS. 28 and 29 show the annealing unit 814 shown in FIG. 5. The annealing unit 814 comprises a chamber 1002 having a gate 1000 allowing receipt and removal of semiconductor substrate W, a hot plate 1004 disposed at an upper position in the chamber 1002 for heating the semiconductor substrate W to 400° C., and a cool plate 1006 disposed at a lower position in the chamber 1002 for cooling the semiconductor substrate W by, for example, flowing cooling water inside the cool plate. The annealing unit 814 also has a plurality of vertically movable elevating pins 1008 penetrating the cool plate 1006 and extending upwardly and downwardly therethrough for receiving and holding the semiconductor substrate W thereon. The annealing unit further includes a gas introduction pipe 1010 for introducing an antioxidant gas between the semiconductor substrate W and the hot plate 1004 during annealing, and a gas discharge pipe 1012 for discharging the gas which has been introduced from the gas introduction pipe 1010 and flowed between the semiconductor substrate W and the hot plate 1004. The pipes 1010 and 1012 are disposed on opposite sides of the hot plate 1004.

The gas introduction pipe 1010 is connected to a mixed gas introduction line 1022, which in turn is connected to a mixer 1020 where an $N_2$ gas introduced through an $N_2$ gas introduction line 1016 containing a filter 1014a, and an $H_2$ gas introduced through an $H_2$ gas introduction line 1018 containing a filter 1014b, are mixed to form a mixed gas which flows through the line 1022 into the gas introduction pipe 1010.

In operation, the semiconductor substrate W, which has been carried into the chamber 1002 via the gate 1000, is held on the elevating pins 1008 and the elevating pins 1008 are raised to a position at which a distance between the semiconductor substrate W held on the elevating pins 1008 and the hot plate 1004 becomes 0.1-1.0 mm. In this state, the semiconductor substrate W is then heated to 400° C. through the hot plate 1004 and, at the same time, anti-oxidant gas is introduced from the gas introduction pipe 1010 and the gas is allowed to flow between the semiconductor substrate W and the hot plate 1004 while the gas is discharged from the gas discharge pipe 1012, thereby annealing the semiconductor substrate W while preventing its oxidation. This annealing treatment may be completed in about several seconds to 60 seconds. A heating temperature of the substrate may be selected to be within the range of 100-600° C.

After completion of annealing, the elevating pins 1008 are lowered to a position at which a distance between the semiconductor substrate W held on the elevating pins 1008 and the cool plate 1006 becomes 0-0.5 mm. In this state, by introducing a cooling water into the cool plate 1006, the semiconductor substrate W is cooled by the cool plate 1006 to a temperature of at most 100° C. in 10-60 seconds. This cooled semiconductor substrate is sent to a subsequent step.

A mixed gas of $N_2$ gas with several % of $H_2$ gas is used as the above-mentioned anti-oxidant gas. However, $N_2$ gas may be used singly.

Figure 6:
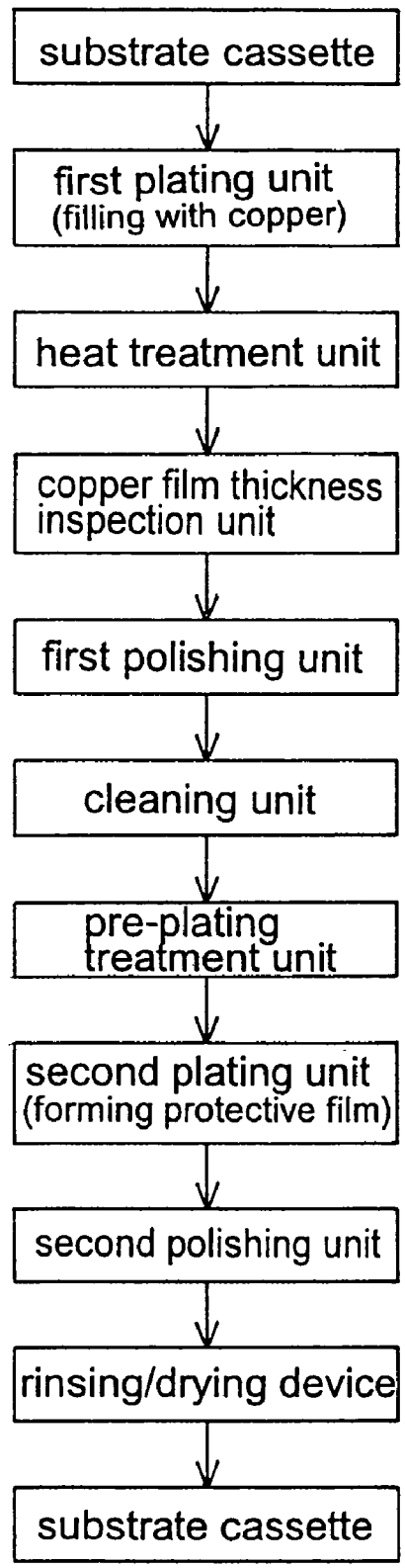
FIG. 6 is a flow diagram of a substrate in the apparatus for manufacturing the semiconductor device show in FIG. 4 or 5.

A series of process steps for forming copper interconnects in the substrate shown in FIG. 1A, having a seed layer 6 on its surface, by virtue of the semiconductor device manufacturing apparatus will now be described with reference to FIG. 6.

First, substrates W each having a seed layer 6 formed as a surface thereof are removed one by one by the transfer robot 28a from the substrate cassettes 26a, 26b, and transferred to the first plating unit 30. In the first plating unit 30, as shown in FIG. 1B, a copper film 7 is deposited onto the surface of the substrate, thereby effecting embedding of copper. Prior to deposition of copper film 7, the substrate W is subjected to a treatment for making the surface hydrophilic. Copper plating is then carried out to deposit the copper film 7. After formation of copper film 7, rinsing or cleaning of the substrate is carried out in the copper plating unit 30. When time permits, drying of the substrate may also be carried out.

In a case of the apparatus provided with the annealing unit 814 shown in FIG. 5, substrate W with copper embedded therein is transferred to the annealing unit 814, where heat treatment (annealing) of copper is carried out.

The substrate W with copper embedded therein, which has undergone heat-treatment (annealing) according to necessity, is transferred to the copper film thickness inspection unit 32, where a film thickness of copper film 7 is measured. After reversing the substrate by virtue of the reversing machine according to necessity, the substrate is transferred by the transfer robot 28b onto the pusher 42 of the first polishing unit 24a.

In the first polishing unit 24a, the substrate W on the pusher 42 is attracted and held by top ring 424, and transferred to above polishing table 422. The top ring 424 is then lowered so as to press a to-be-polished surface of the substrate W against polishing cloth 420 of the rotating polishing table 422 at a given pressure, while an abrasive liquid is supplied onto the substrate, thereby performing polishing of the surface of the substrate W. As a polishing condition, in a case of polishing a copper film 7 formed on the substrate W, a slurry for exclusive use for copper polishing may be used as the abrasive liquid. When the surface to be polished has irregularities, it is known to be effective to perform polishing under conditions of a relatively low pressure and a relatively high rotational speed. Such polishing, however, involves a lowering of a processing rate. It may, therefore, be appropriate to carry out a multi-step polishing, for example a two-step polishing comprising: a first polishing carried out at a top ring pressure of 40 kPa and a top ring rotational speed of 70 rev/min for a certain time; and a second polishing performed at a top ring pressure of 20 kpa and a top ring rotational speed of e.g. 50 rev/min for a certain time. Such a multi-step polishing may achieve flattening of the substrate surface with a good total efficiency.

Polishing is terminated when an end point is detected by a monitor for inspecting a finish of a substrate. This polished substrate W is returned by the top ring 424 onto the pusher 42, where the substrate is cleaned with a spray of pure water. Thereafter, the substrate is transferred by the transfer robot 28b to the cleaning unit 39, where the substrate is cleaned with a sponge roll. Interconnects (copper interconnects) 8 shown in FIG. 1C, consisting of the seed layer 6 and the copper film 7, are thus formed in the insulating film 2. Cleaning should be carried out so that copper contamination on the insulating film 2 shown in FIG. 1C is reduced to at most $5 \times 10^5$ atoms/cm$^2$.

Next, the substrate W is transferred to the pre-plating treatment unit 34, where pre-treatments of the substrate, such as a Pd catalyst-imparting treatment and an oxide film removal treatment, are performed. Such a treated substrate is then transferred to the second plating unit 38. In the second plating unit 38, electroless Co—W—P plating, for example, is performed on the polished surface of the substrate W to thereby form, as shown in FIG. 2A, protective film (plated film) 20 of a Co—W—P alloy selectively on exposed surfaces of copper interconnects 8 to protect the interconnects 8. A thickness of the protective film 20 is generally 0.1 to 500 nm, preferably 1 to 200 nm, more preferably 10 to 100 nm.

After completion of this electroless plating, the substrate W is spin-dried by rotating the substrate at a high speed. Thereafter, the substrate W is removed from the second plating unit 38, and transferred to the second polishing unit 24b via pusher 42. In the second polishing unit 24b, as in the first polishing unit 24a, the substrate W is attracted and held by top ring 424 and transferred to above polishing table 422, and then the top ring 424 is lowered so as to press a to-be-polished surface of the substrate W against polishing cloth 420 of the rotating polishing table 422 at a given pressure, while an abrasive liquid is supplied onto the substrate, thereby performing polishing of the surface of the substrate W. A surface of the protective film 20 is thus flattened by polishing, as shown in FIG. 2B. During this polishing, a slurry containing an oxidizing agent and abrasive grains is used as an abrasive liquid, and a polishing pad of a nonwoven fabric, a sponge or a resin material such as foamed polyurethane, is used. The protective film 20 is polished by the abrasive grains in the slurry which have been oxidized by the oxidizing agent. Polishing may also be performed by using a grinding stone containing abrasive grains.

Polishing is terminated when an end point is detected by a monitor for inspecting a finish of a substrate. This polished substrate W is returned by the top ring 424 onto the pusher 42, where the substrate W is cleaned with a spray of pure water. Thereafter, the substrate W is transferred by the transfer robot 28b to the cleaning unit 39, where the substrate is cleaned with a sponge roll. This cleaned substrate is transferred by the transfer robot 28a to the rinsing/drying device 36. After rinsing and drying the substrate W in the rinsing/drying device 36, the substrate is returned to its original location in the cassette 26a or 26b.

Though this embodiment uses copper as an interconnect material, it is possible to use instead a copper alloy, silver or a silver alloy.

EXAMPLE 1

Substrate W, in which embedded copper interconnects had been formed by the above-described copper plating, followed by CMP processing, was immersed in a solution of $PdCl_2$ (0.005 g/L) and HCl (0.2 ml/L) at 25° C. for one minute to perform a pre-plating treatment to impart palladium to the substrate. After this treatment, a surface of the substrate was cleaned. Thereafter, electroless plating was performed for two minutes, using the electroless plating apparatus shown in FIG. 21 and using an electroless plating solution having the composition shown in Table 1 below, thereby depositing a Co—W—P alloy layer onto the surface of the sample (substrate).

TABLE 1

| | |
|---|---|
| $CoSO_4 \cdot 7H_2O$ (g/L) | 14.1 |
| $Na_2WO_4 \cdot 2H_2O$ (g/L) | 48.0 |
| $Na_3C_6H_5O_7 \cdot 2H_2O$ (g/L) | 88.0 |
| $(NH_4)_2SO_4$ (g/L) | 66.0 |
| $NaH_2PO_2 \cdot H_2O$ (g/L) | 21.2 |
| pH (–) | pH = 10 with NaOH |

Figure 30:
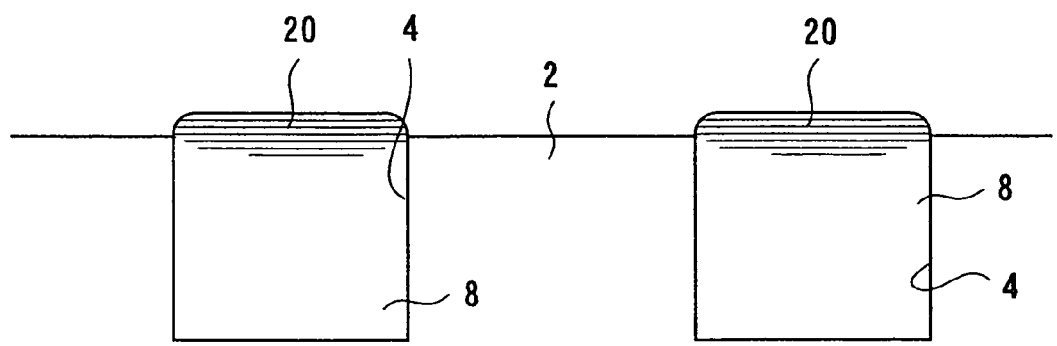
FIG. 30 is a diagram illustrating an SEM photograph of a sample when copper interconnects are protected by a protective film and a surface of the protective film is polished.
Figure 31:
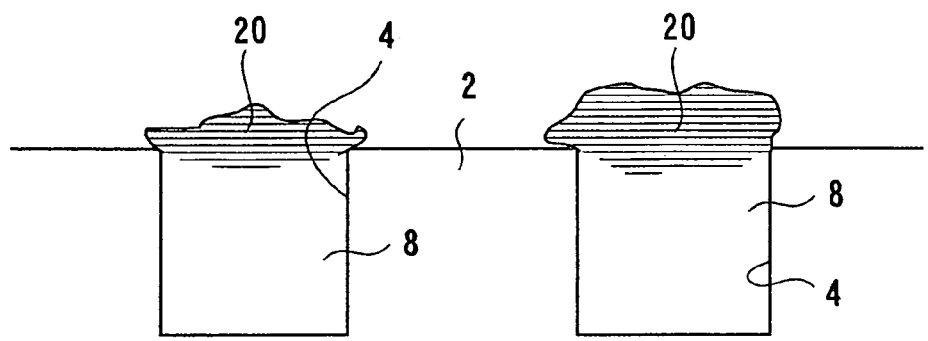
FIG. 31 is a diagram illustrating an SEM photograph of a sample when copper interconnects are protected by a protective film.

After cleaning and drying a surface of this plated sample, polishing of a surface of protective film 20 was performed by using the polishing apparatus shown in FIG. 24, followed by cleaning and drying. This polished sample was observed under an SEM (scanning electron microscope). FIG. 30 shows a diagram illustrating an SEM photograph of the sample. It is apparent from FIG. 30 that the protective film 20 is formed selectively on exposed surfaces of interconnects (copper interconnects) 8 embedded in trenches 4, and that unevenness in film thickness of the protective film 20 is eliminated by polishing the surface of the protective film 20. FIG. 31 shows a diagram illustrating an SEM photograph of the same sample but before polishing of the protective film 20.

As described hereinabove, according to this embodiment, flattening of the protective film 20, for which equalization of film thickness is generally difficult, can eliminate unevenness of the film thickness of the protective film 20, thereby ensuring a sufficient flatness of the surface of an interlayer dielectric film which will be formed upon formation of a multi-layer interconnect structure.

A semiconductor device according to another embodiment of the present invention will now be described with reference to FIGS. 32 and 33. FIG. 33 shows a cross-sectional structure of a semiconductor device having a two-layer embedded interconnect structure. In this embodiment, copper is used as an interconnect material. As shown in FIG. 33, fine recesses 124 have been formed by performing a lithography/etching technique on an insulating film 122 of $SiO_2$ deposited on a surface of a semiconductor base 10. A barrier layer 126 of TaN or the like has then been formed on an entire surface of the insulating film. A first layer of copper interconnects 128 has been formed by embedding copper in the recesses 124. Exposed surfaces of the copper interconnects 128 are selectively covered with an interconnects-protective film 130. Further, all exposed surfaces are then covered with a protective film 132 of SiN or the like. A first-layer interconnect structure has thus been formed.

The copper interconnects 128 can be formed by a process comprising: performing copper plating of a surface of semiconductor substrate W to fill the recesses 124 with copper and, at the same time, deposit copper on the insulating film 122; polishing a surface of the substrate by chemical mechanical polishing (CMP) to remove copper and a barrier layer on the insulating film 122 so as to make a surface of the copper filled in the recesses 124 and a surface of insulating film 122 substantially on the same level.

An insulating film 134 of $SiO_2$ has been deposited on an upper surface of the substrate having the fist-layer interconnect structure. Fine recesses 136, reaching to an interconnects-protective film 130, have been formed in insulating film 134 by performing a lithography/etching technique. A barrier layer 138 has then been formed on all interior surfaces defined by the recesses 136. A second layer of copper interconnects 140 has been formed by embedding copper in the recesses 136. Exposed surfaces of the copper interconnects are selectively covered with an interconnects-protective film 142. Further, all exposed surfaces are then covered with a protective film 144 of SiN or the like. A second-layer interconnect structure has thus been formed. As with the copper interconnects 128, the copper interconnects 140 can be formed by copper plating a surface of the semiconductor substrate W, followed by chemical mechanical polishing (CMP) this copper.

The interconnects-protective films 130, 142, which selectively cover the exposed surfaces of the copper interconnects 128, 140 and protect the interconnects 128, 140, are composed of a Co—W—B alloy having an amorphous phase and are thin films having a thickness of not more than 50 nm, preferably 10-30 nm (20 nm according to this embodiment). The interconnects-protective films 130, 142 having an amorphous phase can be formed by electroless plating. With use of a Co—W—P alloy having an amorphous phase, it becomes possible to form continuous and uniform interconnects-protective films 130, 142, even when the films are as thin as 20 nm, without being influenced by a crystal orientation of underlying copper interconnects 128, 140.

Figure 44:
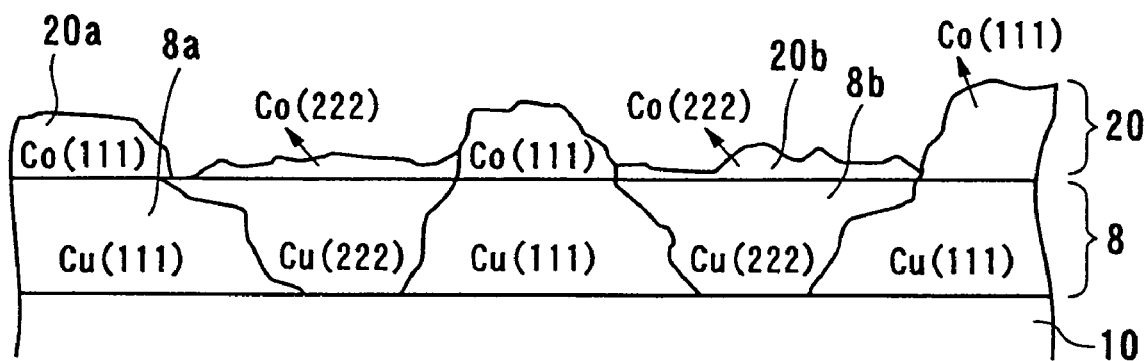
FIG. 44 is a cross-sectional view showing graphically a state in which a thin film composed of an alloy, having a crystalline phase, is formed (epitaxially) on surfaces of copper interconnects.

In this connection, when an interconnects-protective film (thin film) 20 having a crystalline phase is formed on a surface of interconnects (copper interconnects) 8 as shown in FIG. 44, under influence of a crystal orientation of copper interconnects 8, a Co—W—B alloy crystal 20a with plane direction (111) grows (epitaxially) on a copper crystal 8a with plane direction (111), and a Co—W—B alloy crystal 20b with plane direction (222) grows (epitaxially) on a copper crystal 8b with plane direction (222). On the other hand, when an interconnects-protective film (thin film) 20 having an amorphous phase is formed on a surface of copper interconnects 8 as shown in FIG. 32, Co—W—B alloy 20c grows uniformly over copper crystal 8a with plane direction (111) and copper crystal 8b with plane direction (222), without being influenced by a crystal orientation of copper interconnects 8 which are comprised of a polycrystal film having a plurality of crystal orientations. A continuous interconnects-protective film (thin film) 20 having a uniform film thickness can thus be obtained.

By thus selectively covering the surfaces of copper interconnects 128, 140 with uniform and continuous interconnects-protective films (cap material) 130, 142 having an amorphous phase without being influenced by the crystal orientation of the underlying copper interconnects 128, 140, and thereby protecting the copper interconnects 128, 140, a sufficient electromigration resistance can be obtained.

Further, the interconnects-protective films 130, 142 having an amorphous phase, unlike a crystal, has an amorphous structure with no three-dimensional regularity. An alloy of an amorphous structure is generally non-magnetic (non-ferromagnetic). The interconnects-protective films 130, 142 can thus be non-magnetic, which can prevent a semiconductor device from being influenced by magnetism.

Figure 34:
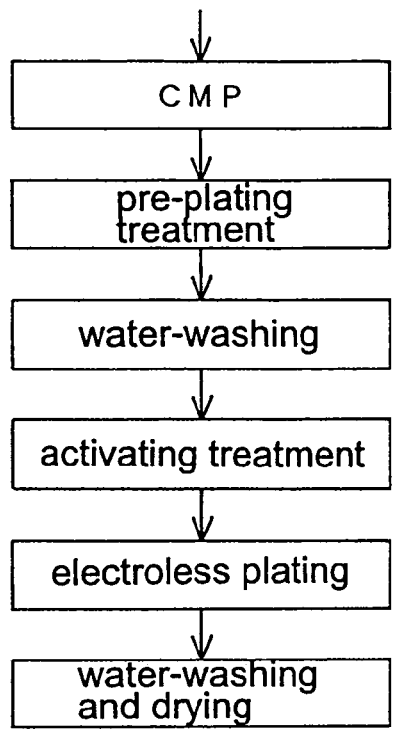
FIG. 34 is a block diagram showing, in a sequence of process steps, another embodiment of a plating method according to the present invention.
Figure 35:
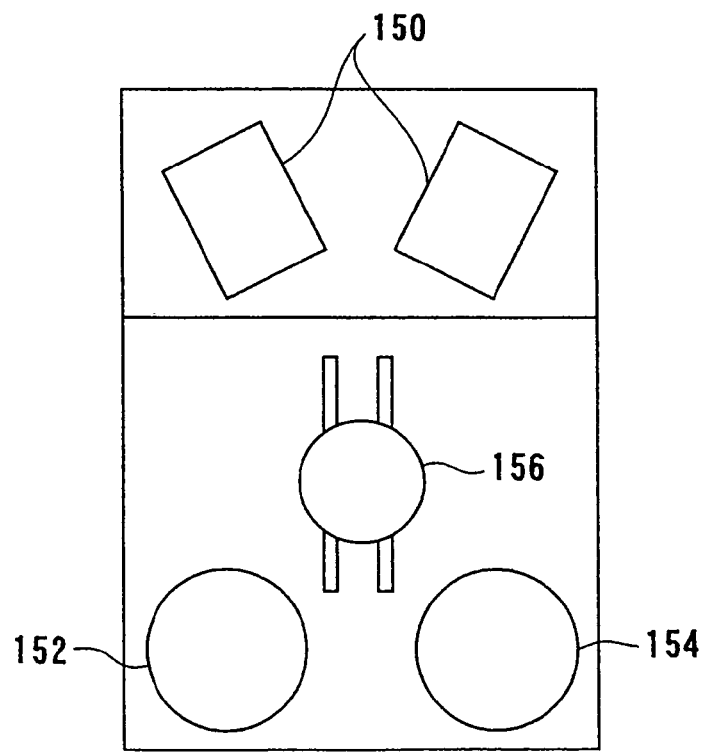
FIG. 35 is an entire layout view of another embodiment of a plating apparatus for performing electroless plating to form an interconnects-protective film according to the present invention.

FIG. 34 shows process steps for forming the interconnects-protective films 130, 142 by electroless plating, and FIG. 35 shows a general construction of a plating apparatus for performing the electroless plating. The plating apparatus includes a loading/unloading section 150, a pre-plating treatment bath 152 for performing a pre-plating treatment, a plating bath 154 for performing a plating treatment and an activating treatment, and a transfer robot 156 for transferring a substrate therebetween. The pre-plating treatment bath 152 also has a cleaning function, and the plating bath 154 also has a cleaning/drying function.

First, substrates, which have undergone embedding of an electric conductor such as copper, heat treatment (annealing) of the electric conductor and a CMP processing, and which are housed in a cassette, are conveyed to the loading/unloading section 150. One substrate is removed by the transfer robot 156 from the cassette, and transferred to the pre-plating treatment bath 152. In the pre-plating treatment bath 152, a pre-plating treatment (surface cleaning) is performed on surfaces of copper interconnects 128, 140, which will underlie a protective film, followed by water-washing. Thereafter, this treated substrate is transferred to the plating bath 154, where an activating treatment with an activating liquid is performed, and subsequently, electroless plating is performed on the surface of the substrate to form interconnects-protective films 130, 142, composed of a Co—W—B alloy and having an amorphous phase, selectively on exposed surfaces of copper interconnects 128, 140, followed by water-washing and drying. This plated substrate is returned to the cassette in the loading/unloading section 150.

According to this embodiment, a Co—W—B alloy is used for the interconnects-protective films 130, 142. The interconnects-protective films 130, 142 composed of a Co—W—B alloy are formed by using a plating solution containing Co ions, a complexing agent, a pH buffer, a pH adjusting agent, an alkylamine borane as a reducing agent and a W-containing compound, and immersing a surface of the substrate in the plating solution.

By making inclusion (content) of B in the plating solution 5-50 at % relative to inclusion (content) of Co, interconnects 130, 142 of a Co—W—B alloy having an amorphous phase can be obtained. This holds also for a Co—B alloy. Inclusion of 5-50 at % P relative to Co can produce an interconnects-protective film of a Co—P or Co—W—P alloy having an amorphous phase. Further, inclusion of 5-50 at % B or P relative to Ni can produce an interconnects-protective film of an Ni—B, Ni—W—B, Ni—P or Ni—W—P alloy having an amorphous phase. Another composition of the plating solution is the same as described above.

Though in this embodiment a Co—W—B alloy is used for the interconnects-protective films 130, 142, it is possible to use instead a Co—B, Co—P, Co—W—P, Ni—B, Ni—W—B, Ni—P or Ni—W—P alloy to form interconnects-protective films composed of such an alloy. Further, instead of copper which is used in this embodiment as an interconnect material, a copper alloy, silver or a silver alloy may be employed.

Figure 36:
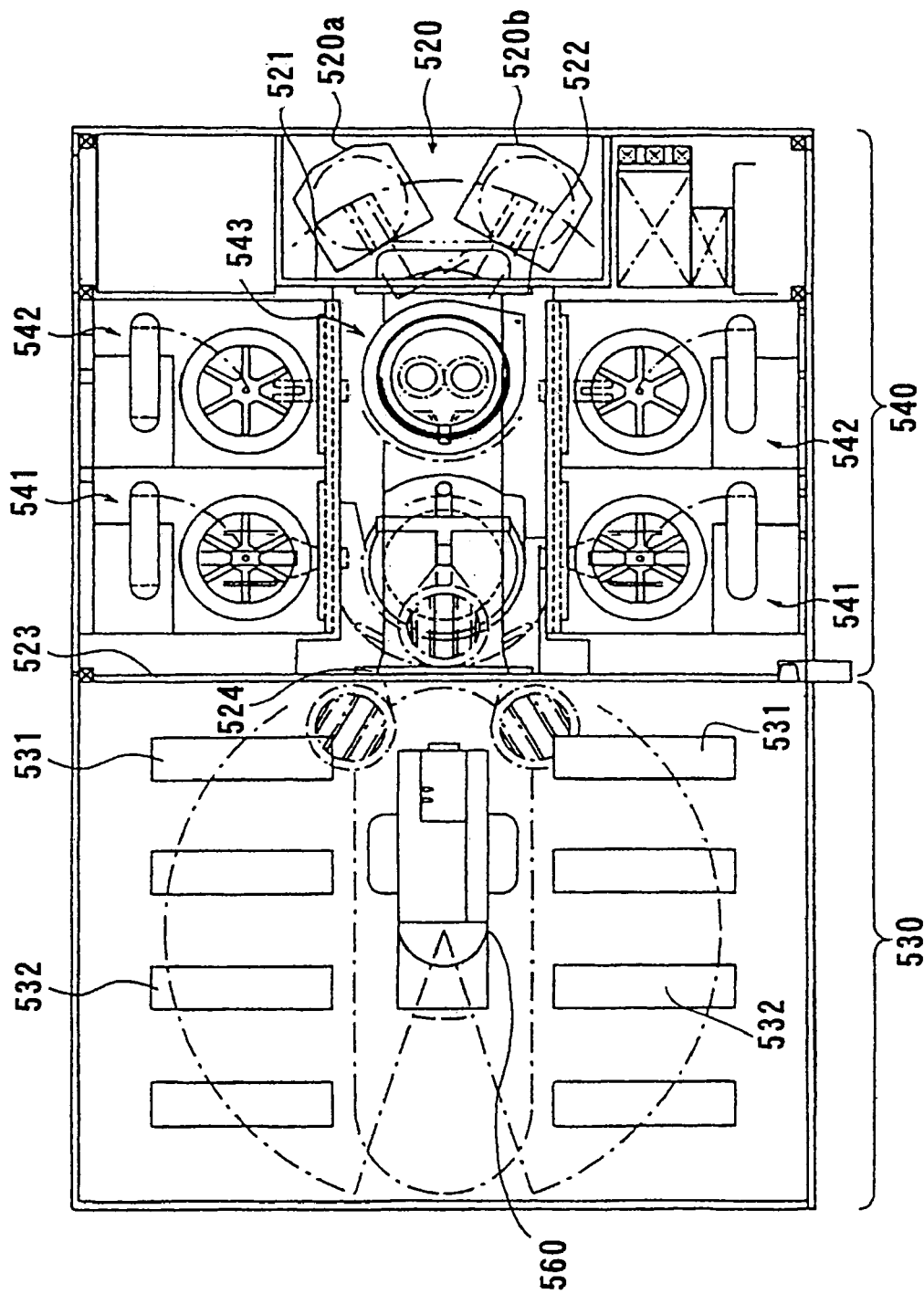
FIG. 36 is a view showing a plan layout constitution of still another embodiment of a plating apparatus for forming an interconnects-protective film according to the present invention.

FIG. 36 shows another example of the plating apparatus. As shown in FIG. 36, the plating apparatus comprises a loading and unloading area 520 for housing wafer cassettes which accommodate semiconductor substrates, a processing area 530 for processing semiconductor substrates, and a cleaning and drying area 540 for cleaning and drying processed semiconductor substrates. The cleaning and drying area 540 is positioned between the loading and unloading area 520 and the processing area 530. A partition 521 is disposed between the loading and unloading area 520 and the cleaning and drying area 540. And a partition 523 is disposed between the cleaning and drying area 540 and the processing area 530.

The partition 521 has a passage (not shown) defined therein for transferring semiconductor wafers therethrough between the loading and unloading area 520 and the cleaning and drying area 540, and supports a shutter 522 for opening and closing the passage. The partition 523 has a passage (not shown) defined therein for transferring semiconductor substrates therethrough between the cleaning and drying area 540 and the processing area 530 and supports a shutter 524 for opening and closing the passage. The cleaning and drying area 540 and the processing area 530 can independently be supplied with and discharge air.

The plating apparatus is placed in a clean room. Pressures in the loading and unloading area 520, the processing area 530, and the cleaning and drying area 540 are selected as follows:

The pressure in the loading and unloading area 520 is greater than the pressure in the cleaning and drying area 540, which is greater than the pressure in the processing area 530.

The pressure in the loading and unloading area 520 is lower than the pressure in the clean room. Therefore, air does not flow from the processing area 530 into the cleaning and drying area 540, and air does not flow from the cleaning and drying area 540 into the loading and unloading area 520. Furthermore, air does not flow from the loading and unloading area 520 into the clean room.

The loading and unloading area 520 houses a loading unit 520*a* and an unloading unit 520*b*, each accommodating a wafer cassette for storing semiconductor substrates. The cleaning and drying area 540 houses two water cleaning units 541 for processing plated semiconductor substrates, two drying units 542, and a transfer unit (transfer robot) 543 for transferring substrates. Each of the water cleaning units 541 may comprise a pencil-shaped cleaner with a sponge layer mounted on a front end thereof or a roller with a sponge layer mounted on an outer circumferential surface thereof. Each of the drying units 542 may comprise a drier for spinning a semiconductor substrate at a high speed to dehydrate and dry the substrate.

The processing area 530 houses a plurality of pre-treatment chambers 531 for pre-treating semiconductor substrates prior to being plated, and a plurality of plating chambers 532 for plating semiconductor substrates with copper. The processing area 530 also has a transfer unit (transfer robot) 560 for transferring semiconductor substrates.

Figure 37:
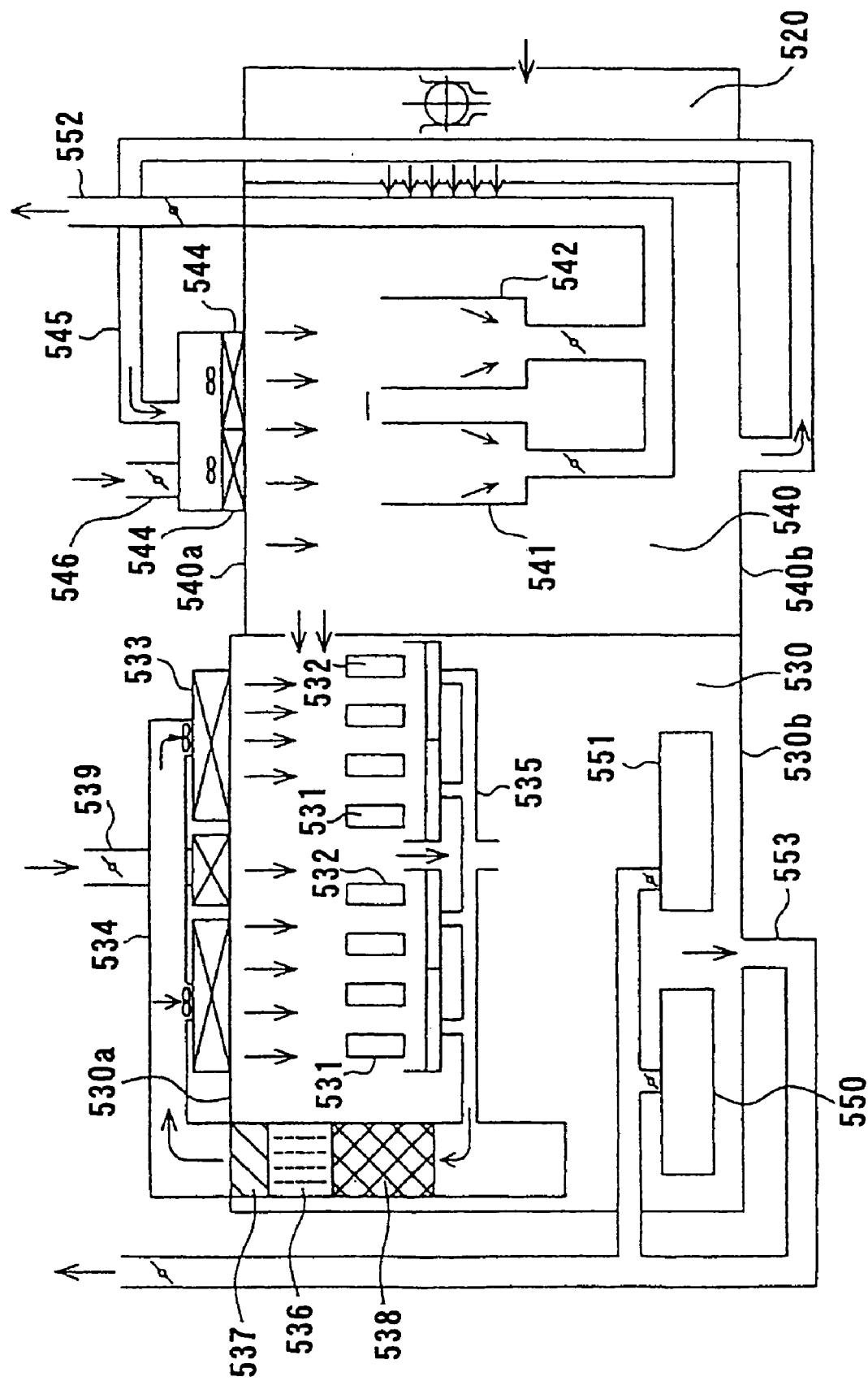
FIG. 37 is a view showing airflow in the plating apparatus shown in FIG. 36.
Figure 38:
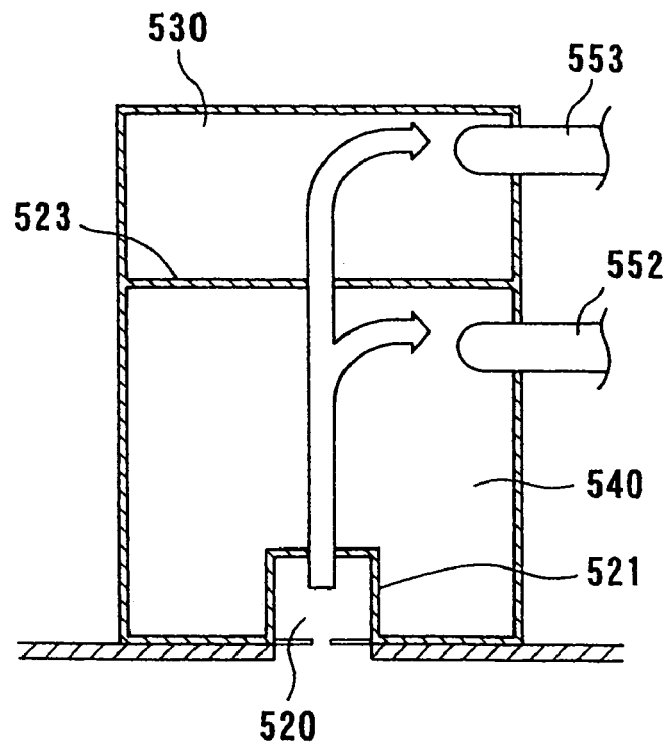
FIG. 38 is a view showing airflows among areas in the plating apparatus shown in FIG. 36.

FIG. 37 shows air flows in the plating apparatus. In the cleaning and drying area 540, fresh air is introduced from an exterior through a duct 546 and forced through high-performance filters 544, by fans, from a ceiling 540*a* into the cleaning and drying area 540 as downward clean air flows around the water cleaning units 541 and the drying units 542. Most of supplied clean air is returned from a floor 540b through a circulation duct 545 to the ceiling 540a, from which clean air is forced again through the filters 544 by the fans into the cleaning and drying area 540. Part of the clean air is discharged from the water cleaning units 541 and the drying units 542 through a duct 552 out of the cleaning and drying area 540.

In the processing area 530, particles are not allowed to be applied to surfaces of semiconductor wafers even though the processing area 530 is a wet zone. To prevent particles from being applied to semiconductor substrates, air is forced through high-performance filters 533, by fans, from a ceiling 530a into the processing area 530 so as to form downward clean air flows.

If an entire amount of clean air, as downward clean air flows, introduced into the processing area 530 were always supplied from an exterior, then a large amount of air would be required to be introduced into and discharged from the processing area 530 at all times. Accordingly, air is discharged from the processing area 530 through a duct 553 at a rate sufficient to keep pressure in the processing area 530 lower than pressure in the cleaning and drying area 540, and most of the downward clean air introduced into the processing area 530 is circulated through circulation ducts 534, 535.

The clean air that has passed through the processing area 530 contains a chemical mist and gases, if circulation air is employed. The chemical mist and gases are removed from circulating air by a scrubber 536 and mist separators 537, 538. The air returned into the circulation duct 534 over the ceiling 530a is free of any chemical mist and gases. This clean air is then forced through the filters 533 by the fans to circulate back into the processing area 530.

Part of the air is discharged from the processing area 530 through the duct 553 connected to a floor 530b of the processing area 530. Air containing a chemical mist and gases is also discharged from the processing area 530, through the duct 553. An amount of fresh air, which corresponds to discharged air, is introduced from the exterior through a duct 539 of the ceiling 530a into the processing area 530 so as to maintain pressure in the processing area 530 lower than pressure in the cleaning and drying area 540.

As described above, pressure in the loading and unloading area 520 is higher than pressure in the cleaning and drying area 540, which is higher than pressure in the processing area 530. When the shutters 522, 524 (see FIG. 36) are opened, therefore, air flows successively through the loading and unloading area 520, the cleaning and drying area 540, and the processing area 530. Air that is discharged flows through the ducts 552, 553 into a common duct 554, as shown in FIG. 39.

Figure 39:
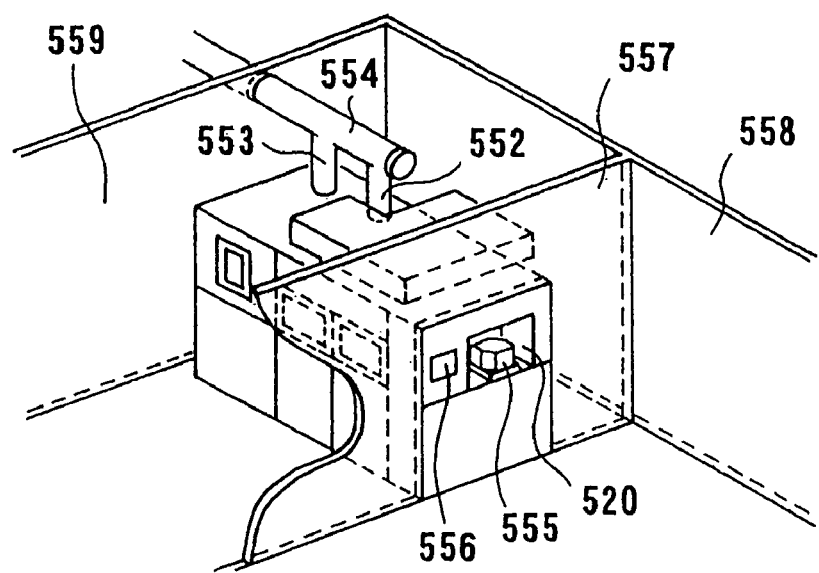
FIG. 39 is a perspective view of the plating apparatus shown in FIG. 36, which is placed in a clean room.

FIG. 39 shows in perspective the plating apparatus, which is placed in the clean room. The loading and unloading area 520 includes a side wall which has a cassette transfer port 555 defined therein and a control panel 556, and which is exposed to a working zone 558 that is compartmented in the clean room by a partition wall 557. Other sidewalls of the substrate plating apparatus are exposed to a utility zone 559 whose air cleanliness is lower than air cleanliness in the working zone 558.

As described above, the cleaning and drying area 540 is disposed between the loading and unloading area 520 and the processing area 530. The partition 521 is disposed between the loading and unloading area 520 and the cleaning and drying area 540. The partition 523 is disposed between the cleaning and drying area 540 and the processing area 530. A dry semiconductor substrate is loaded from the working zone 558 through the cassette transfer port 555 into the plating apparatus, and then plated in the plating apparatus. This plated semiconductor substrate is cleaned and dried, and then unloaded from the plating apparatus through the cassette transfer port 555 into the working zone 558. Consequently, no particles and mist are applied to a surface of the semiconductor substrate, and the working zone 558 which has higher air cleanliness than the utility zone 559 is prevented from being contaminated by particles, chemical mists, and cleaning solution mists.

In the example shown in FIGS. 36 and 37, the plating apparatus has the loading and unloading area 520, the cleaning and drying area 540, and the processing area 530. However, an area accommodating a chemical mechanical polishing unit may be disposed in or adjacent to the processing area 530, and the cleaning and drying area 540 may be disposed in the processing area 530 or between the area accommodating the chemical mechanical polishing unit and the loading and unloading area 520. Any of various other suitable area and unit layouts may be employed so long as a dry state semiconductor substrate can be loaded into the plating apparatus, and a plated semiconductor substrate can be cleaned and dried, and thereafter unloaded from the plating apparatus.

EXAMPLE 2

A sample was prepared by depositing TaN on a silicon substrate, depositing on the TaN 100 nm-thick copper by sputtering and then 700 nm-thick copper by copper electroplating, and annealing (heat-treating) the substrate in an $N_2$ atmosphere at 350° C. for one hour. This annealed sample was then subjected to a pre-plating treatment, water-washing and an activating treatment. Thereafter, electroless plating of a surface of the sample (substrate) was performed by using an electroless plating apparatus and using an electroless plating solution having the composition shown in Table 2 below, thereby depositing a Co—W—B alloy film (interconnects-protective film) with a thickness of about 50 nm onto the surface of the sample (substrate). Thereafter, this plated sample was water-washed and dried. The film (Co—W—B alloy) was found to have the following composition: Co: 85 at %, W: 1.5 at %, B: 13.5 at %

TABLE 2

| | |
|---|---|
| $CoSO_4 \cdot 7H_2O$ (g/L) | 28.1 |
| Ammonium citrate (g/L) | 45.2 |
| $H_2WO_4$ (g/L) | 1.0 |
| DMAB (g/L) | 15.0 |
| 27% TMAH (ml/L) | 145 |
| PH | 8.0 |
| Temp. | 70° C. |

Co: 85 at % W: 1.5 at % B: 13.5 at % 50 nm

COMPARATIVE EXAMPLE 1

Electroless plating of a surface of the same sample as prepared in Example 1 was performed by using an electroless plating solution having the composition shown in Table 3 below, thereby depositing a Co—W—B alloy film with a thickness of about 50 nm onto the sample. Thereafter, the sample was water-washed and dried. The film (Co—W—B alloy) was found to have the following composition: Co 89.5 at %, W 10 at %, B 0.5 at %

TABLE 3

| | |
|---|---|
| $CoSO_4 \cdot 7H_2O$ (g/L) | 28.1 |
| Ammonium citrate (g/L) | 45.2 |
| $H_2WO_4$ (g/L) | 5.0 |
| DMAB (g/L) | 6.0 |
| 27% TMAH (ml/L) | 155 |
| PH | 9.0 |
| Temp. | 70° C. |

Co: 89.5 at % W: 10 at % B: 0.5 at % 50 nm

Figure 40A:
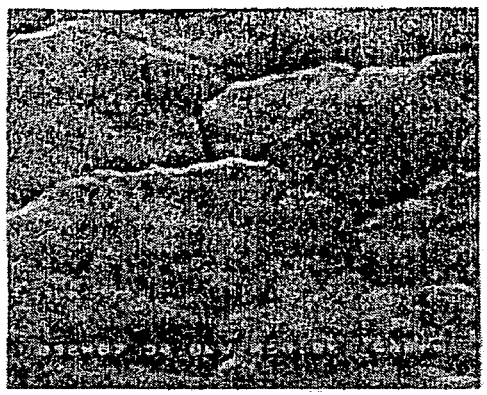
FIGS. 40A and 40B are SEM photographs of a sample, before and after plating, obtained in Example 2.
Figure 40B:
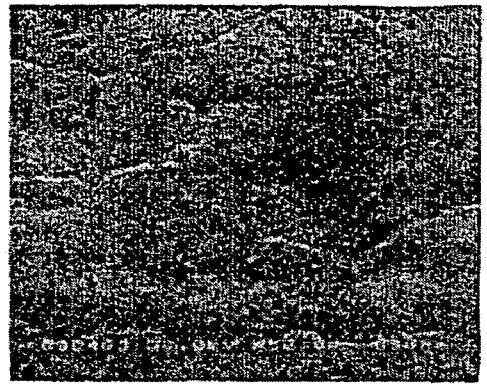
Figure 41:
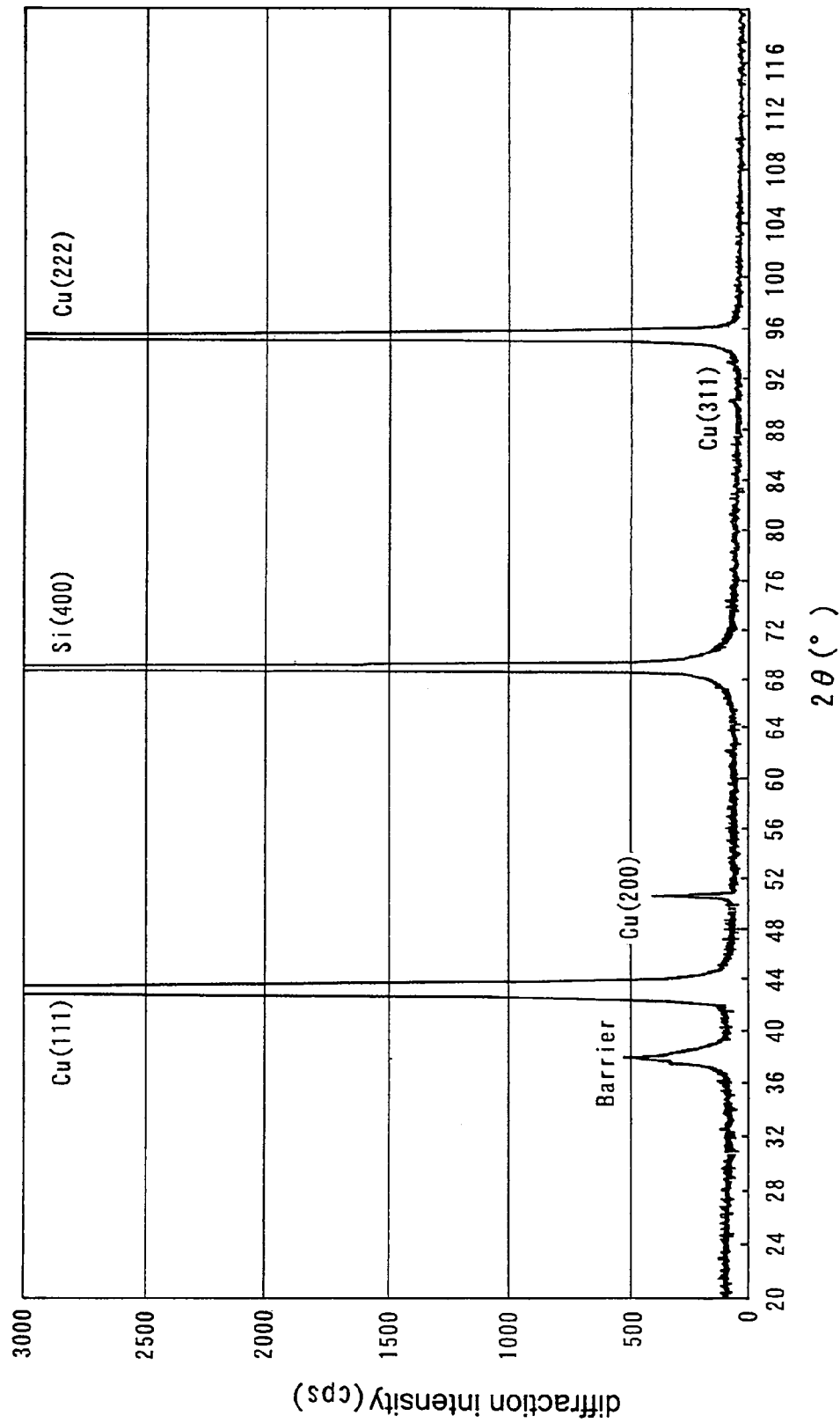
FIG. 41 is X-ray diffractometry data on the sample obtained in Example 2 after having been plated, showing a relationship between diffraction intensity and 2θ.

With respect to the sample of Example 2, FIG. 40A shows an SEM (scanning electron microscope) photograph of the surface of the sample before plating, FIG. 40B shows an SEM photograph of the surface of the sample after plating, and FIG. 41 shows X-ray diffractometry data of the plated sample, showing a relationship between diffraction intensity and 2θ. FIG. 40B demonstrates that a uniform and continuous thin film of Co—W—B alloy was obtained without being influenced by a crystal orientation of underlying copper shown in FIG. 40A. FIG. 41 shows no appreciable peaks for Co (111) and Co (222), indicating that the thin film of Co—W—B alloy has an amorphous phase.

Figure 42A:
FIGS. 42A and 42B are SEM photographs of a sample before and after plating, obtained in Comparative Example 2.
Figure 42B:
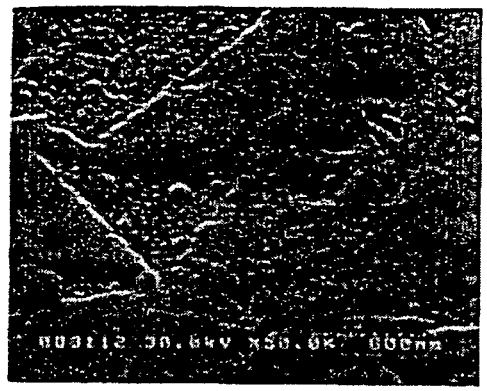
Figure 43:
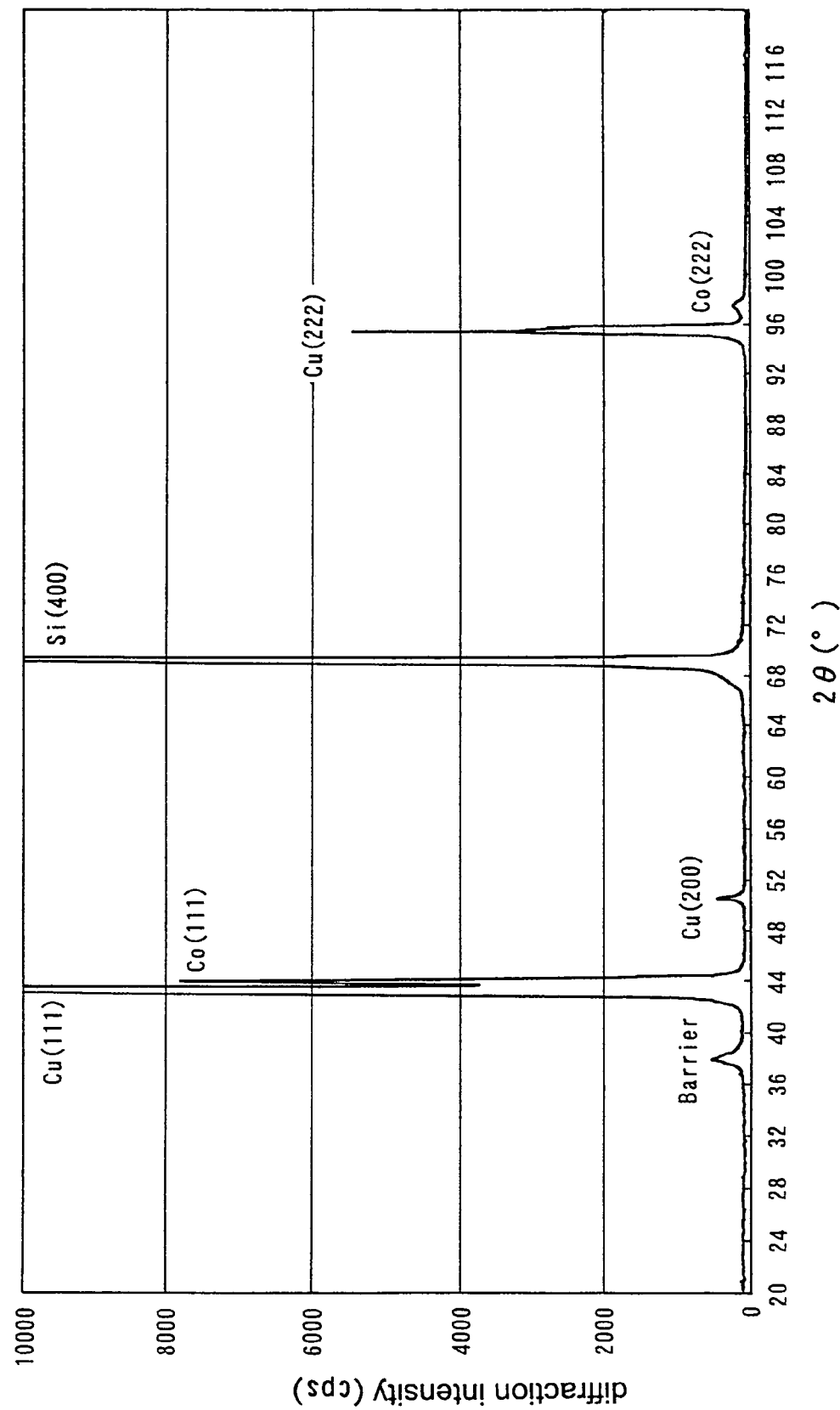
FIG. 43 is X-ray diffractometry data on the sample obtained in Comparative Example 1 after having been plated, showing a relationship between diffraction intensity and 2θ.

With respect to the sample of Comparative Example 1, FIG. 42A shows an SEM (scanning electron micrograph) photograph of the surface of the sample before plating, FIG. 42B shows an SEM photograph of the surface of the sample after plating, and FIG. 43 shows X-ray diffractometry data of the plated sample, showing a relationship between diffraction intensity and 2θ. FIG. 42B demonstrates that a non-uniform and discontinuous thin film of a Co—W—B alloy, conforming to a crystal orientation of underlying copper shown in FIG. 42A, was obtained. FIG. 43 shows clear peaks for Co (111) and Co (222), indicating that the thin film of the Co—W—B alloy has a crystalline phase.

Figure 45A:
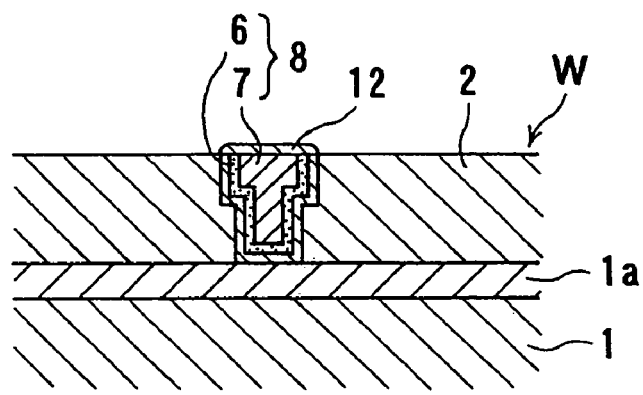
FIGS. 45A through 45C illustrate, in a sequence of process steps, still another embodiment of forming copper interconnects in a semiconductor device, after CMP processing, according to the present invention.
Figure 45B:
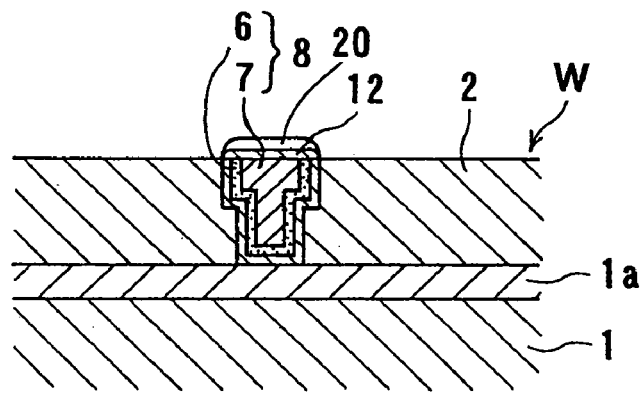
Figure 45C:
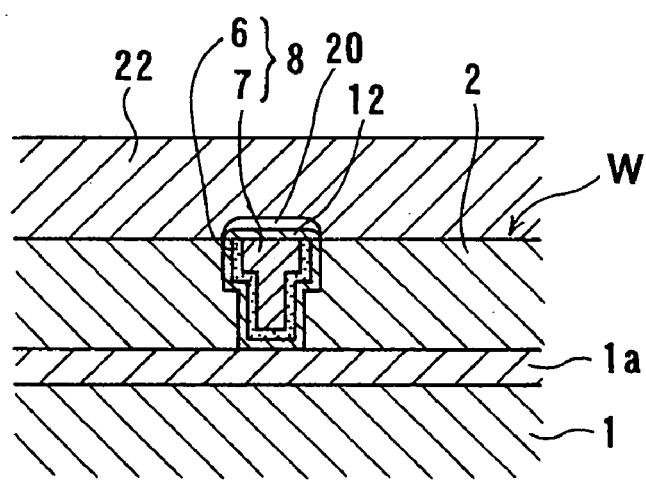

FIGS. 45A through 45C show still another embodiment of a semiconductor device in which exposed surfaces of interconnects (copper interconnects) 8, which have been formed on a substrate W in the above-described manner, is protected with a protective film 20. According to this semiconductor device, the exposed surfaces of interconnects 8 are selectively covered with a protective film 20 having an excellent thermal diffusion preventing effect so as to protect the interconnects 8 from contamination and the like, while preventing thermal diffusion of the interconnects 8. Further, an insulating film 22 of $SiO_2$, SiOF or the like is superimposed on a surface of the substrate W to form a multi-layer interconnect structure. Before formation of protective film 20, a pre-treatment is carried out to form a seed layer 12, which is easy to attach to the interconnects 8 and functions as a catalyst during subsequent electroless plating, selectively on the interconnects 8. The protective film 20 is formed selectively on a surface of the seed layer 12.

Figure 46:
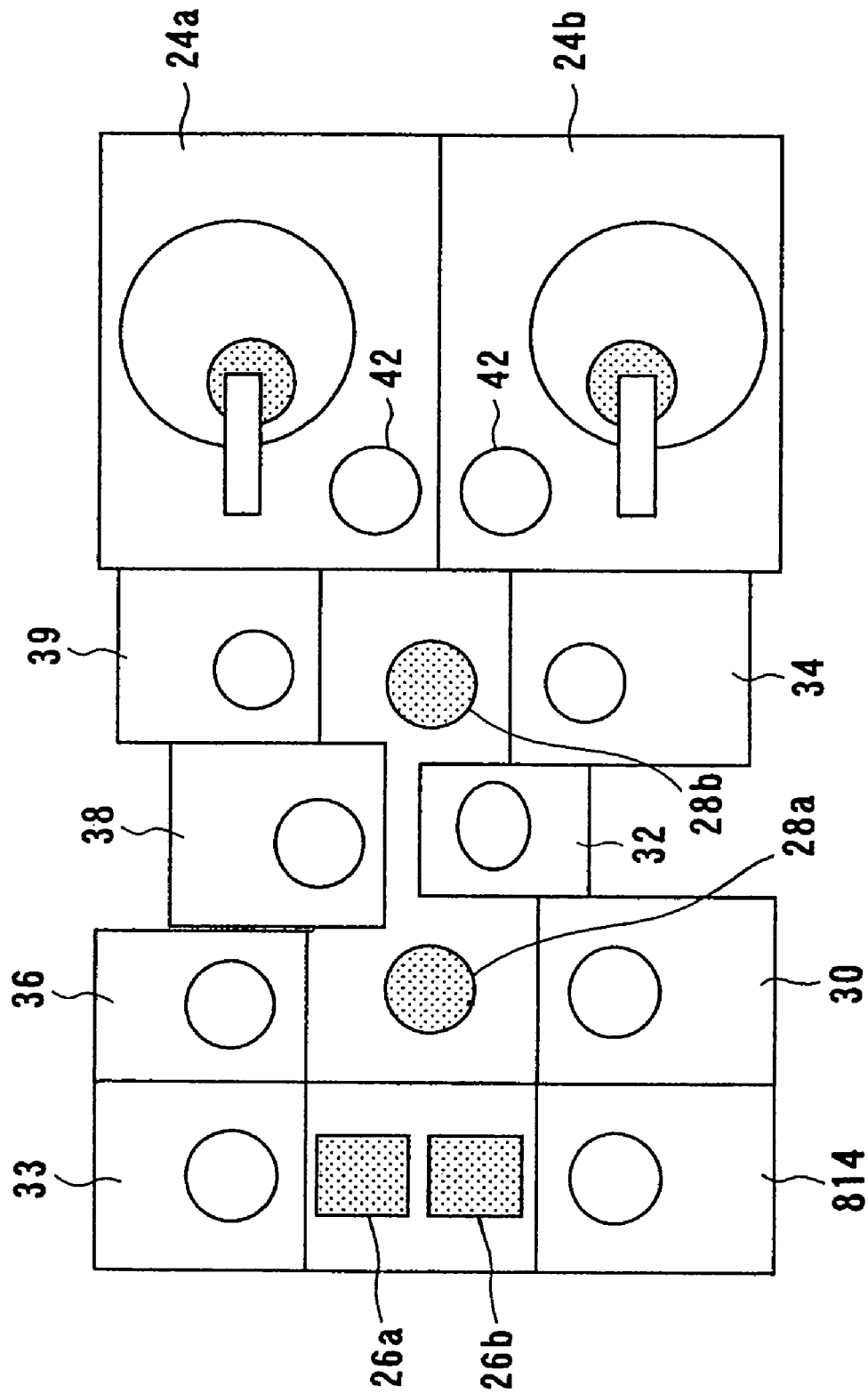
FIG. 46 is a plan layout view of still another embodiment of an apparatus for manufacturing a semiconductor device.
Figure 47:
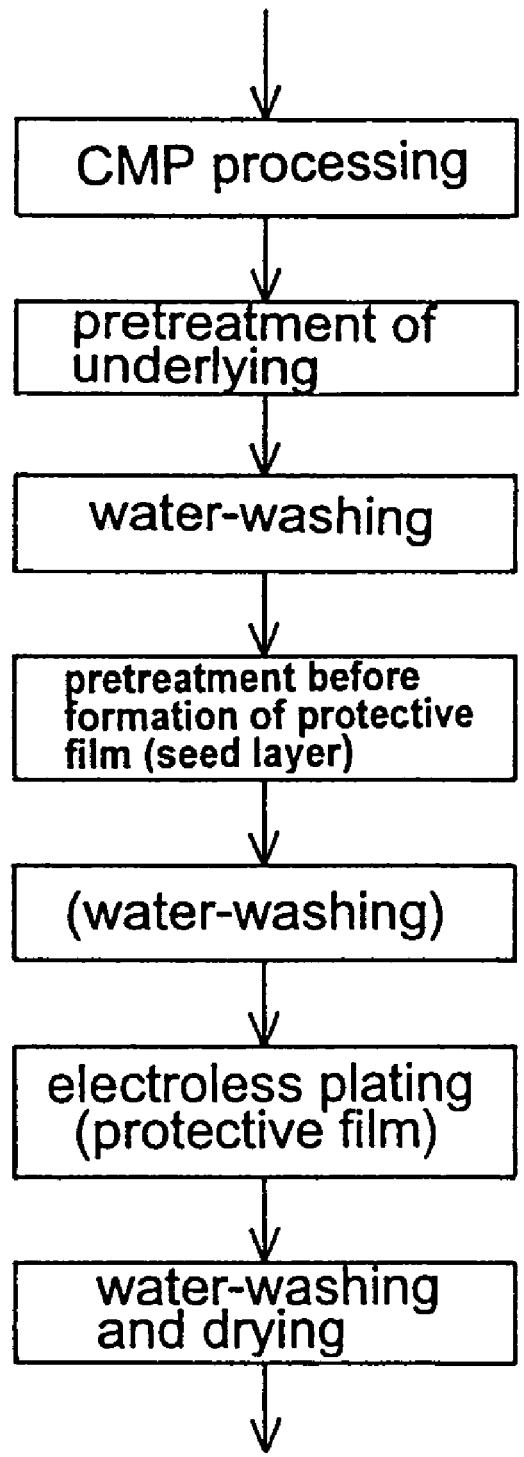
FIG. 47 is a block diagram showing, in a sequence of process steps, still another embodiment of a plating method according to the present invention.

FIG. 46 shows an apparatus for manufacturing the semiconductor device shown in FIGS. 45A-45C, and FIG. 47 shows part of process steps for this manufacturing. The apparatus for manufacturing the semiconductor device of FIG. 46 adds to the apparatus of FIG. 5 a third plating unit 33 which, prior to formation of protective film 20 in second plating unit 38, forms the seed layer 12, which functions as a catalyst during subsequent platings, on the surfaces of interconnects 8. The third plating unit 33 may be comprised of an electroless plating apparatus as shown in FIG. 22 or 23. Other constructions of the apparatus are the same as shown in FIG. 5.

According to this embodiment, after CMP processing of a substrate W, a pre-treatment of surfaces of interconnects 8, which will underlie protective film 20, is performed (pre-treatment of underlying interconnects). After water-washing the substrate W, the substrate is subjected to the pre-treatment before formation of the protective film in the following manner: The substrate W, which has undergone embedding of copper, heat treatment (annealing) and polishing, is transferred to the third plating unit 33, where a first-step electroless plating is performed to form seed layer 12, composed of a Co alloy not containing W, such as an amorphous Co—B alloy, selectively on exposed surfaces of interconnects 8, as shown in FIG. 45A. Next, after water-washing the substrate W according to necessity, the substrate is transferred to the second plating unit 38, where a second-step electroless plating is performed to form a protective film 20, composed of a Co—W—B alloy or a Co—W—P alloy and having an excellent thermal diffusion preventing effect, selectively on a surface of seed layer 12, as shown in FIG. 45B. After water-washing and drying the substrate, insulating film 22 is deposited on the substrate, as shown in FIG. 45C.

By thus selectively covering the exposed surfaces of interconnects 8 and protecting the interconnects 8 with the protective film 20, composed of a W-containing alloy such as a Co—W—B alloy or a Co—W—P alloy and having an excellent thermal diffusion preventing effect, thermal diffusion of the interconnects 8 can be effectively prevented. Furthermore, by previously forming the seed layer 12 of a uniform film quality and a uniform film thickness, and composed of an amorphous Co—B alloy without being influenced by a quality or state of the interconnects 8, and forming the protective film 20 composed of a Co—W—B alloy selectively on the surface of the seed layer 12, it becomes possible to equalize a film thickness of the protective film 20.

According to this embodiment, a Co—W—B alloy may be used for the protective film 20. The protective film 20 of a Co—W—B alloy can be formed by using a plating solution containing cobalt ions, a complexing agent, a pH buffer, a pH adjusting agent, an alkylamine borane as a reducing agent, and a tungsten-containing compound, and immersing a surface of the substrate W in the plating solution.

If desired, the plating solution may further contain at least one of a stabilizer selected from one or more kinds of heavy metal compounds and sulfur compounds, and a surfactant. Further, the plating solution is adjusted to within a pH range of preferably 5-14, more preferably 6-10, by using a pH adjusting agent such as ammonia water or ammonium hydroxide. A temperature of the plating solution is generally in the range of 30-90° C., preferably 40-80° C.

The cobalt ions in the plating solution may be supplied from a cobalt salt, for example, cobalt sulfate, cobalt chloride or cobalt acetate. An amount of the cobalt ions is generally in the range of 0.001-1 mol/L, preferably 0.01-0.3 mol/L.

Specific examples of the complexing agent may include carboxylic acids, such as acetic acid, or their salts; oxycarboxylic acids, such as tartaric acid and citric acid, and their salts; and aminocarboxylic acids, such as glycine, and their salts. These compounds may be used either singly or as a mixture of two or more. A total amount of the complexing agent is generally 0.001-1.5 mol/L, preferably 0.01-1.0 mol/L.

Specific examples of the pH buffer may include ammonium sulfate, ammonium chloride and boric acid. The pH buffer is used generally in an amount of 0.01-1.5 mol/L, preferably 0.1-1 mol/L.

Examples of the pH adjusting agent may include ammonia water and tetramethylammonium hydroxide (TMAH). By using the pH adjusting agent, pH of the plating solution is adjusted generally to 5-14, preferably 6-10.

The alkylamine borane as a reducing agent may specifically be dimethylamine borane (DMAB) or diethylamine borane. The reducing agent is used generally in an amount of 0.01-1 mol/L, preferably 0.01-0.5 mol/L.

Examples of the tungsten-containing compound may include tungstic acid or its salts, and heteropoly acids, such as tangstophosphoric acids (e.g. $H_3(PW_{12}P_{40}) \cdot nH_2O$), and their salts. The tungsten-containing compound is used generally in an amount of 0.001-1 mol/L, preferably 0.01-0.1 mol/L.

Besides the above-described components, other known additives may be added to the plating solution. Examples of usable additives include a bath stabilizer, which may be a heavy metal compound such as a lead compound, a sulfur compound such as a thiocyanate, or a mixture thereof, and a surfactant of an anionic, cationic or nonionic type.

According to this embodiment, an amorphous Co—B alloy may be used for the seed layer 12. The seed layer 12 of an amorphous Co—B alloy can be formed by using the same plating solution as the above-described plating solution for the Co—W—B alloy except for not containing the tungsten-containing compound, and immersing a surface of the substrate W in the plating solution. By performing the first-step and second-step electroless platings, successively, it becomes possible to form a uniform protective film 20.

EXAMPLE 3

A sample was prepared by depositing 40 nm-thick TaN on a silicon substrate, depositing on the TaN 150 nm-thick copper by sputtering and 500 nm-thick copper by copper electroplating, heat-treating the substrate, and carrying out a CMP processing of a surface of the substrate. Using the electroless plating apparatus shown in FIG. 22, after carrying out a pre-treatment and water-washing of a surface of the sample, electroless plating was performed for about 5 seconds by using an electroless plating solution having the composition shown in Table 4 below, thereby depositing an amorphous Co—B alloy (seed layer) with a thickness of about 10 nm onto the surface of the sample (substrate).

TABLE 4

| | |
|---|---|
| CoSO$_4$·7H$_2$O (g/L) | 28.1 |
| Ammonium hydrogen citrate (g/L) | 45.2 |
| (NH$_4$)$_2$SO$_4$ (g/L) | 39.6 |
| 27% TMAH (g/L) | 6.0 |
| 27% TMAH (ml/L) | 142 |
| PH | 9.0 |
| Temp. (° C.) | 70 |

Co: 92.0 at % B: 8.0 at %

Next, after water-washing the surface of the sample according to necessity, electroless plating was performed successively for about one minute by using an electroless plating solution having the composition shown in Table 5 below, thereby depositing a Co—W—B alloy (protective film) with a thickness of about 40 nm onto the sample. Thereafter, the sample was water-washed and dried.

TABLE 5

| | |
|---|---|
| CoSO$_4$·7H$_2$O (g/L) | 28.1 |
| Ammonium hydrogen citrate (g/L) | 45.2 |

TABLE 5-continued

| | |
|---|---|
| (NH$_4$)$_2$SO$_4$ (g/L) | 39.6 |
| H$_2$WO$_4$ (g/L) | 5.0 |
| DMAB (g/L) | 6.0 |
| 27% TMAH (ml/L) | 159 |
| PH | 9.0 |
| Temp. (° C.) | 70 |

Co: 89.0 at % W: 10.0 at % B: 1.0 at %

COMPARATIVE EXAMPLES 2 AND 3

Electroless plating of a surface of the same sample as prepared in Example 1 was performed for about one minute by using the electroless plating solution of Table 5, thereby depositing a Co—W—B alloy with a thickness of about 40 nm onto the sample (Comparative Example 2). Separately, electroless plating of a surface of the same sample as prepared in Example 1 was performed for about 15 seconds by using the electroless plating solution of Table 4, thereby depositing a Co—B alloy with a thickness of about 40 nm onto the sample (Comparative Example 3).

Figure 48:
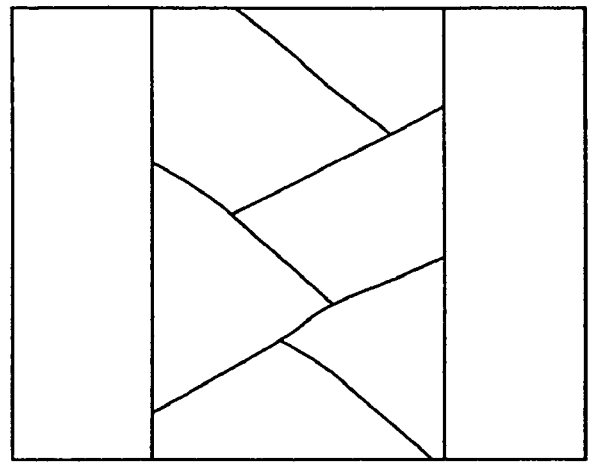
FIG. 48 is a diagram illustrating an SEM photograph of a sample used in Example 3, Comparative Example 2 and Comparative Example 3.
Figure 49:
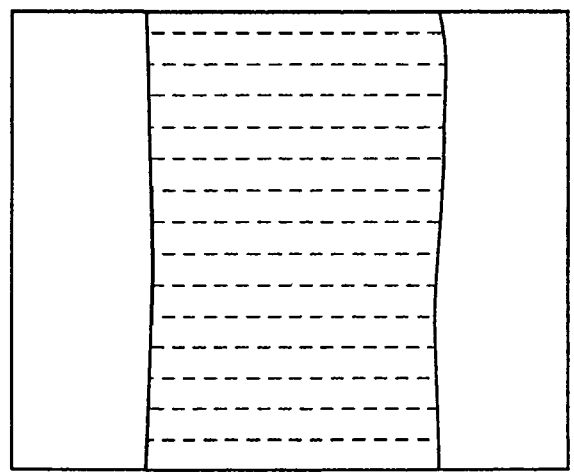
FIG. 49 is a diagram illustrating an SEM photograph of the sample obtained in Example 3
Figure 52:
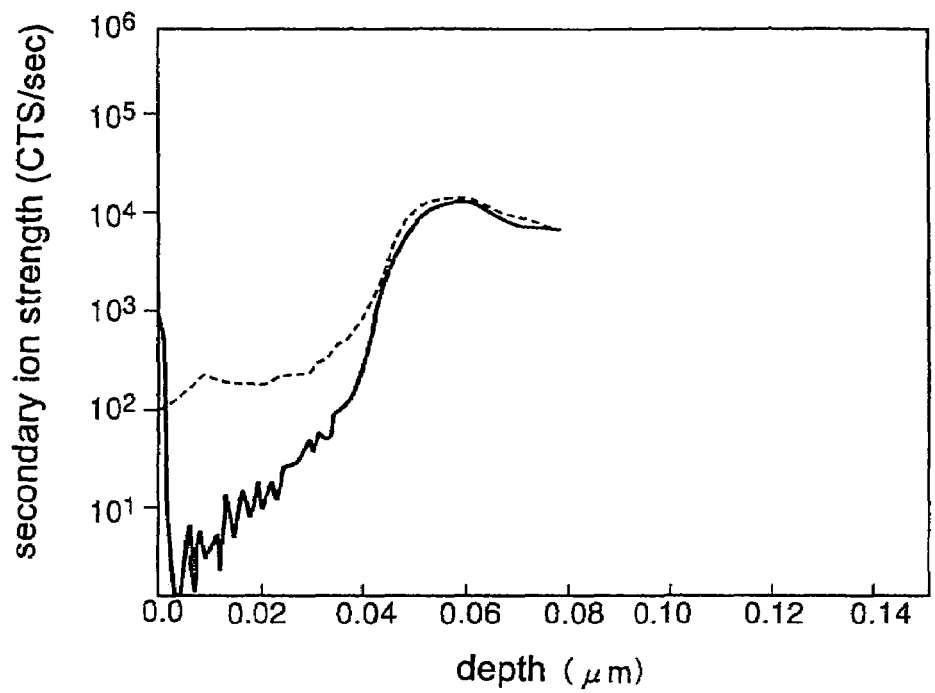
FIG. 52 is a diagram illustrating secondary ion mass spectrometry data on the sample, which is analyzed before and after annealing, of Example 3 after having been plated.
Figure 53:
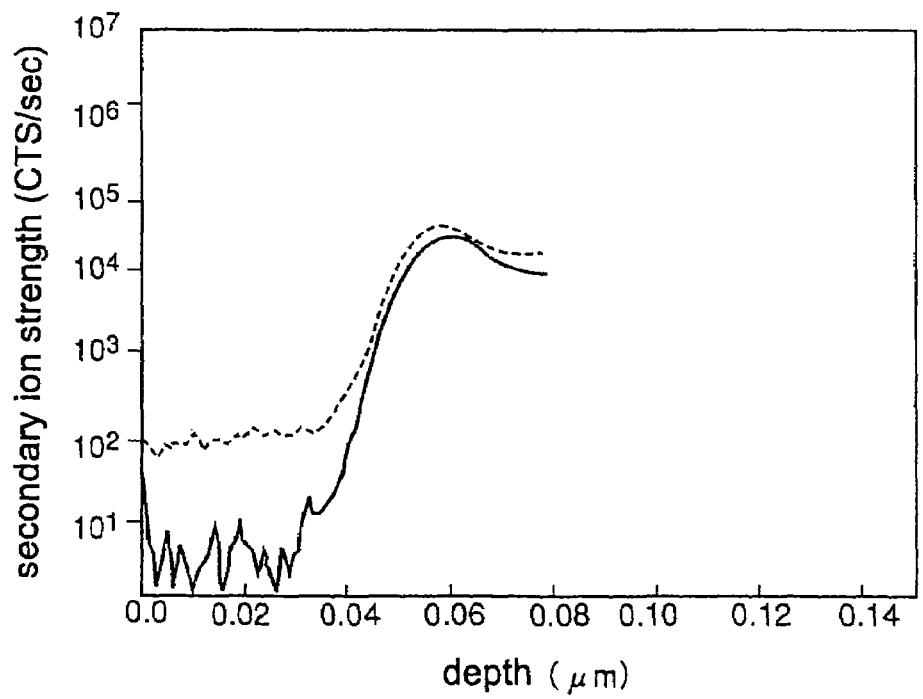
FIG. 53 is a diagram illustrating secondary ion mass spectrometry data on the sample, which is analyzed before and after annealing, of Comparative Example 2 after having been plated.
Figure 54:
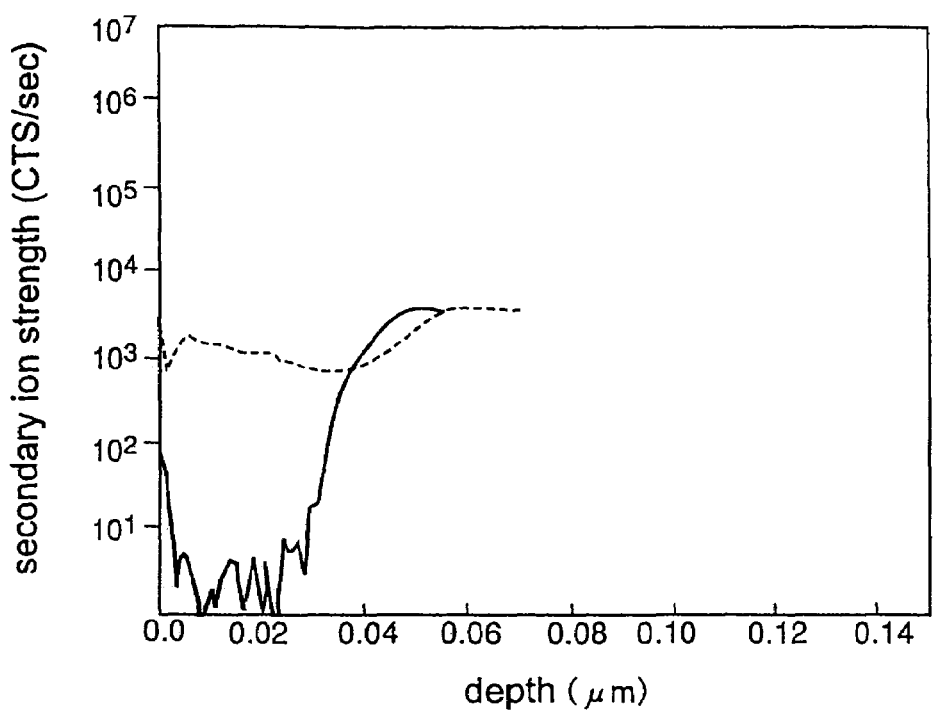
FIG. 54 is a diagram illustrating secondary ion mass spectrometry data on the sample, which is analyzed before and after annealing, of Comparative Example 3 after having been plated.
Figure 55:
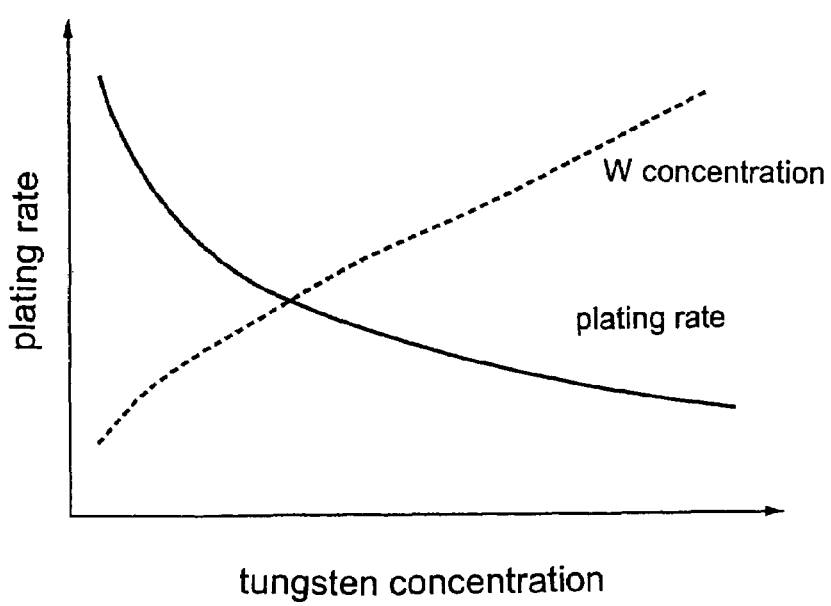
FIG. 55 is a graph showing a relationship between a plating rate and W (tungsten) concentration when plating is performed using a Co alloy plating solution containing tungsten (W)

FIG. 48 shows a diagram illustrating an SEM (scanning electron microscope) photograph of a surface of the sample (substrate) after CMP processing but before plating, and FIGS. 49, 50 and 51 show diagrams illustrating SEM photographs of surfaces of the samples after plating obtained in Example 3, Comparative Example 2 and Comparative. Example 3, respectively. FIGS. 52, 53 and 54 show secondary ion mass spectrometry (SIMS) data of the plated samples of Example 3, Comparative Example 2 and Comparative Example 3, respectively. The SIMS analysis was performed before and after annealing the plated samples for two hours at 450° C. and at a pressure of 3.6×10$^4$ Pa. In FIGS. 52 through 54, solid lines denote data for the samples before annealing, and broken lines denote data for the samples after annealing.

The above data clearly demonstrates that the plated alloy film of the sample of Comparative Example 2 has an excellent thermal diffusion preventing effect, as shown in FIG. 53. However, due to a variation in crystal orientation of underlying copper shown in FIG. 48, a film thickness of the plated alloy film varies significantly, as shown in FIG. 50. In the case of Comparative Example 3, the plated alloy film has a uniform film thickness, as shown in FIG. 51, despite variation in crystal orientation of underlying copper shown in FIG. 48. As shown in FIG. 54, however, the plated alloy film has a poor thermal diffusion preventing effect. In contrast to these comparative films, the plated film of Example 3 has a uniform film thickness, as shown in FIG. 49, despite variation in crystal orientation of underlying copper, and has an excellent thermal diffusion preventing effect, as shown in FIG. 52.

Figure 56A:
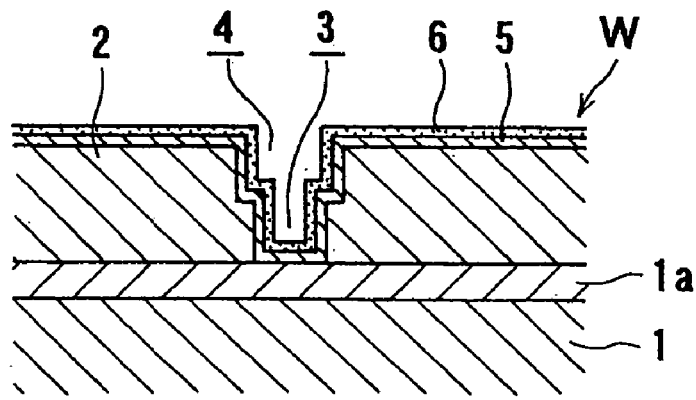
FIGS. 56A through 56C illustrate, in a sequence of process steps, still another embodiment of forming copper alloy interconnects in a semiconductor device according to the present invention.
Figure 56B:
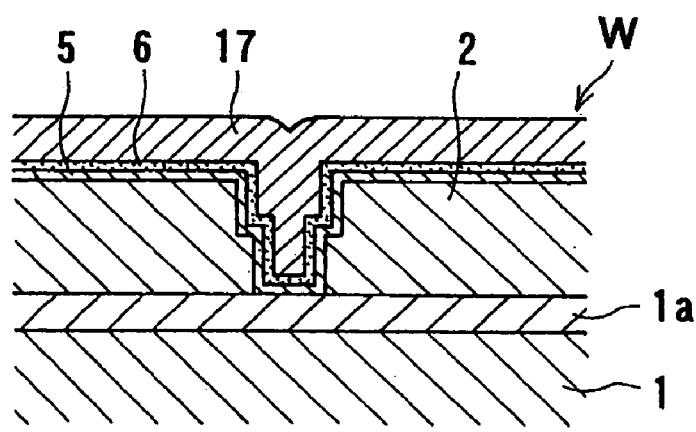
Figure 56C:
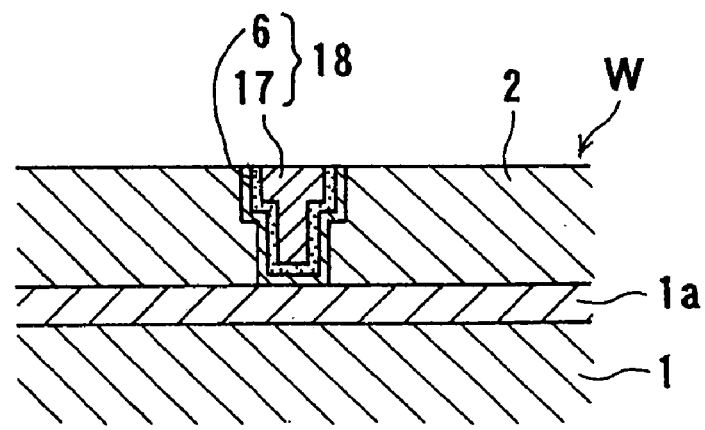

FIGS. 56A through 56C illustrate, in a sequence of process steps, an example of forming copper alloy interconnects in a semiconductor device using a plating solution according to the present invention. As shown in FIG. 56A, an insulating film 2 of SiO$_2$ is deposited on a conductive layer 1a in which semiconductor devices are provided, which is formed on a semiconductor base 1. Contact holes 3 and trenches 4 are formed in the insulating film 2 by performing a lithography/etching technique. Thereafter, a barrier layer 5 of TaN or the like is formed on an entire surface of the insulating film 2, and a seed layer 6 is formed on the barrier layer 5 by sputtering or the like.

Then, as shown in FIG. 56B, electroless copper alloy plating is performed on a surface of barrier layer 5 to fill the contact holes 3 and the trenches 4 with copper alloy and, at the same time, deposit a copper alloy film 17 onto the insulating film 2. Thereafter, the copper alloy film 17 and the barrier layer 5 on the insulating layer 2 are removed by chemical mechanical polishing (CMP) so as to make a surface of the copper filled in the contact holes 3 and the trenches 4 and a surface of the insulating film 2 lie substantially in the same plane. Interconnects 18 composed of the seed layer 6 and the copper alloy film 17, as shown in FIG. 56C, are thus formed in the insulating layer 2.

The copper alloy film 17 is composed of a copper alloy including copper and a metal that does not form a solid solution with the copper, a copper-silver alloy according to this example. Copper content of the copper alloy is 98 at %. The interconnects 18 composed of such a copper alloy film 17, as compared to interconnects composed solely of copper, have enhanced electromigration resistance and stress migration resistance, while electric resistivity is not increased. In this regard, in a case of a copper-silver alloy, copper and silver do not form a single or mutual crystal lattice, i.e. do not form a mixed crystal, but a crystal of copper and a crystal of silver are co-present. Co-presence of the copper and silver crystals can enhance electromigration resistance and stress migration resistance as compared to sole presence of a copper crystal, while an increase of electric resistivity can be prevented by presence of a copper crystal in a major proportion.

Though in this example a copper-silver alloy is used as the copper alloy of copper and a metal that does not form a solid solution with the copper, it is possible to use a copper-cobalt alloy or a copper-tin alloy instead of a copper-silver alloy. Copper content of each of these copper alloys is preferably 90 to 99.99 at %.

The copper alloy film 17, composed of a copper-silver alloy, can be formed by using an electroless copper alloy plating solution, comprising copper ions, silver ions to obtain a copper alloy in which silver does not form a solid solution with copper, a complexing agent and an alkali metal-free reducing agent, and immersing a surface of substrate W in the plating solution.

A copper salt, such as copper sulfate or copper chloride, may be used as a supply source of copper ions in the plating solution. An amount of copper ions in the plating solution is generally 0.001 to 1 mol/L, preferably 0.001 to 0.1 mol/L. A silver salt, such as silver nitrate or silver sulfate, may be used as a supply source of silver ions. An amount of silver ions in the plating solution is generally 0.001 to 1 mol/L, preferably 0.001 to 0.1 mol/L.

Specific examples of the complexing agent may include organic acids, such as acetic acid and tartaric acid, and their salts; aminocarboxylic acids, such as EDTA, and their salts; amines, such as ethylendiamine and quardrol-bath, and their salts; polyhydric alcohols such as glycerol and mannitol; and sulfur compounds, such as thiosulfuric acid and thiourea. These compounds may be used either singly or as a mixture of two or more. A total amount of the complexing agent is generally 0.001-2 mol/L, preferably 0.01-1 mol/L.

Regarding the pH adjusting agent, any agent may be used that does not contain sodium or any other alkali metal. Ammonia water and tetramethylammonium hydroxide (TMAH) may be mentioned as specific examples. By using the pH adjusting agent, pH of the plating solution is adjusted generally within the range of 5-14, preferably 7-13.

The reducing agent likewise should not contain sodium or any other alkali metal. An alkylamine borane is preferably used. As alkylamine boranes, dimethylamine borane (DMAB) and diethylamine borane, may be mentioned. The reducing agent is used generally in an amount of 0.001-1 mol/L, preferably 0.01-0.5 mol/L.

Besides above described compounds, other known additives may be added to the plating solution. Examples of usable additives include a bath stabilizer, which may be a heavy metal compound such as a lead compound, a sulfur compound such as a thiocyanate, or a mixture thereof, and a surfactant of an anionic, cationic or nonionic type. Either one or both of the bath stabilizer and the surfactant may be used. A temperature of the plating solution is generally in the range of 20-90° C., preferably 20-70° C.

As described above, though in this example a copper-silver alloy is used as the copper alloy for forming the copper alloy film 17, it is possible to use a copper-cobalt alloy or a copper-tin alloy instead of a copper-silver alloy. Cobalt ions contained in a plating solution for forming a copper-cobalt alloy film may be supplied from a cobalt salt, for example, cobalt sulfate, cobalt chloride or cobalt acetate. An amount of the cobalt ions is generally in the range of 0.001-1 mol/L, preferably 0.005-0.5 mol/L.

Figure 57A:
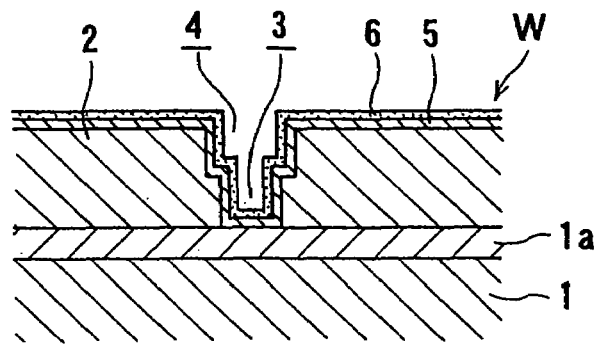
FIGS. 57A through 57D are diagrams illustrating, in sequence of process steps, an embodiment of formation of a protective film, composed of a copper alloy, selectively on exposed surfaces of embedded interconnects in a semiconductor device according to the present invention.

FIGS. 57A through 57D are diagrams illustrating, in sequence of process steps, an example of formation of a protective film, composed of a copper alloy, selectively on exposed surfaces of embedded interconnects in a semiconductor device according to the present invention. As shown in FIG. 57A, an insulating film 2 of $SiO_2$ is deposited onto a conductive layer 1a in which semiconductor devices are provided, which is formed on a semiconductor base 1. Contact holes 3 and trenches 4 are formed in the insulating film 2 by performing a lithography/etching technique. Thereafter, a barrier layer 5 of TaN or the like is formed on an entire surface of the insulating film 2, and a seed layer 6 is formed on the barrier layer 5 by sputtering or the like.

Figure 57B:
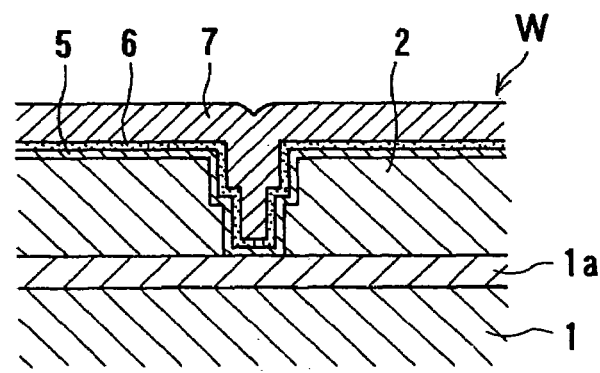
Figure 57C:
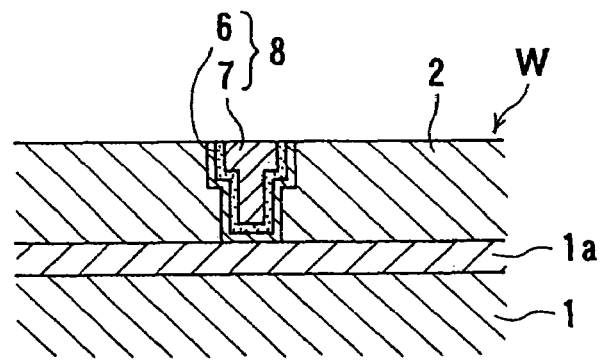

Thereafter, as shown in FIG. 57B, copper plating is performed on a surface of the seed layer 6 to fill the contact holes 3 and the trenches 4 with copper and, at the same time, deposit a copper film 7 onto the insulating film 2. Thereafter, the copper film 7 and the barrier layer 5 on the insulating film 2 are removed by chemical mechanical polishing (CMP) so as to make the surface of the copper filled in the contact holes 3 and the trenches 4 and a surface of the insulating film 2 lie substantially in the same plane. Interconnects (copper interconnects) 8 composed of the seed layer 6 and the copper film 7, as shown in FIG. 57C, are thus formed in the insulating layer 2.

Figure 57D:
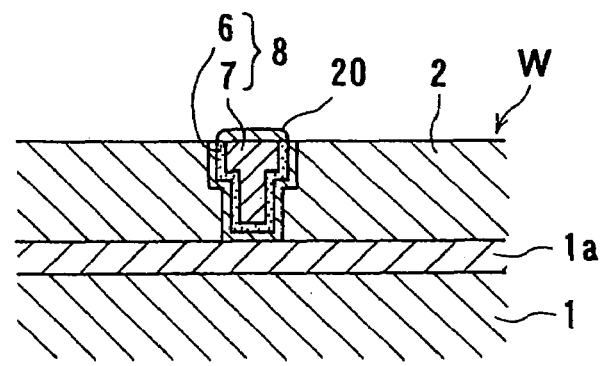

Next, electroless copper alloy plating is performed on a surface of substrate W to form a protective film (plated film) 20 composed of a copper alloy selectively on exposed surfaces of interconnects 8 to protect the interconnects 8, as shown in FIG. 57D. A thickness of the protective film 20 is generally 0.1 to 500 nm, preferably 1 to 200 nm, more preferably 10 to 100 nm. Though copper is used as an interconnect material in this example, a copper alloy, silver or a silver alloy may be used instead of copper.

The protective film 20 is composed of a copper alloy including copper and a metal that does not form a solid solution with the copper, a copper-silver alloy according to this example. Copper content of the copper alloy is 98 at %. The semiconductor device is thus provided with the protective film 20 composed of the specific copper alloy, having a strong adhesion to copper or silver and having a low resistivity ($\rho$), and formed selectively on the exposed surfaces of interconnects 8. The interconnects 8 of the semiconductor device can be selectively covered and protected with the protective film 20 without an increase of interconnect resistivity.

According to this example, the same plating solution and the same electroless plating apparatus as in the above-described example are used for formation of the copper alloy including copper and a metal that does not form a solid solution with the copper, e.g. a copper-silver alloy, and hence a description thereof is omitted.

Though the above-described examples relate to applications pertaining to electroless plating, the present invention is of course applicable to electroplating in which plating is effected by passing an electric current between an anode and a cathode, both immersed in a plating solution.

What is claimed is:

1. A method for manufacturing a semiconductor device, comprising:
   providing an insulating film having recesses therein which are partially filled by a seed layer that covers a surface of said insulating film;
   plating an electrically conductive material onto said seed layer so as to embed said electrically conductive material in said recesses;
   removing said electrically conductive material and said seed layer from said surface of said insulating film, whereby interconnects of said electrically conductive material are formed in said insulating film;
   cleaning said surface of said substrate with a cleaning liquid to reduce an electrical conductor contamination on said insulating film;
   performing a pre-plating treatment;
   electroless plating a material onto exposed surfaces of said interconnects, thereby selectively forming a protective film on said exposed surfaces; and
   flattening a surface of said protective film to eliminate unevenness of a thickness of said protective film and to remove an overhanging portion of said protective film.

2. The method according to claim 1, wherein
   cleaning said surface of said insulating film comprises cleaning said surface of said insulating film such that an electrical conductor contamination on said insulating film is reduced to at most $5 \times 10^5$ atoms/cm$^2$.

3. The method according to claim 1, wherein
   flattening said surface of said protective film comprises flattening said surface until said surface is at the same level as that of a surface of said insulating film.

4. The method according to claim 1, further comprising:
   cleaning a surface of said substrate after flattening said surface of said protective film.

5. A method for manufacturing a semiconductor device, comprising;
   providing an insulating film having recesses therein which are partially filled with a first seed layer that covers a surface of said insulating film;
   plating an electrically conductive material onto said first seed layer so as to embed said electrically conductive material in said recesses;
   removing said electrically conductive material and said first seed layer from said surface of said insulating film, whereby interconnects of said electrically conductive material are formed in said insulating film;
   electroless plating a Co—B alloy onto exposed surfaces of said interconnects, thereby selectively forming on said exposed surfaces a second seed layer of a Co—B alloy; and
   directly electroless plating a material onto a surface of said second seed layer, thereby forming a protective film on said surface of said second seed layer,
   with said Co—B alloy acting as a catalyst during the electroplating of said material onto said surface of said second seed layer.

6. The method according to claim 5, wherein
   directly electroless plating a material onto said surface of said second seed layer comprises directly electroless plating one of a Co—W—B alloy and a Co—W—P alloy onto said surface.

7. A method for manufacturing a semiconductor device, comprising:
   providing an insulating film having recesses therein which are partially filled with a first seed layer that covers a surface of said insulating film;
   plating an electrically conductive material onto said first seed layer so as to embed said electrically conductive material in said recesses;
   removing said electrically conductive material and said first seed layer from said surface of said insulating film, whereby interconnects of said electrically conductive material are formed in said insulating film;
   electroless plating onto exposed surfaces of said interconnects, thereby selectively forming on said exposed surfaces a second seed layer of a film having an amorphous phase; and
   directly electroless plating a material onto a surface of said second seed layer, thereby forming a protective film on said surface of said second seed layer,
   with said film having said amorphous phase acting as a catalyst during the electroplating of said material onto said surface of said second seed layer.

8. The method according to claim 7, wherein
   directly electroless plating a material onto said surface of said second seed layer comprises directly electroless plating one of a Co—W—B alloy and a Co—W—P alloy onto said surface.

9. A method for manufacturing a semiconductor device, comprising:
   providing an insulating film having recesses therein which are partially filled with a first seed layer that covers a surface of said insulating film;
   plating an electrically conductive material onto said first seed layer so as to embed said electrically conductive material in said recesses;
   removing said electrically conductive material and said first seed layer from said surface of said insulating film, whereby interconnects of said electrically conductive material are formed in said insulating film;
   electroless plating onto exposed surfaces of said interconnects, thereby selectively forming on said exposed surfaces a second seed layer of a non-magnetic film; and
   directly electroless plating a material onto a surface of said second seed layer, thereby forming a protective film on said surface of said second seed layer,
   with said non-magnetic film acting as a catalyst during the electroplating of said material onto said surface of said second seed layer.

10. The method according to claim 9, wherein
    directly electroless plating a material onto said surface of said second seed layer comprises directly electroless plating one of a Co—W—B alloy and a Co—W—P alloy onto said surface.

* * * * *

UNITED STATES PATENT AND TRADEMARK OFFICE
CERTIFICATE OF CORRECTION

| | | |
|---|---|---|
| PATENT NO. | : 7,279,408 B2 | Page 1 of 1 |
| APPLICATION NO. | : 11/254790 | |
| DATED | : October 9, 2007 | |
| INVENTOR(S) | : Hiroaki Inoue et al. | |

It is certified that error appears in the above-identified patent and that said Letters Patent is hereby corrected as shown below:

ON THE TITLE PAGE (*) Notice, please insert the following: --This patent is subject to a terminal disclaimer.--

Signed and Sealed this

Tenth Day of June, 2008

JON W. DUDAS
*Director of the United States Patent and Trademark Office*